US008053161B2

(12) United States Patent
Wada et al.

(10) Patent No.: US 8,053,161 B2
(45) Date of Patent: Nov. 8, 2011

(54) RESIST COMPOSITION, RESIN FOR USE IN THE RESIST COMPOSITION, COMPOUND FOR USE IN THE SYNTHESIS OF THE RESIN, AND PATTERN-FORMING METHOD USING THE RESIST COMPOSITION

(75) Inventors: Kenji Wada, Shizuoka (JP); Hiroshi Saegusa, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 904 days.

(21) Appl. No.: 11/860,585

(22) Filed: Sep. 25, 2007

(65) Prior Publication Data

US 2008/0081290 A1 Apr. 3, 2008

(30) Foreign Application Priority Data

Sep. 25, 2006 (JP) ................................ 2006-259549

(51) Int. Cl.

| | |
|---|---|
| ***G03F 7/039*** | (2006.01) |
| ***G03F 7/075*** | (2006.01) |
| ***G03F 7/20*** | (2006.01) |
| ***G03F 7/30*** | (2006.01) |
| ***C08F 14/18*** | (2006.01) |

(52) U.S. Cl. ..................... 430/270.1; 430/311; 430/326; 430/905; 430/906; 430/907; 430/910; 526/242; 526/245

(58) Field of Classification Search ........................ None
See application file for complete search history.

(56) References Cited

U.S. PATENT DOCUMENTS

| | | | | |
|---|---|---|---|---|
| 7,611,820 | B2 * | 11/2009 | Kanda et al. | 430/270.1 |
| 2004/0185373 | A1 * | 9/2004 | Kodama | 430/270.1 |
| 2007/0128547 | A1 * | 6/2007 | Mizutani et al. | 430/281.1 |
| 2007/0148589 | A1 * | 6/2007 | Kanda et al. | 430/270.1 |

FOREIGN PATENT DOCUMENTS

| | | | |
|---|---|---|---|
| EP | 1 645 908 | A1 | 4/2006 |
| EP | 1 764 652 | A2 | 3/2007 |
| EP | 1 795 960 | A2 | 6/2007 |
| EP | 1 795 962 | A2 | 6/2007 |
| JP | 57-153433 | A | 9/1982 |
| JP | 07-220990 | A | 8/1995 |
| JP | 10-303114 | A | 11/1998 |
| WO | 2004/068242 | A1 | 8/2004 |
| WO | 2005/031461 | A1 | 4/2005 |

OTHER PUBLICATIONS

B.J. Lin; Semiconductor Foundry, Lithography, and Partners; SPIE; 2002; pp. 11-24; vol. 4688; Emerging Lithographic Technologies VI.
J.A. Hoffnagle, et al.; Liquid immersion deep-ultraviolet interferometric lithography; American Vacuum Society; Nov./Dec. 1999.
Extended European Search Report dated Feb. 12, 2008.

* cited by examiner

*Primary Examiner* — Sin J. Lee
(74) *Attorney, Agent, or Firm* — Sughrue Mion, PLLC

(57) ABSTRACT

A resist composition comprises: (A) a resin capable of increasing its solubility in an alkali developer by action of an acid; (B) a compound capable of generating an acid upon irradiation with actinic ray or radiation; (C) a resin having at least one of a fluorine atom and a silicon atom; and (D) a solvent, wherein the resin (C) has a degree of molecular weight dispersion of 1.3 or less and a weight average molecular weight of $1.0\times10^4$ or less.

53 Claims, 1 Drawing Sheet

RESIST COMPOSITION, RESIN FOR USE IN THE RESIST COMPOSITION, COMPOUND FOR USE IN THE SYNTHESIS OF THE RESIN, AND PATTERN-FORMING METHOD USING THE RESIST COMPOSITION

BACKGROUND OF THE INVENTION

1. Field of the Invention

The present invention relates to a resist composition used in a manufacturing process of semiconductors, such as IC, manufacture of circuit substrates for liquid crystals, thermal heads and the like, and lithographic process of other photo-fabrication, and also relates to resins used in the resist composition, compounds for use in the synthesis of the resins, and a pattern-forming method using the positive resist composition. Specifically, the invention relates to a resist composition suitable for exposure with an immersion projection exposure apparatus using far ultraviolet rays of wavelengths of 300 nm or less as the light source, resins used in the resist composition, compounds for use in the synthesis of the resins, and a pattern-forming method using the positive resist composition.

2. Description of the Related Art

With the progress of fining of semiconductor elements, shortening of the wavelengths of exposure light source and increasing in the numerical aperture (high NA) of the projection lens have advanced, and now exposure apparatus of NA 0.84 using an ArF excimer laser having wavelength of 193 nm as the light source have been developed. As generally well known, these can be expressed by the following expressions:

$$(\text{Resolution})=k_1\cdot(\lambda/NA)$$

$$(\text{Depth of focus})=\pm k_2\cdot\lambda/NA^2$$

wherein λ is the wavelength of the exposure light source, NA is the numerical aperture of the projection lens, $k_1$ and $k_2$ are the coefficients concerning the process.

For the realization of further higher resolution by the shortening of wavelengths, an exposure apparatus with an $F_2$ excimer laser having wavelength of 157 nm as the light source has been studied, however, the materials of lens for use in the exposure apparatus and the materials for use in the resist for shortening of wavelengths are extremely restricted, so that the realization of the reasonable manufacturing costs of the apparatus and materials and quality stabilization are very difficult, as a result, there are possibilities of missing an exposure apparatus and a resist having sufficient performances and stabilities within a required period of time.

As a technique for increasing resolution in optical microscope, what is called immersion method of filling between a projection lens and a sample with a liquid of high refractive index (hereinafter also referred to as "immersion liquid") has been conventionally known.

In connection with "the effect of immersion", the above resolution and depth of focus can be expressed by the following expressions in the case of immersion, taking $\lambda_0$ as the wavelength of the exposure light in the air, n as the refractive index of immersion liquid to the air, and $NA_0=\sin\theta$ with θ as convergence half angle of the ray of light:

$$(\text{Resolution})=k_1\cdot(\lambda_0/n)/NA_0$$

$$(\text{Depth of focus})=\pm k_2\cdot(\lambda_0/n)/NA_0^2$$

That is, the effect of immersion is equivalent to the case of using exposure wavelength of wavelength of 1/n. In other words, in the case of the projection optical system of the same NA, the depth of focus can be made n magnifications by immersion. This is effective for every pattern form, and it is possible to be combined with super resolution techniques such as a phase shift method and a deformation lighting method.

The apparatus applying this effect to the transfer of microfine image pattern of semiconductor element are introduced by JP-A-57-153433 and JP-A-7-220990.

The latest advancement of immersion exposure techniques is reported in *SPIE Proc.*, 4688, 11 (2002), *J. Vac. Sci. Tecnol. B,* 17 (1999), and JP-A-10-303114. When an ArF excimer laser is used as the light source, it is thought that pure water (refractive index at 193 nm: 1.44) is most promising in the light of the safety in handling, and transmittance and refractive index at 193 nm.

When an $F_2$ excimer laser is used as the light source, a solution containing fluorine is discussed from the balance of transmittance and refractive index at 157 nm, but a sufficiently satisfactory solution from the viewpoint of environmental safety and in the point of refractive index has not been found yet. From the extent of the effect of immersion and the degree of completion of resist, it is thought that immersion exposure technique will be carried on an ArF exposure apparatus earliest.

On and after the resist for a KrF excimer laser (248 nm), an image-forming method that is called chemical amplification is used as the image-forming method of the resist for compensating for the reduction of sensitivity by light absorption. To explain the image-forming method of positive chemical amplification by example, this is an image-forming method of exposing a resist to decompose an acid generator in the exposed part to thereby generate an acid, changing an alkali-insoluble group to an alkali-soluble group by the bake after exposure (PEB: Post Exposure Bake) by utilizing the generated acid as the reactive catalyst, and removing the exposed part by alkali development.

The resist for an ArF excimer laser (wavelength: 193 nm) using the chemical amplification mechanism is now being a main current, but many insufficient points still remain, and the improvements of line edge roughness and restraint of resist profile fluctuation due to PED (Post Exposure Delay) between exposure and PEB are required.

When a chemical amplification resist is applied to immersion exposure, it is appointed that since the resist layer inevitably touches an immersion liquid at the time of exposure, the resist layer decomposes and ingredients that adversely influence the immersion liquid ooze out from the resist layer. WO 2004/068242 discloses an example that the resist performance fluctuates by the immersion of a resist for ArF exposure in water before and after exposure, and appoints this is a problem in immersion exposure.

Further, when exposure is performed with a scanning system immersion exposure apparatus in an immersion exposure process, the speed of exposure lowers if an immersion liquid does not move following in the movement of a lens, so that there is the fear of influence on productivity. In the case where the immersion liquid is water, the resist film is preferably hydrophobic in view of good following ability of water. On the other hand, there arises adverse influence on the image performance of resist when the resist film is hydrophobic, such that generating amount of scum increases, and the improvement is required.

SUMMARY OF THE INVENTION

An object of the invention is to provide a resist composition improved in line edge roughness not only in ordinary exposure (dry exposure) but also in immersion exposure, little in falling down of resist pattern due to PED between exposure and PEB and deterioration of profile, restrained in generation of scum, and good in the following ability of an immersion liquid at the time of immersion exposure; resins for use in the resist composition; compounds for use in the synthesis of the resins; and a pattern-forming method with the resist composition.

The invention relates to a positive resist composition of the following structure, resins for use in the positive resist composition, compounds for use in the synthesis of the resins, and a pattern-forming method with the positive resist composition, by which the above objects are achieved.

(1) A resist composition comprising: (A) a resin capable of increasing its solubility in an alkali developer by action of an acid; (B) a compound capable of generating an acid upon irradiation with actinic ray or radiation; (C) a resin having at least one of a fluorine atom and a silicon atom; and (D) a solvent, wherein the resin (C) has a degree of molecular weight dispersion of 1.3 or less and a weight average molecular weight of $1.0\times10^4$ or less.

(2) The positive resist composition as described in the above item (1), wherein resin (C) is a resin refined by solvent fraction.

(3) The positive resist composition for immersion exposure as described in the above item (1) or (2), wherein component (C) is a resin obtained by living radical polymerization.

(4) The positive resist composition as described in the above item (1), (2) or (3), wherein resin (C) has a group represented by formula (F3a):

(F3a)

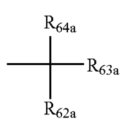

wherein $R_{62a}$ and $R_{63a}$ each independently represents an alkyl group in which at least one hydrogen atom is substituted with a fluorine atom, and $R_{62a}$ and $R_{63a}$ may be linked to each other to form a ring; and $R_{64a}$ represents a hydrogen atom, a fluorine atom, or an alkyl group.

(5) The positive resist composition as described in the above item (4), wherein the resin (C) has an acrylate or methacrylate repeating unit having a group represented by formula (F3a).

(6) The positive resist composition as described in any of the above items (1) to (5), wherein resin (C) has a group represented by any of formulae (CS-1) to (CS-3):

(CS-1)

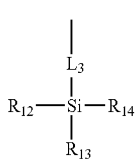

-continued (CS-2)

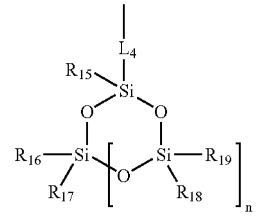

(CS-3)

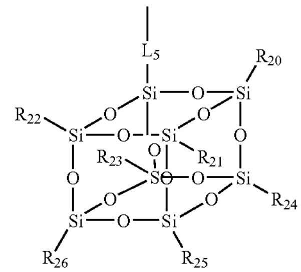

wherein $R_{12}$ to $R_{26}$ each independently represents a straight chain or branched alkyl group or cycloalkyl group; $L_3$ to $L_5$ each independently represents a single bond or a divalent linking group; and n represents an integer of from 1 to 5.

(7) The positive resist composition as described in any of the above items (1) to (6), wherein resin (C) is a resin selected from (C-1) to (C-6):

(C-1) A resin having a repeating unit (a) having a fluoroalkyl group;

(C-2) A resin having a repeating unit (b) having a trialkylsilyl group or a cyclic siloxane structure;

(C-3) A resin having a repeating unit (a) having a fluoroalkyl group, and a repeating unit (c) having a branched alkyl group, a cycloalkyl group, a branched alkenyl group, a cycloalkenyl group, or an aryl group;

(C-4) A resin having a repeating unit (b) having a trialkylsilyl group or a cyclic siloxane structure, and a repeating unit (c) having a branched alkyl group, a cycloalkyl group, a branched alkenyl group, a cycloalkenyl group, or an aryl group;

(C-5) A resin having a repeating unit (a) having a fluoroalkyl group, and a repeating unit (b) having a trialkylsilyl group or a cyclic siloxane structure; and (C-6) A resin having a repeating unit (a) having a fluoroalkyl group, a repeating unit (b) having a trialkylsilyl group or a cyclic siloxane structure, and a repeating unit (c) having a branched alkyl group, a cycloalkyl group, a branched alkenyl group, a cycloalkenyl group, or an aryl group.

(8) The positive resist composition as described in any of the above items (1) to (7), wherein resin (C) has a repeating unit represented by formula (Ia):

(Ia)

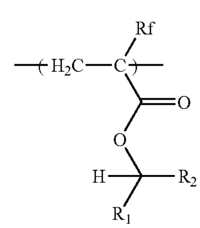

wherein Rf represents a fluorine atom, or an alkyl group in which at least one hydrogen atom is substituted with a fluorine atom; $R_1$ represents an alkyl group; and $R_2$ represents a hydrogen atom or an alkyl group.

(9) The positive resist composition as described in any of the above items (1) to (8), wherein resin (C) has a repeating unit represented by formula (II) and a repeating unit represented by formula (III):

(II)

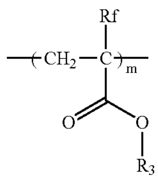

(III)

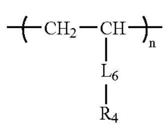

wherein Rf represents a fluorine atom, or an alkyl group in which at least one hydrogen atom is substituted with a fluorine atom; $R_3$ represents an alkyl group, a cycloalkyl group, an alkenyl group, or a cycloalkenyl group; $R_4$ represents an alkyl group, a cycloalkyl group, an alkenyl group, a cycloalkenyl group, a trialkylsilyl group, or a group having a cyclic siloxane structure; $L_6$ represents a single bond or a divalent linking group; and m and n represent figures respectively satisfying $0<m<100$ and $0<n<100$.

(10) The positive resist composition as described in the above item (4) or (5), wherein resin (C) further has at least one kind of a repeating unit selected from repeating units represented by formulae (C-I) and (C-II) as a copolymer component:

(C-I)

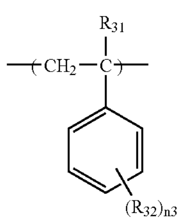

(C-II)

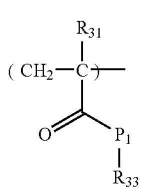

wherein $R_{31}$ each independently represents a hydrogen atom or a methyl group; $R_{32}$ represents a hydrocarbon group; $R_{33}$ represents a cyclic hydrocarbon group; $P_1$ represents a linking group selected from —O—, —NR— (where R represents a hydrogen atom or an alkyl group), and —NHSO2-; and n3 represents an integer of from 0 to 4.

(11) A compound represented by formula (I):

(I)

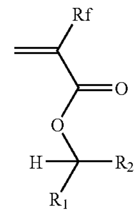

wherein Rf represents a fluorine atom, or an alkyl group in which at least one hydrogen atom is substituted with a fluorine atom; $R_1$ represents an alkyl group; and $R_2$ represents a hydrogen atom or an alkyl group.

(12) A resin having a repeating unit represented by the following formula (Ia), having a degree of molecular weight dispersion of 1.3 or less and a weight average molecular weight of $1.0\times10^4$ or less:

(Ia)

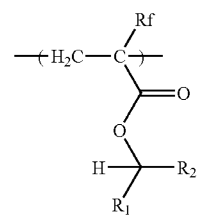

wherein Rf represents a fluorine atom, or an alkyl group in which at least one hydrogen atom is substituted with a fluorine atom; $R_1$ represents an alkyl group; and $R_2$ represents a hydrogen atom or an alkyl group.

(13) A resin having a repeating unit represented by formula (II) and a repeating unit represented by formula (III), which has a degree of molecular weight dispersion of 1.3 or less and a weight average molecular weight of $1.0\times10^4$ or less:

(II)

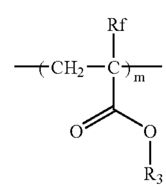

(III)

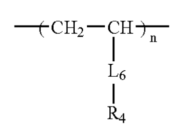

wherein Rf represents a fluorine atom, or an alkyl group in which at least one hydrogen atom is substituted with a fluorine atom; $R_3$ represents an alkyl group, a cycloalkyl group, an alkenyl group, or a cycloalkenyl group; $R_4$ represents an alkyl group, a cycloalkyl group, an alkenyl group, a cycloalkenyl group, a trialkylsilyl group, or a group having a cyclic siloxane structure; $L_6$ represents a single bond or a divalent linking group; and m and n represent figures respectively satisfying $0<m<100$ and $0<n<100$.

(14) A pattern-forming method comprising: forming a resist film with any of the positive resist compositions described in any of the above items (1) to (10); exposing and developing the resist film.

More preferred embodiments of the invention are described below.

(15) The positive resist composition as described in any of the items (1) to (10), wherein resin (C) is stable to an acid and insoluble in an alkali developer.

(16) The positive resist composition as described in any of the items (1) to (10), wherein the total amount of the repeating units having an alkali-soluble group or a group capable of increasing solubility in a developing solution by the action of an acid or alkali in resin (C) accounts for 20 mol % or less of all the repeating units constituting resin (C).

(17) The positive resist composition as described in any of the items (1) to (10), (15) and (16), wherein when a film is formed the sweepback contact angle of water to the film is 70° or more.

(18) The positive resist composition as described in any of the items (1) to (10), (15) to (17), wherein the addition amount of resin (C) is from 0.1 to 5 mass % based on all the solids content in the positive resist composition.

(19) The positive resist composition as described in any of the items (1) to (10), (15) to (18), which further contains:
(E) a basic compound.

(20) The positive resist composition as described in any of the items (1) to (10), (15) to (19), which further contains:
(F) a fluorine and/or a silicon surfactant.

(21) The positive resist composition as described in any of the items (1) to (10), (15) to (20), wherein solvent (D) is a mixed solvent of two or more kinds of solvents containing propylene glycol monomethyl ether acetate.

(22) The positive resist composition for immersion exposure as described in any of the items (1) to (10), (15) to (21), wherein resin (A) contains a repeating unit capable of being desorbed by the action of an acid having an alicyclic structure.

(23) The positive resist composition for immersion exposure as described in any of the items (1) to (10), (15) to (22), wherein resin (A) contains a repeating unit having a lactone group.

(24) The positive resist composition as described in any of the items (1) to (10), (15) to (23), wherein resin (A) is a copolymer having three kinds of repeating units of at least a (meth)acrylate repeating unit having a lactone ring, a (meth) acrylate repeating unit having an organic group substituted with at least either a hydroxyl group or a cyano group, and a (meth)acrylate repeating unit having an acid-decomposable group.

(25) The positive resist composition as described in any of the items (1) to (10), (15) to (24), wherein the weight the average molecular weight of resin (A) is from 5,000 to 15,000, and the degree of dispersion of resin (A) is from 1.2 to 3.0.

(26) The positive resist composition as described in any of the items (1) to (10), (15) to (25), wherein compound (B) is a compound capable of generating an aliphatic sulfonic acid having a fluorine atom or a benzenesulfonic acid having a fluorine atom upon irradiation with actinic ray or radiation.

(27) The positive resist composition as described in any of the items (1) to (10), (15) to (26), wherein compound (B) has a triphenylsulfonium structure.

(28) The positive resist composition as described in the item (27), wherein compound (B) is a triphenylsulfonium salt compound having an alkyl group or cycloalkyl group not substituted with a fluorine atom at the cationic portion.

(29) The positive resist composition as described in any of the items (1) to (10), (15) to (28), wherein the concentration of all the solids content in the positive resist composition is from 1.0 to 6.0 mass %.

(30) The positive resist composition as described in any of the items (1) to (10), (15) to (29), wherein resin (A) does not have a fluorine atom and a silicon atom.

(31) The pattern-forming method as described in the item (13), wherein exposure is performed with lights of wavelengths of from 1 to 200 nm.

(32) The pattern-forming method as described in the item (13) or (31), which contains an immersion exposure process.

Figure 1:
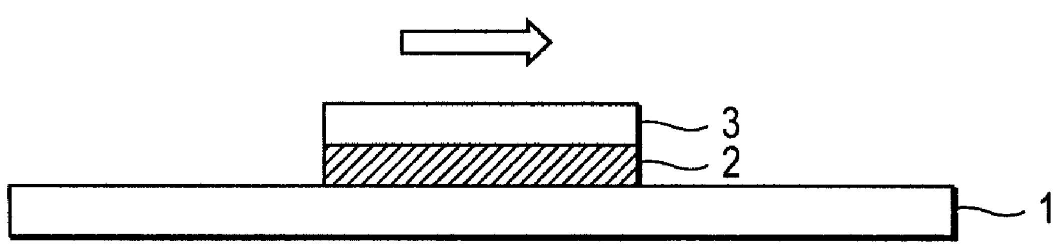
FIG. 1 is a schematic view of an evaluation method of the following ability of water.

1 denotes a wafer having formed a resist film, 2 denotes a pure water and 3 denotes a quartz glass substrate

DETAILED DESCRIPTION OF THE INVENTION

The invention will be described in detail below.

In the description of a group (an atomic group) in the specification of the invention, the description not referring to substitution or unsubstitution includes both a group not having a substituent and a group having a substituent. For example, "an alkyl group" includes not only an alkyl group having no substituent (an unsubstituted alkyl group) but also an alkyl group having a substituent (a substituted alkyl group).

(A) Resin Capable of Increasing the Solubility in an Alkali Developer by the Action of an Acid:

A resin for use in the positive resist composition in the invention is a resin capable of decomposing by the action of an acid to increase solubility in an alkali developer, and having a group capable of decomposing by the action of an acid to generate an alkali-soluble group (hereinafter also referred to as "an acid-decomposable group") on the main chain or side chain or both of the main chain and side chain of the resin (hereinafter also referred to as "an acid-decomposable resin", "acid-decomposable resin (A)", or "resin (A)").

The alkali-soluble groups include groups having a phenolic hydroxyl group, a carboxylic acid group, a fluorinated alcohol group, a sulfonic acid group, a sulfonamido group, a sulfonylimido group, an (alkylsulfonyl)(alkylcarbonyl)-methylene group, an (alkylsulfonyl)(alkylcarbonyl)imido group, a bis(alkylcarbonyl)methylene group, a bis(alkyl-carbonyl)imido group, a bis(alkylsulfonyl)methylene group, a bis(alkylsulfonyl)imido group, a tris(alkylcarbonyl)-methylene group, or a tris(alkylsulfonyl)methylene group.

As the preferred alkali-soluble groups, a carboxylic acid group, a fluorinated alcohol group (preferably hexafluoroisopropanol), and a sulfonic acid group are exemplified.

The preferred groups capable of decomposing by the action of an acid (acid-decomposable groups) are groups obtained by substituting the hydrogen atoms of these alkali-soluble groups with groups capable of being desorbed by the action of an acid.

As the group capable of being desorbed by the action of an acid, $-C(R_{36})(R_{37})(R_{38})$, $-C(R_{36})(R_{37})(OR_{39})$, $-C(R_{01})(R_{02})(OR_{39})$ and the like can be exemplified.

In the formulae, $R_{36}$ to $R_{39}$ each represents an alkyl group, a cycloalkyl group, an aryl group, an aralkyl group, or an alkenyl group. $R_{36}$ and $R_{37}$ may be bonded to each other to form a ring.

$R_{01}$ and $R_{02}$ each represents a hydrogen atom, an alkyl group, a cycloalkyl group, an aryl group, an aralkyl group, or an alkenyl group.

The preferred acid-decomposable groups are a cumyl ester group, an enol ester group, an acetal ester group, a tertiary alkyl ester group, etc., and the more preferred group is a tertiary alkyl ester group.

When the positive resist composition in the invention is irradiated with ArF excimer laser beam, the acid decomposable resin is preferably a resin having a monocyclic or polycyclic alicyclic hydrocarbon structure and decomposed by the action of an acid to increase solubility in an alkali developer.

The resin having a monocyclic or polycyclic alicyclic hydrocarbon structure and decomposed by the action of an acid to increase solubility in an alkali developer (hereinafter also referred to as "alicyclic hydrocarbon series acid-decomposable resin") is preferably a resin containing at least one repeating unit selected from the group consisting of a repeating unit having a partial structure containing alicyclic hydrocarbon represented by any of the following formulae (pI) to (pV), and a repeating unit represented by the following formula (II-AB).

(pI)

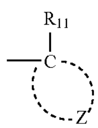

(pII)

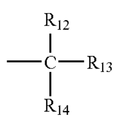

(pIII)

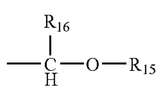

(pIV)

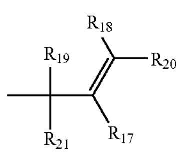

(pV)

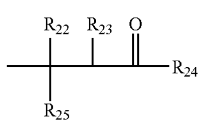

In formulae (pI) to (pV), $R_{11}$ represents a methyl group, an ethyl group, an n-propyl group, an isopropyl group, an n-butyl group, an isobutyl group, or a sec-butyl group; and Z represents an atomic group necessary to form a cycloalkyl group together with a carbon atom.

$R_{12}$, $R_{13}$, $R_{14}$, $R_{15}$ and $R_{16}$ each represents a straight chain or branched alkyl group having from 1 to 4 carbon atoms, or a cycloalkyl group, provided that at least one of $R_{12}$ to $R_{14}$, or either $R_{15}$ or $R_{16}$ represents a cycloalkyl group.

$R_{17}$, $R_{18}$, $R_{19}$, $R_{20}$ and $R_{21}$ each represents a hydrogen atom, a straight chain or branched alkyl group having from 1 to 4 carbon atoms, or a cycloalkyl group, provided that at least one of $R_{17}$ to $R_{21}$ represents a cycloalkyl group, and either $R_{19}$ or $R_{21}$ represents a straight chain or branched alkyl group having from 1 to 4 carbon atoms, or a cycloalkyl group.

$R_{22}$, $R_{23}$, $R_{24}$ and $R_{25}$ each represents a hydrogen atom, a straight chain or branched alkyl group having from 1 to 4 carbon atoms, or a cycloalkyl group, provided that at least one of $R_{22}$ to $R_{25}$ represents a cycloalkyl group, and $R_{23}$ and $R_{24}$ may be bonded to each other to form a ring.

(II-AB)

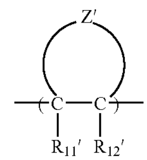

In formula (II-AB), $R_{11}'$ and $R_{12}'$ each represents a hydrogen atom, a cyano group, a halogen atom, or an alkyl group.

Z' contains bonded two carbon atoms (C—C) and represents an atomic group to form an alicyclic structure.

The repeating unit represented by formula (II-AB) is preferably a repeating unit represented by the following formula (II-AB1) or (II-AB2).

(II-AB1)

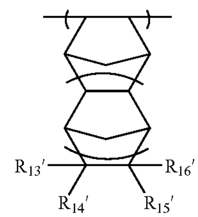

(II-AB2)

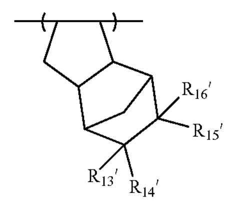

In formulae (II-AB1) and (II-AB2), $R_{13}'$, $R_{14}'$, $R_{15}'$ and $R_{16}'$ each represents a hydrogen atom, a halogen atom, a cyano group, —COOH, —$COOR_5$, a group capable of decomposing by the action of an acid, —C(═O)—X-A'—$R_{17}'$, an alkyl group, or a cycloalkyl group, and at least two of $R_{13}'$ to $R_{16}'$ may be bonded to form a ring.

$R_5$ represents an alkyl group, a cycloalkyl group, or a group having a lactone structure.

X represents an oxygen atom, a sulfur atom, —NH—, —$NHSO_2$—, or —$NHSO_2NH$—.

A' represents a single bond or a divalent linking group.

$R_{17}'$ represents —COOH, —$COOR_5$, —CN, a hydroxyl group, an alkoxyl group, —CO—NH—$R_6$, —CO—NH—$SO_2$—$R_6$, or a group having a lactone structure.

$R_6$ represents an alkyl group or a cycloalkyl group.

n represents 0 or 1.

In formulae (pI) to (pV), the alkyl group represented by $R_{12}$ to $R_{25}$ is a straight chain or branched alkyl group having from 1 to 4 carbon atoms.

The cycloalkyl groups represented by $R_{11}$ to $R_{25}$ or the cycloalkyl groups formed by Z and carbon atoms may be monocyclic or polycyclic. Specifically, groups having a monocyclic, bicyclic, tricyclic or tetracyclic structure having 5 or more carbon atoms can be exemplified. The carbon atom number of these cycloalkyl groups is preferably from 6 to 30, and especially preferably from 7 to 25. These cycloalkyl groups may each have a substituent.

As preferred cycloalkyl groups, an adamantyl group, a noradamantyl group, a decalin residue, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group, and a cyclododecanyl group can be exemplified. More preferred cycloalkyl groups are an adamantyl group, a norbornyl group, a cyclohexyl group, a cyclopentyl group, a tetracyclododecanyl group, and a tricyclodecanyl group.

These alkyl groups and cycloalkyl groups may further have a substituent, and as the further substituents, an alkyl group (having from 1 to 4 carbon atoms), a halogen atom, a hydroxyl group, an alkoxyl group (having from 1 to 4 carbon atoms), a carboxyl group, and an alkoxycarbonyl group (having from 2 to 6 carbon atoms) can be exemplified. As the substituents that these alkyl group, alkoxyl group and alkoxycarbonyl group may further have, a hydroxyl group, a halogen atom and an alkoxyl group are exemplified.

The structures represented by formulae (pI) to (pV) in the above resins can be used for the protection of the alkali-soluble groups. As the alkali-soluble groups, various groups known in this technical field can be exemplified.

Specifically, such structures that the hydrogen atoms of carboxylic acid group, a sulfonic acid group, a phenol group and a thiol group are substituted with the structures represented by formulae (pI) to (pV) are exemplified, and preferably the structures that the hydrogen atoms of a carboxylic acid group and a sulfonic acid group are substituted with the structures represented by formulae (pI) to (pV) are exemplified.

As a repeating unit having the alkali-soluble group protected with the structure represented by any of formulae (pI) to (pV), a repeating unit represented by the following formula (pA) is preferred.

(pA)

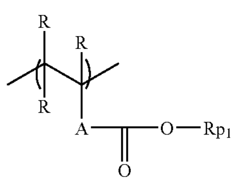

In formula (pA), R represents a hydrogen atom, a halogen atom, or a straight chain or branched alkyl group having from 1 to 4 carbon atoms. A plurality of R's may be the same or different.

A represents a single group or a combination of two or more groups selected from the group consisting of a single bond, an alkylene group, an ether group, a thioether group, a carbonyl group, an ester group, an amido group, a sulfonamido group, a urethane group, and a urea group, and preferably a single bond.

$Rp_1$ represents a group represented by any of formulae (pI) to (pV).

The repeating unit represented by (pA) is most preferably a repeating unit by 2-alkyl-2-adamantyl(meth)acrylate, or dialkyl(1-adamantyl)methyl(meth)acrylate.

The specific examples of the repeating units represented by formula (pA) are shown below.

(In the formulae, Rx represents H, $CH_3$, or $CH_2OH$, and Rxa and Rxb represents an alkyl group having from 1 to 4 carbon atoms.)

1

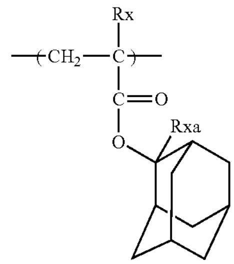

2

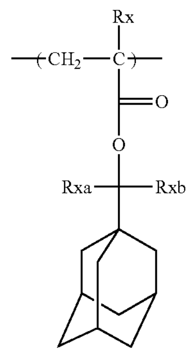

3

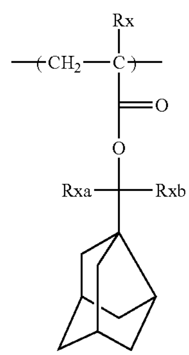

4

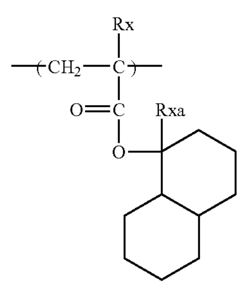

5

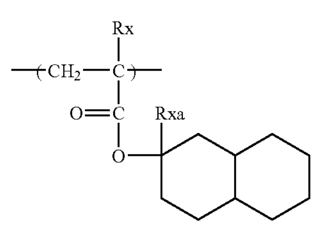

-continued
6
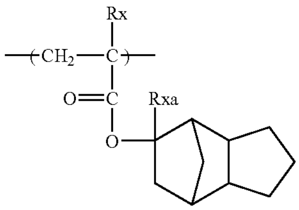
7
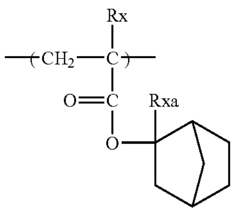
8
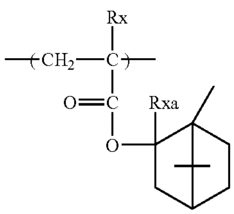
9
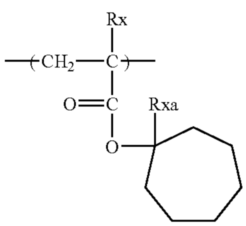
10
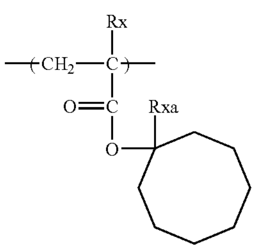
11
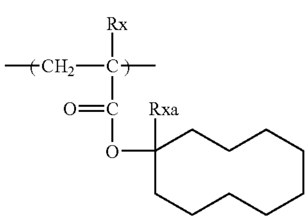
12
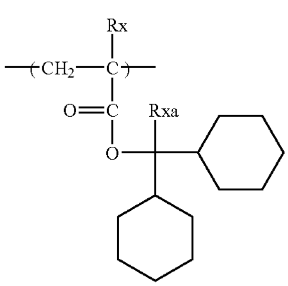
-continued
13
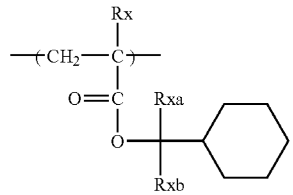
14
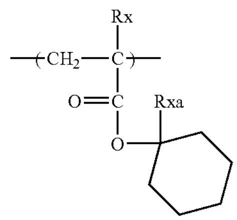
15
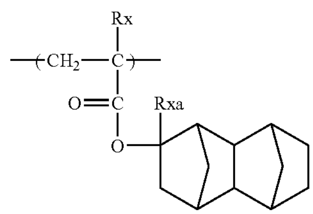
16
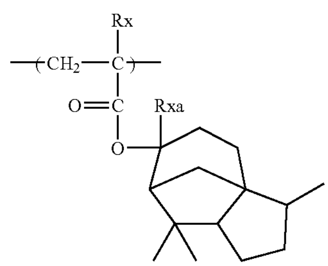
17
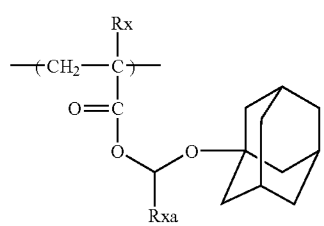
18
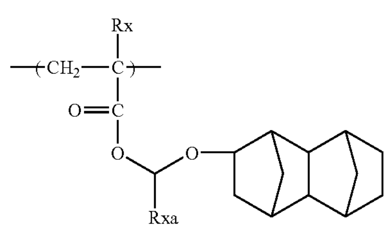
19
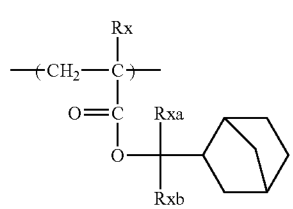

-continued

20

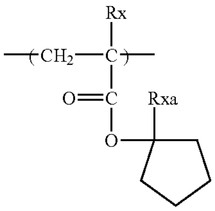

21

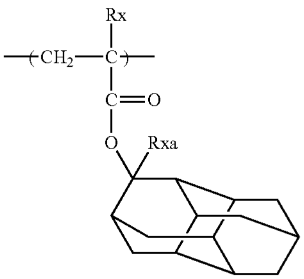

22

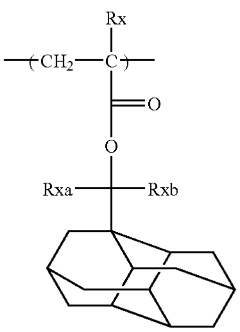

23

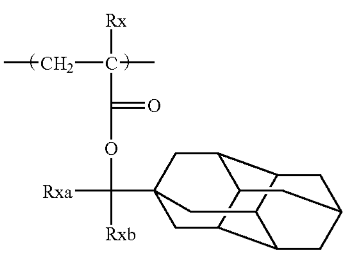

24

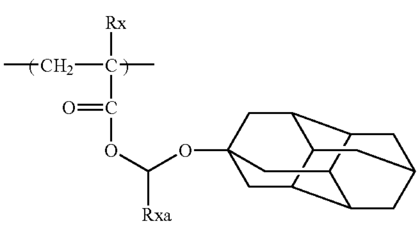

25

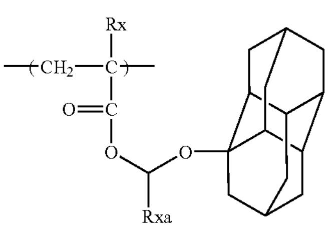

-continued

26

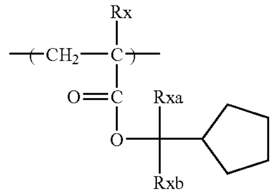

27

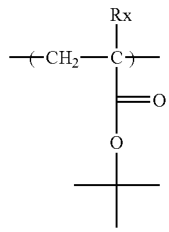

28

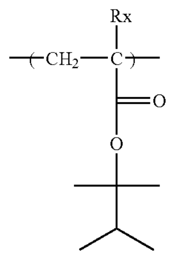

As the halogen atoms represented by $R_{11}$' and $R_{12}$' in formula (II-AB), a chlorine atom, a bromine atom, a fluorine atom and an iodine atom are exemplified.

As the alkyl groups represented by $R_{11}$' and $R_{12}$', straight chain or branched alkyl groups having from 1 to 10 carbon atoms are exemplified.

The atomic group for forming an alicyclic structure represented by Z' is an atomic group to form a repeating unit of alicyclic hydrocarbon that may have a substituent in the resin, and an atomic group to form a bridged alicyclic structure for forming a bridged alicyclic hydrocarbon repeating unit is especially preferred.

As the skeleton of the alicyclic hydrocarbon formed, the same alicyclic hydrocarbon groups as represented by $R_{12}$ to $R_{25}$ in formulae (pI) to (pV) are exemplified.

The skeleton of the alicyclic hydrocarbon may have a substituent, and as the substituents, the groups represented by $R_{13}$' to $R_{16}$' in formula (II-AB1) or (II-AB2) can be exemplified.

In the alicyclic hydrocarbon series acid-decomposable resin in the invention, a group capable of decomposing by the action of an acid can be contained in at least one repeating unit of the repeating unit having a partial structure containing the alicyclic hydrocarbon represented by any of formulae (pI) to (pV), the repeating unit represented by formula (II-AB), and a repeating unit of the later-described copolymer component.

Various substituents of $R_{13}$' to $R_{16}$' in formula (II-AB1) or (II-AB2) can also be used as the substituents of the atomic group to form an alicyclic structure, or atomic group Z to form a bridged alicyclic structure in formula (II-AB).

The specific examples of the repeating units represented by formula (II-AB1) or (II-AB2) are shown below, but the invention is not restricted to these specific examples.

[II-1]
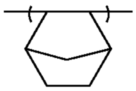
[II-2]
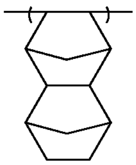
[II-3]
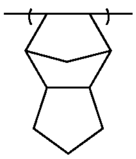
[II-4]
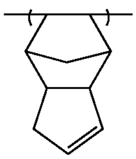
[II-5]
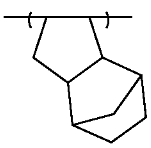
[II-6]
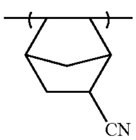
[II-7]
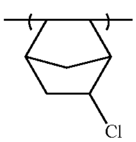
[II-8]
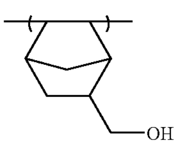
[II-9]
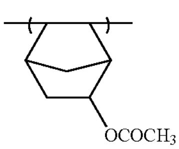
[II-10]
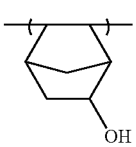
-continued
[II-11]
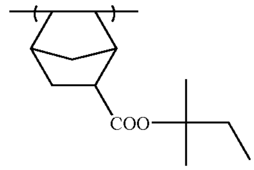
[II-12]
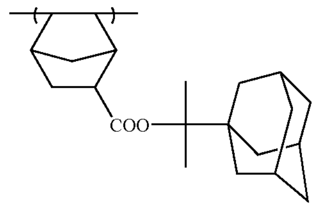
[II-13]
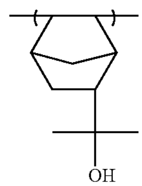
[II-14]
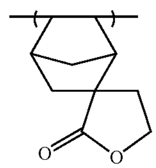
[II-15]
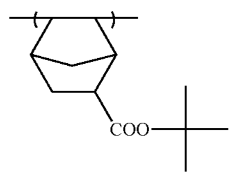
[II-16]
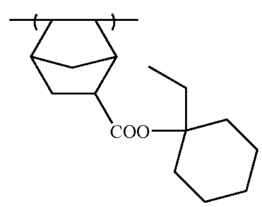
[II-17]
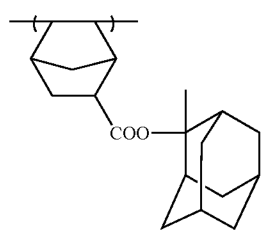
[II-18]
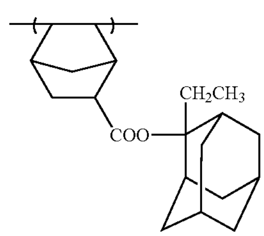

-continued
[II-19]
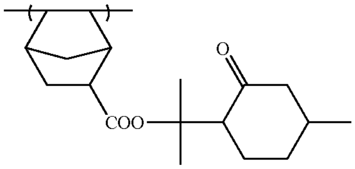
[II-20]
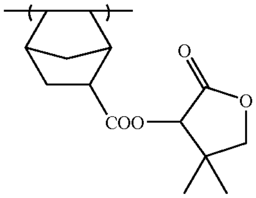
[II-21]
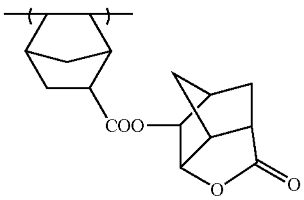
[II-22]
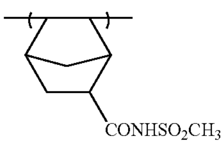
[II-23]
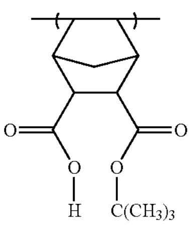
[II-24]
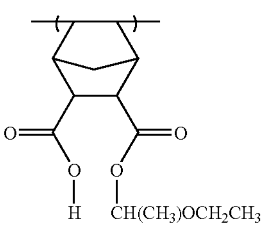
[II-25]
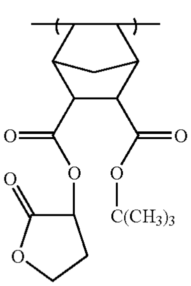
-continued
[II-26]
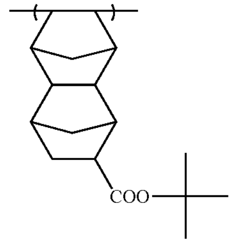
[II-27]
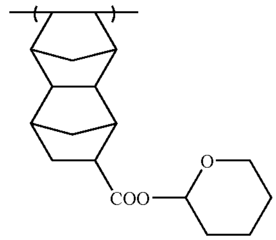
[II-28]
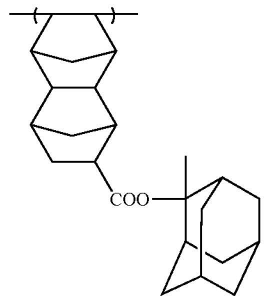
[II-29]
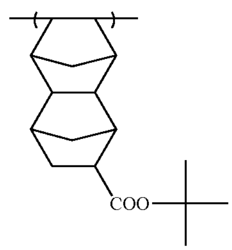
[II-30]
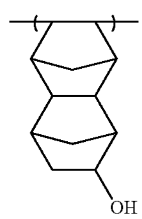
[II-31]
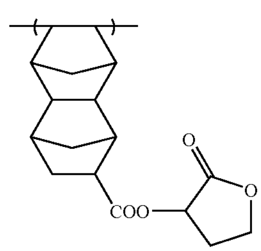

-continued

[II-32]

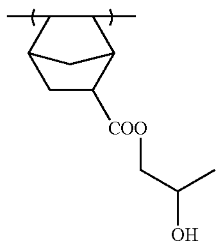

It is preferred for acid-decomposable resin (A) in the invention to have a lactone group. As the lactone group, any group having a lactone structure can be used, but groups having a 5- to 7-membered ring lactone structure are preferred, and groups having a 5- to 7-membered ring lactone structure condensed with other ring structures in the form of forming a bicyclo structure or a spiro structure are preferred. It is more preferred to have a repeating unit having a group having a lactone structure represented by any of the following formulae (LC1-1) to (LC1-16). A group having a lactone structure may be directly bonded to the main chain of a repeating unit. Preferred lactone structures are groups represented by (LC1-1), (LC1-4), (LC1-5), (LC1-6), (LC1-13) and (LC1-14). By the use of a specific lactone structure, line edge roughness and development defect are bettered.

LCl-1

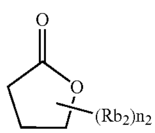

LCl-2

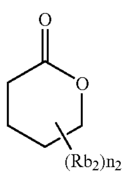

LCl-3

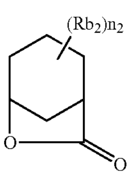

LCl-4

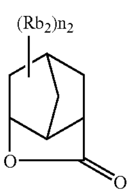

LCl-5

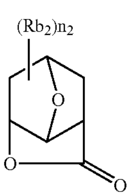

-continued

LCl-6

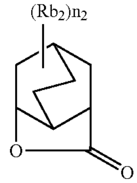

LCl-7

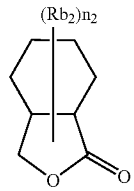

LCl-8

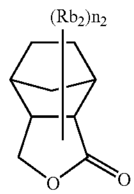

LCl-9

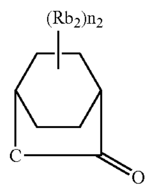

LCl-10

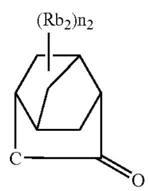

LCl-11

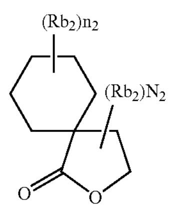

LCl-11

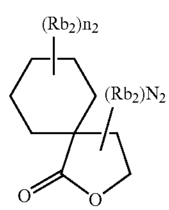

LCl -13

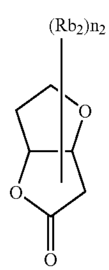

-continued

LC1-14

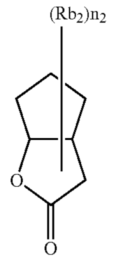

LC1-15

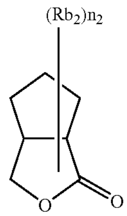

LC1-16

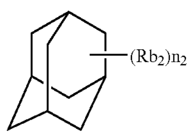

A lactone structure moiety may have or may not have a substituent ($Rb_2$). As preferred substituent ($Rb_2$), an alkyl group having from 1 to 8 carbon atoms, a cycloalkyl group having from 4 to 7 carbon atoms, an alkoxyl group having from 1 to 8 carbon atoms, an alkoxycarbonyl group having from 1 to 8 carbon atoms, a carboxyl group, a halogen atom, a hydroxyl group, a cyano group, and an acid-decomposable group are exemplified. $n_2$ represents an integer of from 0 to 4. When $n_2$ is 2 or more, a plurality of $Rb_2$'s may be the same or different, and a plurality of $Rb_2$'s may be bonded to each other to form a ring.

As the repeating units having a group having a lactone structure represented by any of formulae (LC1-1) to (LC1-16), a repeating unit represented by formula (II-AB1) or (II-AB2) in which at least one of $R_{13}'$ to $R_{16}'$ has a group represented by any of formulae (LC1-1) to (LC1-16) (for example, $R_5$ of —$COOR_5$ represents a group represented by any of formulae (LC1-1) to (LC1-16)), or a repeating unit represented by the following formula (AI) can be exemplified.

(AI)

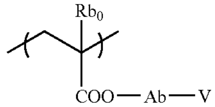

In formula (AI), $Rb_0$ represents a hydrogen atom, a halogen atom, or an alkyl group having from 1 to 4 carbon atoms.

As the preferred substituents that the alkyl group represented by $Rb_0$ may have, a hydroxyl group and a halogen atom are exemplified.

As the halogen atom represented by $Rb_0$, a fluorine atom, a chlorine atom, a bromine atom and an iodine atom can be exemplified.

$Rb_0$ preferably represents a hydrogen atom or a methyl group.

Ab represents a single bond, an alkylene group, a divalent linking group having a monocyclic or polycyclic alicyclic hydrocarbon structure, an ether group, an ester group, a carbonyl group, a carboxyl group, or a divalent linking group combining these groups. Ab preferably represents a single bond or a linking group represented by $-Ab_1-CO_2$—. $Ab_1$ represents a straight chain or branched alkylene group, or a monocyclic or polycyclic cycloalkylene group, and preferably a methylene group, an ethylene group, a cyclohexylene group, an adamantyl group, or a norbornylene group.

V represents a group represented by any of formulae (LC1-1) to (LC1-16).

Repeating units having a lactone structure generally have optical isomers, and any optical isomer may be used. One kind of optical isomer may be used alone, or a plurality of optical isomers may be used as mixture. When one kind of optical isomer is mainly used, the optical purity (ee) of the optical isomer is preferably 90 or more, and more preferably 95 or more.

The specific examples of repeating units having a group having a lactone structure are shown below, but the invention is not restricted thereto.

(In the formulae, Rx represents H, $CH_3$, $CH_2OH$ or $CF_3$.)

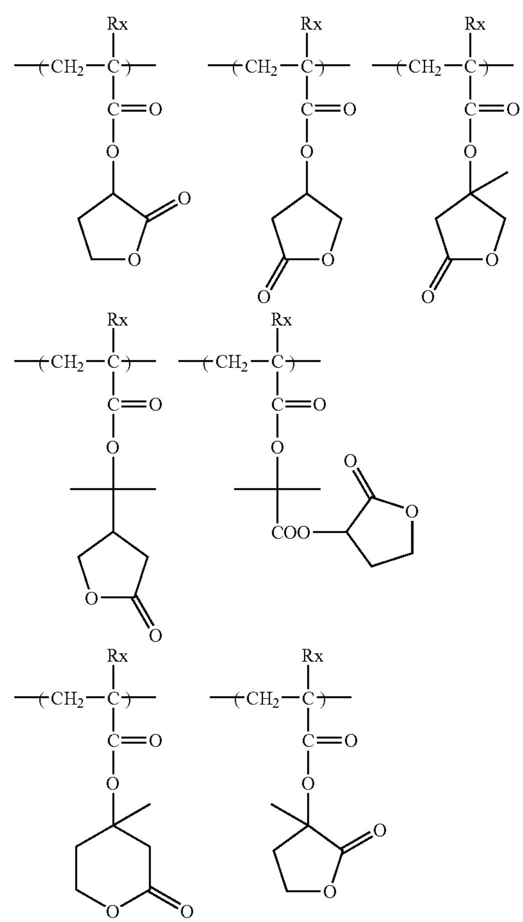

-continued
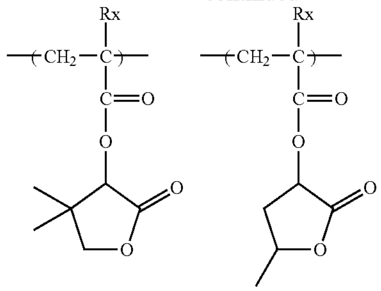
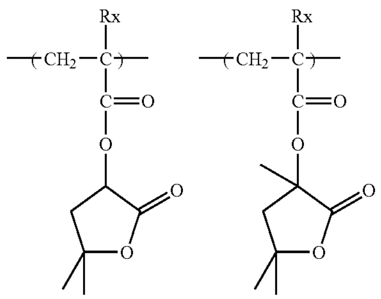
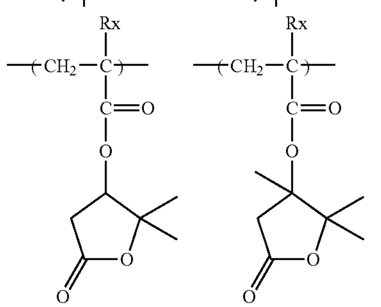
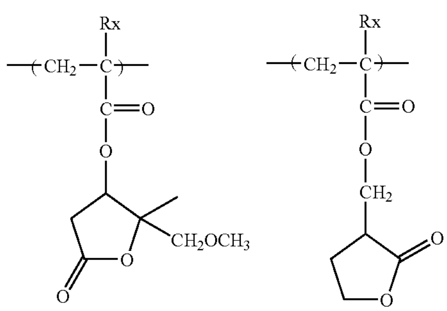
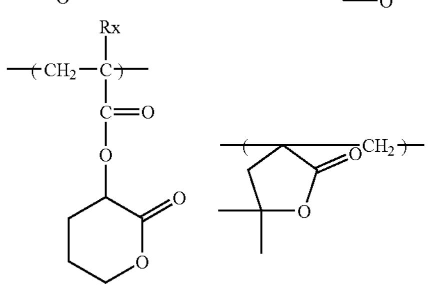
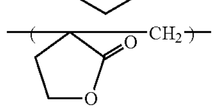
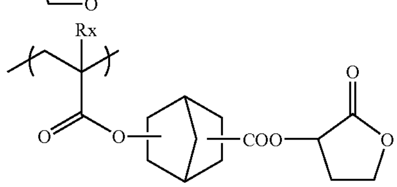
-continued
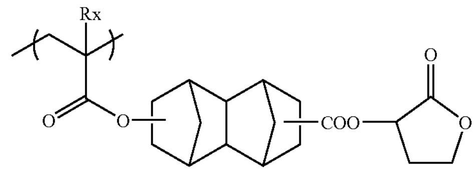
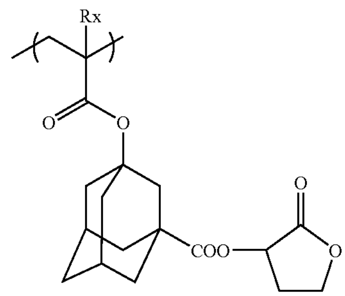
(In the formulae, Rx represents H, $CH_3$, $CH_2OH$ or $CF_3$.)
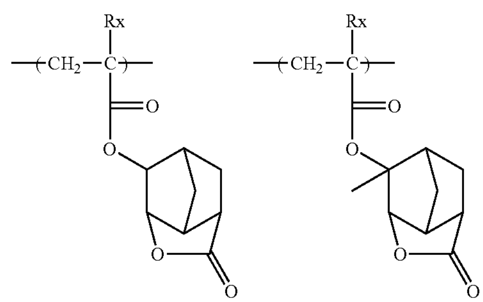
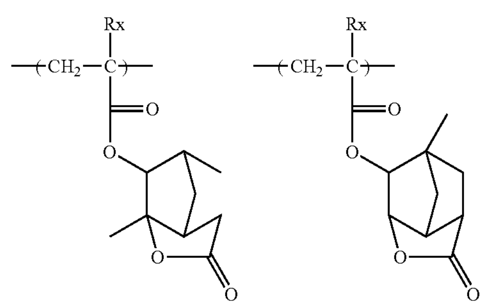
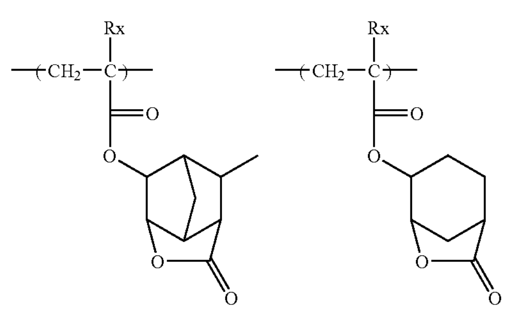

-continued
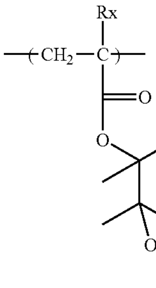
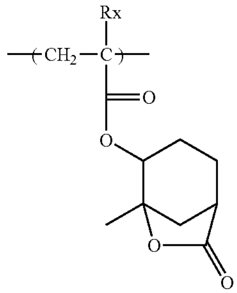
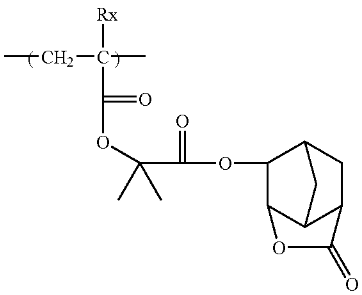
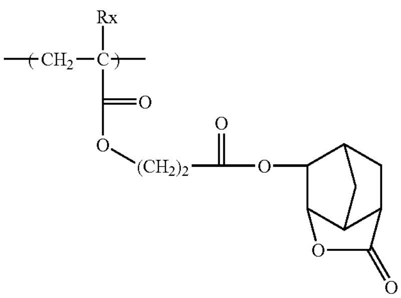
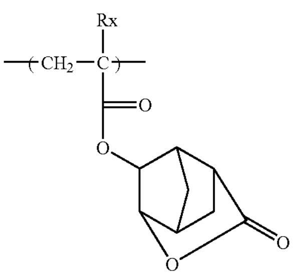
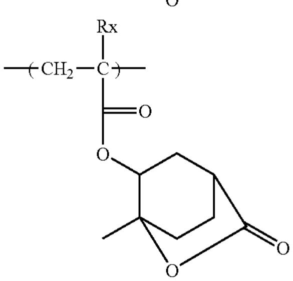
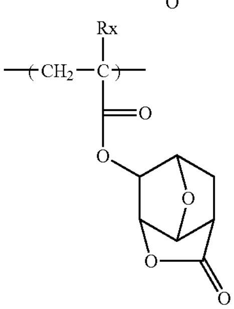
-continued
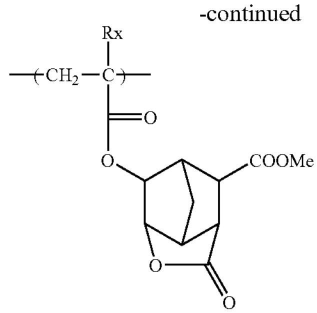
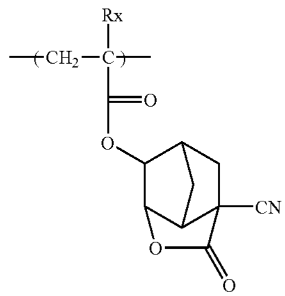
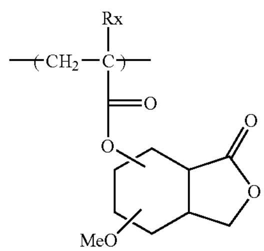
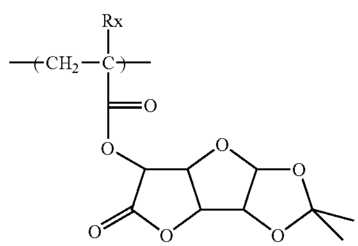
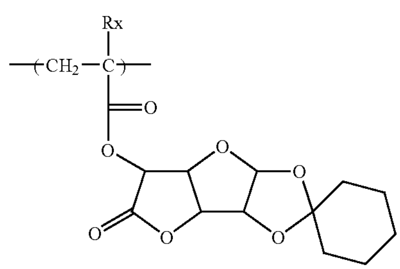
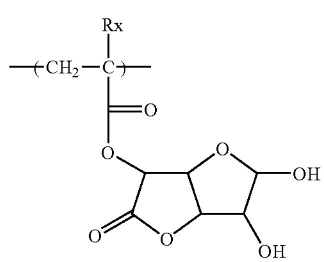

-continued

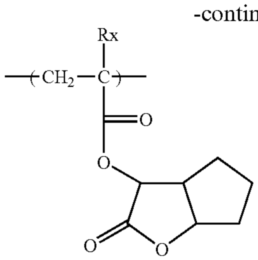

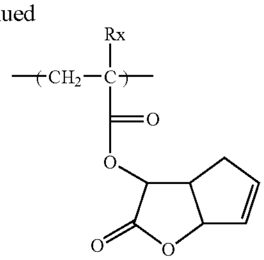

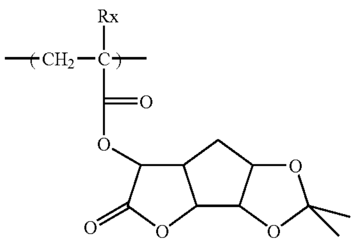

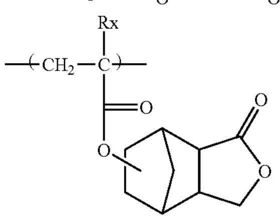

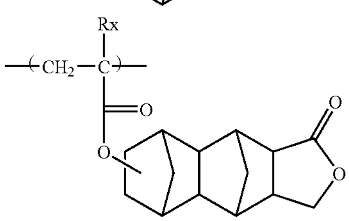

(In the formulae, Rx represents H, $CH_3$, $CH_2OH$ or $CF_3$.)

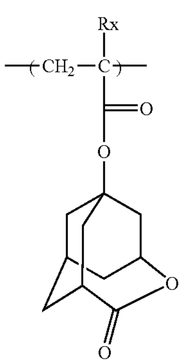

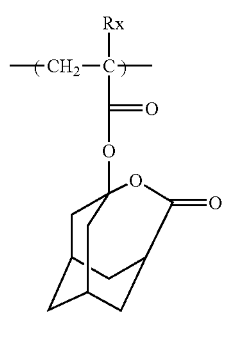

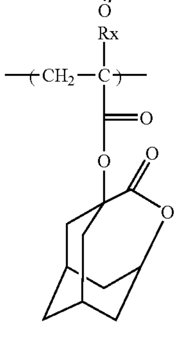

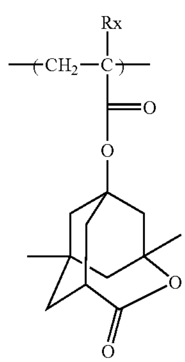

-continued

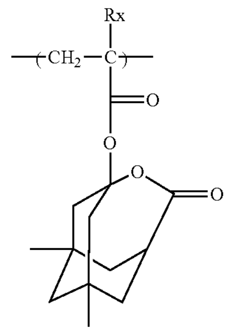

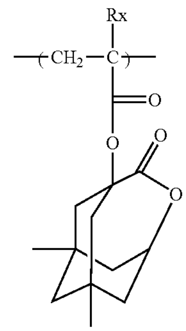

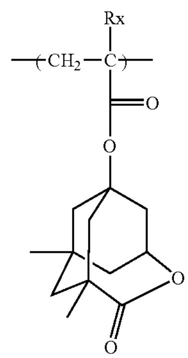

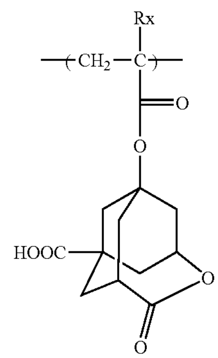

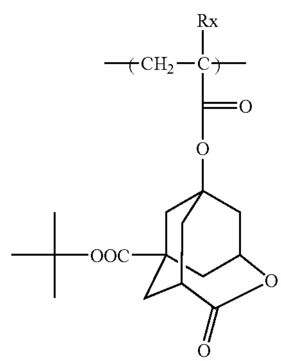

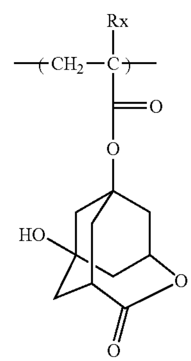

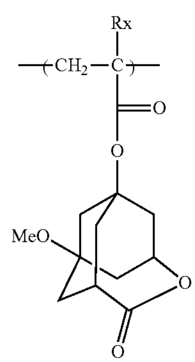

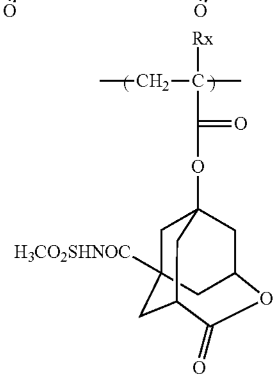

It is preferred for acid-decomposable resin (A) of the invention to have a repeating unit having an organic group having a polar group, in particular to have a repeating unit having an alicyclic hydrocarbon structure substituted with a polar group, by which adhesion with a substrate and affinity with a developing solution are improved. As the alicyclic hydrocarbon structure of the alicyclic hydrocarbon structure substituted with a polar group, an adamantyl group, a diamantyl group, and a norbornane group are preferred. As the polar groups, a hydroxyl group and a cyano group are preferred.

As the alicyclic hydrocarbon structure substituted with a polar group, a partial structure represented by any of the following formulae (VIIa) to (VIId) is preferred.

(VIIa)

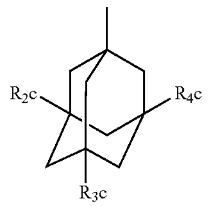

(VIIb)

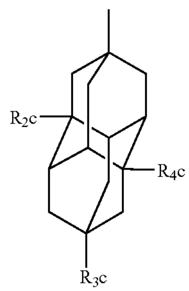

(VIIc)

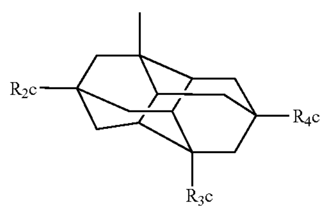

(VIId)

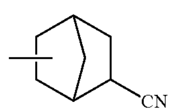

In formula (VIIa) to (VIIc), $R_{2c}$, $R_{3c}$ and $R_{4c}$ each represents a hydrogen atom, a hydroxyl group, or a cyano group, provided that at least one of $R_{2c}$, $R_{3c}$ and $R_{4c}$ represents a hydroxyl group or a cyano group. Preferably one or two of $R_{2c}$, $R_{3c}$ and $R_{4c}$ represent a hydroxyl group and the remainder represent a hydrogen atom.

In formula (VIIa), more preferably two of $R_{2c}$, $R_{3c}$ and $R_{4c}$ represent a hydroxyl group and the remainder represents a hydrogen atom.

As the repeating unit having a group represented by any of formulae (VIIa) to (VIId), a repeating unit represented by formula (II-AB1) or (II-AB2) in which at least one of $R_{13}'$ to $R_{16}'$ has a group represented by formula (VII) (for example, $R_5$ of —$COOR_5$ represents a group represented by any of formulae (VIIa) to (VIId)), or a repeating unit represented by any of the following formulae (AIIa) to (AIId) can be exemplified.

(AIIa)

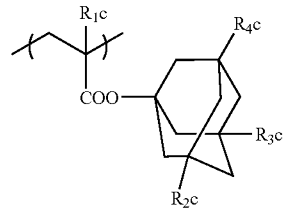

(AIIb)

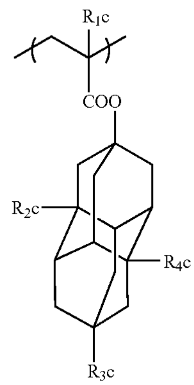

(AIIc)

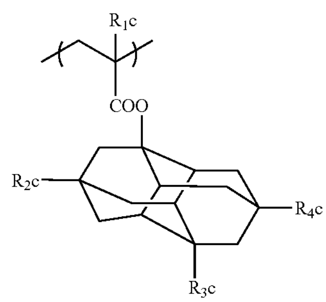

(AIId)

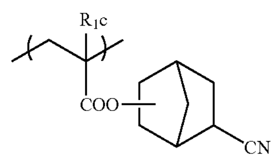

In formulae (AIIa) to (AIId), $R_{1c}$ represents a hydrogen atom, a methyl group, a trifluoromethyl group, or a hydroxymethyl group.

$R_{2c}$, $R_{3c}$ and $R_{4c}$ have the same meaning as $R_{2c}$ to $R_{4c}$ in formulae (VIIa) to (VIIc).

The specific examples of the repeating units having the structure represented by any of formulae (AIIa) to (AIId) are shown below, but the invention is not restricted thereto.

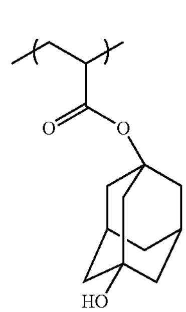

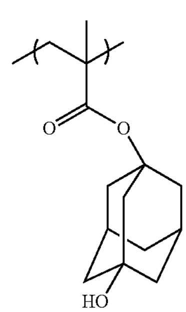

-continued

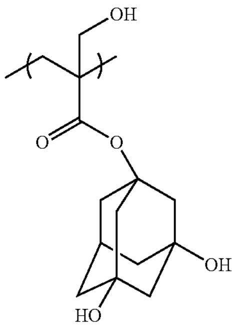

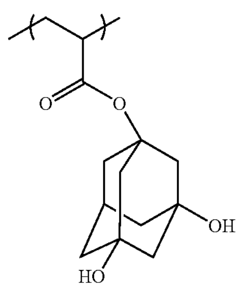

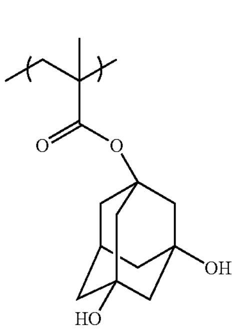

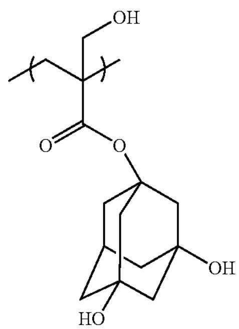

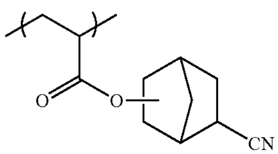

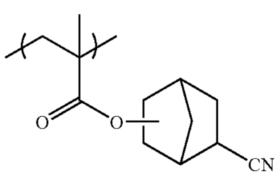

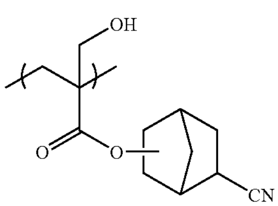

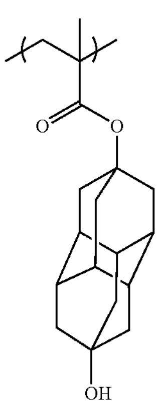

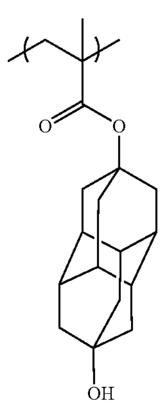

-continued

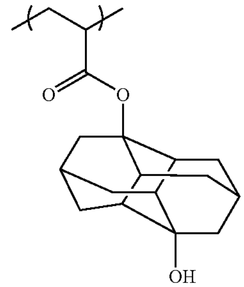

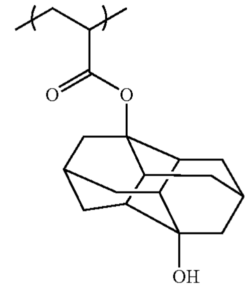

Acid-decomposable resin (A) in the invention may have a repeating unit represented by the following formula (VIII).

(VIII)

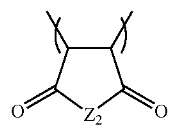

In formula (VIII), $Z_2$ represents —O— or —N($R_{41}$)—. $R_{41}$ represents a hydrogen atom, a hydroxyl group, an alkyl group, or —$OSO_2$—$R_{42}$. $R_{42}$ represents an alkyl group, a cycloalkyl group, or a camphor residue. The alkyl group represented by $R_{41}$ and $R_{42}$ may be substituted with a halogen atom (preferably a fluorine atom) and the like.

As the specific examples of the repeating units represented by formula (VIII), the following compounds are exemplified, but the invention is not restricted thereto.

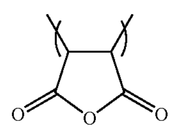

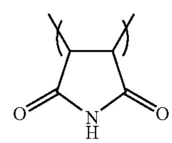

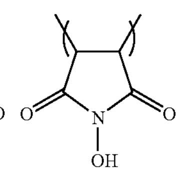

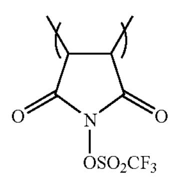

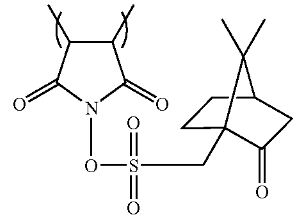

It is preferred for acid-decomposable resin (A) in the invention to have a repeating unit having an alkali-soluble group, and it is more preferred to have a repeating unit having a carboxyl group, by which the resolution in the use for contact hole is enhanced. As the repeating units having a carboxyl group, a repeating unit having a carboxyl group directly bonded to the main chain of a resin such as a repeating unit by acrylic acid or methacrylic acid, a repeating unit having a carboxyl group bonded to the main chain of a resin via a linking group, and a repeating unit having a carboxyl group introduced to the terminals of a polymer chain by polymerization with a polymerization initiator having an alkali-soluble group and a chain transfer agent are exemplified, and any of these repeating units is preferably used. The linking group may have a monocyclic or polycyclic hydrocarbon structure. The repeating unit by acrylic acid or methacrylic acid is especially preferred.

Acid-decomposable resin (A) in the invention may further have a repeating unit having one to three groups represented by the following formula (F1), by which line edge roughness property is improved.

(F1)

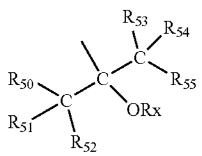

In formula (F1), $R_{50}$, $R_{51}$, $R_{52}$, $R_{53}$, $R_{54}$ and $R_{55}$ each represents a hydrogen atom, a fluorine atom, or an alkyl group, provided that at least one of $R_{50}$ to $R_{55}$ represents a fluorine atom, or an alkyl group in which at least one hydrogen atom is substituted with a fluorine atom.

Rx represents a hydrogen atom or an organic group (preferably an acid-decomposable protective group, an alkyl group, a cycloalkyl group, an acyl group, or an alkoxycarbonyl group).

The alkyl group represented by $R_{50}$ to $R_{55}$ may be substituted with a halogen atom, e.g., a fluorine atom, or a cyano group, and preferably an alkyl group having from 1 to 3 carbon atoms, e.g., a methyl group and a trifluoromethyl group can be exemplified.

It is preferred that all of $R_{50}$ to $R_{55}$ represent a fluorine atom.

As the organic group represented by Rx, an acid-decomposable protective group, and an alkyl group, a cycloalkyl group, an acyl group, an alkylcarbonyl group, an alkoxycarbonyl group, an alkoxycarbonylmethyl group, an alkoxymethyl group, and a 1-alkoxyethyl group, which may have a substituent, are preferred.

The repeating unit having the group represented by formula (F1) is preferably a repeating unit represented by the following formula (F2).

(F2)

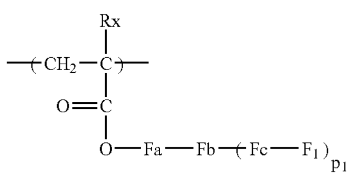

In formula (F2), Rx represents a hydrogen atom, a halogen atom, or an alkyl group having from 1 to 4 carbon atoms. As preferred substituents that the alkyl group represented by Rx may have, a hydroxyl group and a halogen atom are exemplified.

Fa represents a single bond or a straight chain or branched alkylene group, and preferably a single bond.

Fb represents a monocyclic or polycyclic hydrocarbon group.

Fc represents a single bond or a straight chain or branched alkylene group, and preferably a single bond or a methylene group.

$F_1$ represents a group represented by formula (F1).

$P_1$ is from 1 to 3.

As the cyclic hydrocarbon group represented by Fb, a cyclopentyl group, a cyclohexyl group, or a norbornyl group is preferred.

The specific examples of the repeating units having the group represented by formula (F1) are shown below, but the invention is not restricted thereto.

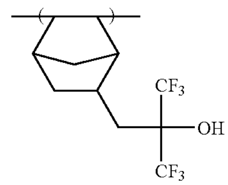

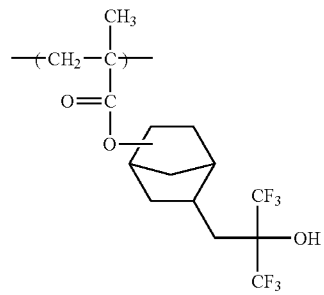

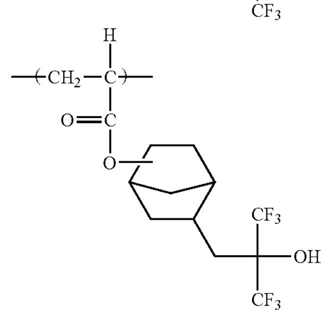

Acid-decomposable resin (A) in the invention may further contain a repeating unit having an alicyclic hydrocarbon structure and not showing acid decomposability, by containing such a repeating unit, the elution of low molecular weight components from the resist film into the immersion liquid can be reduced at the time of immersion exposure. As such repeating units, e.g., 1-adamantyl(meth)acrylate, tricyclodecanyl (meth)acrylate, and cyclohexyl(meth)acrylate are exemplified.

Acid-decomposable resin (A) in the invention can contain various kinds of repeating structural units, besides the above repeating structural units, for the purpose of the adjustments of dry etching resistance, aptitude for standard developing solutions, adhesion to a substrate, resist profile, and further, general requisite characteristics of resists, e.g., resolution, heat resistance and sensitivity.

As these repeating structural units, the repeating structural units corresponding to the monomers shown below can be exemplified, but the invention is not restricted thereto.

By containing such various repeating structural units, fine adjustment of performances required of acid-decomposable resin (A) becomes possible, in particular (1) solubility in a coating solvent, (2) a film-forming property (a glass transition temperature), (3) alkali developability, (4) decrease of layer thickness (hydrophobic-hydrophilic property, selection of an alkali-soluble group), (5) adhesion of an unexposed part to a substrate, and (6) dry etching resistance.

The examples of such monomers include compounds having one addition polymerizable unsaturated bond selected from acrylic esters, methacrylic esters, acrylamides, methacryl-amides, allyl compounds, vinyl ethers, vinyl esters, etc.

In addition to the aforementioned compounds, addition polymerizable unsaturated compounds copolymerizable with the monomers corresponding to the above various repeating structural units may be used for copolymerization.

In acid-decomposable resin (A), the molar ratio of the content of each repeating structural unit is arbitrarily set to adjust dry etching resistance and aptitude for standard developing solutions of a resist, adhesion to a substrate, and resist profile, further, general requisite characteristics of a resist, e.g., resolution, heat resistance and sensitivity.

As preferred embodiments of acid-decomposable resin (A) in the invention, the following resins are exemplified.

(1) A resin containing the repeating unit having the partial structure containing the alicyclic hydrocarbon represented by any of formulae (pI) to (pV) (a side chain type), preferably a resin containing a (meth)acrylate repeating unit having the structure of any of formulae (pI) to (pV);

(2) A resin containing the repeating unit represented by formula (II-AB) (a main chain type); and the following is further exemplified as embodiment (2):

(3) A resin containing the repeating unit represented by formula (II-AB), a maleic anhydride derivative and a (meth) acrylate structure (a hybrid type).

In acid-decomposable resin (A), the content of the repeating unit having an acid-decomposable group is preferably from 10 to 60 mol % in all the repeating structural units, more preferably from 20 to 50 mol %, and still more preferably from 25 to 40 mol %.

In acid-decomposable resin (A), the content of the repeating unit having the partial structure containing the alicyclic hydrocarbon represented by any of formulae (pI) to (pV) is preferably from 20 to 70 mol % in all the repeating structural units, more preferably from 20 to 50 mol %, and still more preferably from 25 to 40 mol %.

In acid-decomposable resin (A), the content of the repeating unit represented by formula (II-AB) is preferably from 10 to 60 mol % in all the repeating structural units, more preferably from 15 to 55 mol %, and still more preferably from 20 to 50 mol %.

In acid-decomposable resin (A), the content of the repeating unit having a lactone ring is preferably from 10 to 70 mol % in all the repeating structural units, more preferably from 20 to 60 mol %, and still more preferably from 25 to 40 mol %.

In acid-decomposable resin (A), the content of the repeating unit having an organic group having a polar group is preferably from 1 to 40 mol % in all the repeating structural units, more preferably from 5 to 30 mol %, and still more preferably from 5 to 20 mol %.

The content of the repeating structural units on the basis of the monomers of further copolymerization components in the resin can also be optionally set according to desired resist performances, and the content is generally preferably 99 mol % or less based on the total mol number of the repeating structural units having the partial structure containing the alicyclic hydrocarbon represented by any of formulae (pI) to (pV) and the repeating units represented by formula (II-AB), more preferably 90 mol % or less, and still more preferably 80 mol % or less.

When the positive resist composition in the invention is for ArF exposure, it is preferred that the resin does not have an aromatic group from the aspect of transparency to ArF rays.

Acid-decomposable resin (A) for use in the invention is preferably such that all the repeating units consist of (meth) acrylate repeating units. In this case, any of the following cases can be used, that is, a case where all the repeating units consist of methacrylate repeating units, a case where all the repeating units consist of acrylate repeating units, and a case where all the repeating units consist of mixture of methacrylate repeating units and acrylate repeating units, but it is preferred that acrylate repeating units account for 50 mol % or less of all the repeating units.

Acid-decomposable resin (A) is preferably a copolymer containing at least three kinds of repeating units of a (meth) acrylate repeating unit having a lactone ring, a (meth)acrylate repeating unit having an organic group substituted with at least either a hydroxyl group or a cyano group, and a (meth) acrylate repeating unit having an acid-decomposable group.

Acid-decomposable resin (A) is preferably a ternary copolymer comprising from 20 to 50 mol % of a repeating unit having the partial structure containing the alicyclic hydrocarbon represented by any of formulae (pI) to (pV), from 20 to 50 mol % of a repeating unit having a lactone structure, and from 5 to 30 mol % of a repeating unit having an alicyclic hydrocarbon structure substituted with a polar group, or a quaternary copolymer further containing from 0 to 20 mol % of other repeating units.

An especially preferred resin is a ternary copolymer containing from 20 to 50 mol % of a repeating unit having an acid-decomposable group represented by any of the following formulae (ARA-1) to (ARA-5), from 20 to 50 mol % of a repeating unit having a lactone group represented by any of the following formulae (ARL-1) to (ARL-6), and from 5 to 30 mol % of a repeating unit having an alicyclic hydrocarbon structure substituted with a polar group represented by any of the following formulae (ARH-1) to (ARH-3), or a quaternary copolymer further containing from 5 to 20 mol % of a repeating unit having a carboxyl group or a structure represented by formula (F1), and a repeating unit having an alicyclic hydrocarbon structure and not showing acid decomposability.

(In the following formulae, $Rxy_1$ represents a hydrogen atom or a methyl group, and $Rxa_1$ and $Rxb_1$ each represents a methyl group or an ethyl group.)

ARA-1

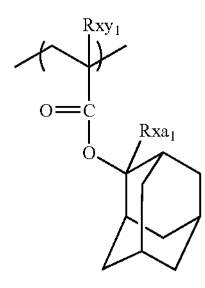

ARA-2

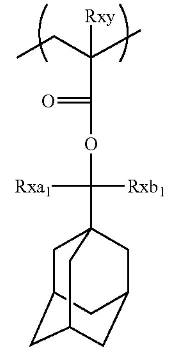

-continued
ARA-3
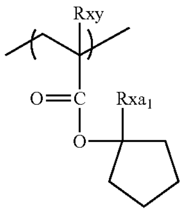
ARA-4
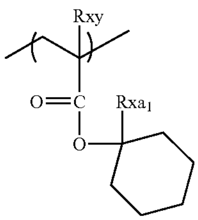
ARA-5
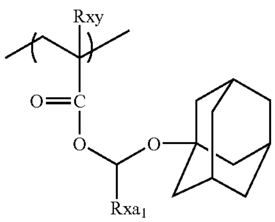
ARL-1
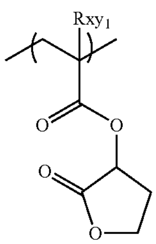
ARL-2
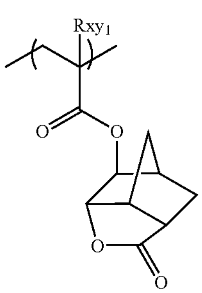
ARL-3
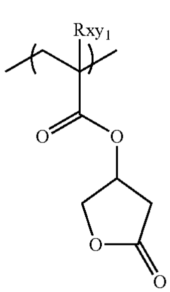
-continued
ARL-4
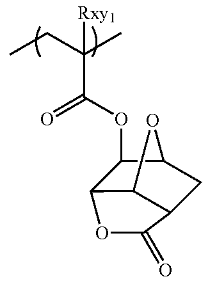
ARL-5
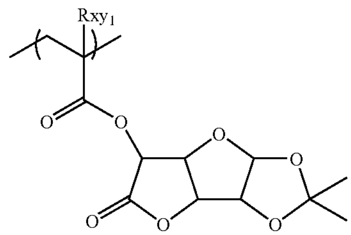
ARL-6
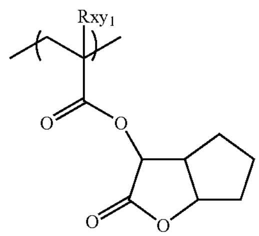
ARH-1
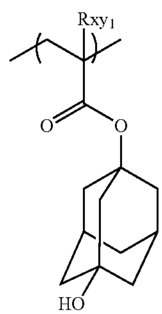
ARH-2
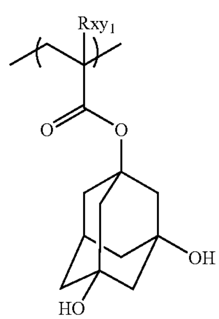
ARH-3
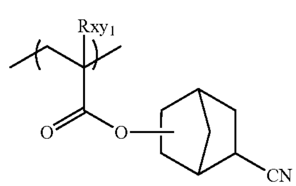
Acid-decomposable resin (A) for use in the invention can be synthesized according to ordinary methods (e.g., radical polymerization). For instance, as ordinary methods, a batch polymerization method of dissolving a monomer and an initiator in a solvent and heating the solution to perform polymerization, and a dropping polymerization method of adding a solution of a monomer and an initiator to a heated solvent over 1 to 10 hours by dropping are exemplified, and the dropping polymerization method is preferred. As reaction solvents, ethers, e.g., tetrahydrofuran, 1,4-dioxane, and diisopropyl ether, ketones, e.g., methyl ethyl ketone and methyl isobutyl ketone, ester solvents, e.g., ethyl acetate, amide solvents, e.g., dimethylformamide and dimethyacetamide, and the later-described solvents capable of dissolving the composition of the invention, e.g., propylene glycol monomethyl ether acetate, propylene glycol monomethyl ether, and cyclohexanone are exemplified. It is more preferred to use the same solvent in polymerization as the solvent used in the resist composition in the invention, by which the generation of particles during preservation can be restrained.

It is preferred to perform polymerization reaction in the atmosphere of inert gas such as nitrogen or argon. Polymerization is initiated with commercially available radical polymerization initiators (e.g., azo initiators, peroxide and the like). As radical polymerization initiators, azo initiators are preferred, and azo initiators having an ester group, a cyano group, or a carboxyl group are preferred. As preferred initiators, azobisisobutyronitrile, azobis-dimethylvaleronitrile, dimethyl-2,2'-azobis(2-methyl-propionate), etc., are exemplified. Initiators are added additionally or dividedly, if desired, and after termination of the reaction, the reaction product is put into a solvent and an objective polymer is recovered as powder or in a solid state. The concentration of the reaction product is from 5 to 50 mass %, and preferably from 10 to 30 mass %.

The reaction temperature is generally from 10 to 150° C., preferably from 30 to 120° C., and more preferably from 60 to 100° C.

The weight average molecular weight of resin (A) in the invention is preferably from 1,000 to 200,000 as the polystyrene equivalent by the GPC method, more preferably from 3,000 to 20,000, and most preferably from 5,000 to 15,000. By making the weight average molecular weight from 1,000 to 200,000, deteriorations of heat resistance and dry etching resistance can be prevented, and degradations of developing property and film-forming property due to viscosity becoming too high can be prevented.

The degree of dispersion (molecular weight distribution) of resin (A) is generally from 1 to 5, preferably from 1 to 3, more preferably from 1.2 to 3.0, and especially preferably from 1.2 to 2.0. The smaller the degree of dispersion, the more excellent is the resin in resolution and the resist form, and the more smooth is the sidewall of the resist pattern, and the more excellent is the roughness property.

In the positive resist composition of the invention, the compounding amount of all the resins concerning the invention in the composition at large is preferably from 50 to 99.9 mass % in all the solids content, and more preferably from 60 to 99.0 mass %.

In the invention, a resin can be used one kind alone, or two or more kinds of resins can be used in combination.

It is preferred that acid-decomposable resin (A) in the invention does not contain a fluorine atom and a silicon atom from the viewpoint of compatibility with resin (C).

(B) Compound Capable of Generating an Acid Upon Irradiation with Actinic Ray or Radiation:

The positive resist composition in the invention contains a compound capable of generating an acid upon irradiation with actinic ray or radiation (hereinafter also referred to as "a light-acid generator" or "component (B)").

As such light-acid generators, photoinitiators of photocationic polymerization, photoinitiators of photoradical polymerization, photo-decoloring agents and photo-discoloring agents of dyestuffs, and well-known compounds capable of generating an acid upon irradiation with actinic ray or radiation that are used in micro-resists, and the mixtures of these compounds can be optionally selected and used.

For example, diazonium salt, phosphonium salt, sulfonium salt, iodonium salt, imidosulfonate, oximesulfonate, diazodisulfone, disulfone, and o-nitrobenzylsulfonate are exemplified.

Further, compounds obtained by introducing a group or a compound capable of generating an acid upon irradiation with actinic ray or radiation into the main chain or side chain of polymers, for example, the compounds disclosed in U.S. Pat. No. 3,849,137, German Patent 3,914,407, JP-A-63-26653, JP-A-55-164824, JP-A-62-69263, JP-A-63-146038, JP-A-63-163452, JP-A-62-153853, JP-A-63-146029, etc., can be used.

The compounds generating an acid by the action of lights as disclosed in U.S. Pat. No. 3,779,778, EP 126,712, etc., can also be used.

Of the compounds capable of decomposing upon irradiation with actinic ray or radiation and generating an acid, the compounds represented by any of the following formulae (ZI), (ZII) and (ZIII) can be exemplified as preferred compounds.

ZI

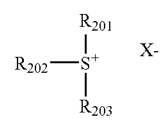

ZII

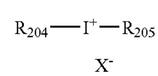

ZIII

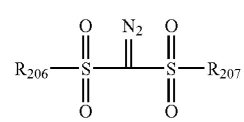

In formula (ZI), $R_{201}$, $R_{202}$ and $R_{203}$ each represents an organic group.

$X^-$ represents a non-nucleophilic anion, preferably a sulfonate anion, a carboxylate anion, a bis(alkylsulfonyl)-amide anion, a tris(alkylsulfonyl)methide anion, $BF_4^-$, $PF_6^-$, $SbF_6^-$, etc., are exemplified, and preferably an organic anion having a carbon atom.

As preferred organic anions, organic anions represented by the following formulae are exemplified.

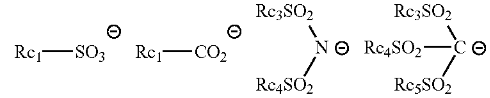

In the above formulae, $Rc_1$ represents an organic group.

As the organic group represented by $Rc_1$, an organic group having from 1 to 30 carbon atoms is exemplified, preferably an alkyl group, an aryl group, each of which groups may be substituted, or a group obtained by linking a plurality of these groups with a linking group such as a single bond, —O—, —$CO_2$—, —S—, —$SO_3$— or —$SO_2N(Rd_1)$— can be exemplified. $Rd_1$ represents a hydrogen atom or an alkyl group.

$Rc_3$, $Rc_4$ and $Rc_5$ each represents an organic group. As preferred organic groups represented by $Rc_3$, $Rc_4$ and $Rc_5$, the same organic groups as preferred organic groups in $Rc_1$ can be exemplified, and most preferably a perfluoroalkyl group having from 1 to 4 carbon atoms.

$Rc_3$ and $Rc_4$ may be bonded to each other to form a ring. As the group formed by bonding $Rc_3$ and $Rc_4$, an alkylene group and an arylene group are exemplified, and preferably a perfluoroalkylene group having from 2 to 4 carbon atoms is exemplified.

The especially preferred organic groups represented by $Rc_1$, $Rc_3$ to $Rc_5$ are an alkyl group substituted with a fluorine atom or a fluoroalkyl group on the 1-position, and a phenyl group substituted with a fluorine atom or a fluoroalkyl group. By the presence of a fluorine atom or a fluoroalkyl group, the acidity of the acid generated with light irradiation increases to enhance sensitivity. Further, by the formation of a ring by the bonding of $Rc_3$ and $Rc_4$, the acidity of the acid generated with light irradiation increases to improve sensitivity.

In formula (ZI), the number of carbon atoms of the organic groups represented by $R_{201}$, $R_{202}$ and $R_{203}$ is generally from 1 to 30, and preferably from 1 to 20.

Any two of $R_{201}$, $R_{202}$ and $R_{203}$ may be bonded to each other to form a cyclic structure, and an oxygen atom, a sulfur atom, an ester bond, an amido bond or a carbonyl group may be contained in the ring. As the group formed by any two of $R_{201}$, $R_{202}$ and $R_{203}$ by bonding, an alkylene group (e.g., a butylene group and a pentylene group) can be exemplified.

As the specific examples of the organic groups represented by $R_{201}$, $R_{202}$ and $R_{203}$, the corresponding groups in compounds (ZI-1), (ZI-2) and (ZI-3) described later can be exemplified.

The compound represented by formula (ZI) may be a compound having a plurality of structures represented by formula (ZI). For instance, compound (ZI) may be a compound having a structure that at least one of $R_{201}$, $R_{202}$ and $R_{203}$ of the compound represented by formula (ZI) is bonded to at least one of $R_{201}$, $R_{202}$ and $R_{203}$ of another compound represented by formula (ZI).

As further preferred component (ZI), the following compounds (ZI-1), (ZI-2) and (ZI-3) can be exemplified.

Compound (ZI-1) is an arylsulfonium compound represented by formula (ZI) in which at least one of $R_{201}$, $R_{202}$ and $R_{203}$ represents an aryl group, that is, a compound having arylsulfonium as the cation.

All of $R_{201}$, $R_{202}$ and $R_{203}$ of the arylsulfonium compound may be aryl groups, or a part of $R_{201}$, $R_{202}$ and $R_{203}$ may be an aryl group and the remainder may be an alkyl group or a cycloalkyl group.

As the arylsulfonium compound, e.g., a triarylsulfonium compound, a diarylalkylsulfonium compound, an aryldialkyl-sulfonium compound, a diarylcycloalkylsulfonium compound, and an aryldicycloalkylsulfonium compound can be exemplified.

As the aryl group of the arylsulfonium compound, an aryl group, e.g., a phenyl group and a naphthyl group, and a hetero-aryl group, e.g., an indole residue and a pyrrole residue are preferred, and a phenyl group and an indole residue are more preferred. When the arylsulfonium compound has two or more aryl groups, these two or more aryl groups may be the same or different.

The alkyl group incorporated into the arylsulfonium compound according to necessity is preferably a straight chain or branched alkyl group having from 1 to 15 carbon atoms, e.g., a methyl group, an ethyl group, a propyl group, an n-butyl group, a sec-butyl group, a t-butyl group, etc., can be exemplified.

The cycloalkyl group incorporated into the arylsulfonium compound according to necessity is preferably a cycloalkyl group having from 3 to 15 carbon atoms, e.g., a cyclopropyl group, a cyclobutyl group, a cyclohexyl group, etc., can be exemplified.

The aryl group, alkyl group and cycloalkyl group represented by $R_{201}$, $R_{202}$ and $R_{203}$ may have a substituent, e.g., an alkyl group (e.g., having from 1 to 15 carbon atoms), a cycloalkyl group (e.g., having from 3 to 15 carbon atoms), an aryl group (e.g., having from 6 to 14 carbon atoms), an alkoxyl group (e.g., having from 1 to 15 carbon atoms), a halogen atom, a hydroxyl group, and a phenylthio group are exemplified as the substituents. The preferred substituents are a straight chain or branched alkyl group having from 1 to 12 carbon atoms, a cycloalkyl group having from 3 to 12 carbon atoms, and a straight chain, branched, or cyclic alkoxyl group having from 1 to 12 carbon atoms, and the most preferred substituents are an alkyl group having from 1 to 4 carbon atoms, and an alkoxyl group having from 1 to 4 carbon atoms. The substituent may be substituted on any one of three of $R_{201}$, $R_{202}$ and $R_{203}$, or may be substituted on all of the three. When $R_{201}$, $R_{202}$ and $R_{203}$ each represents an aryl group, it is preferred that the substituent is substituted on the p-position of the aryl group.

Compound (ZI-2) is described below. Compound (ZI-2) is a compound in the case where $R_{201}$, $R_{202}$ and $R_{203}$ in formula (ZI) each represents an organic group not having an aromatic ring. The aromatic ring here also includes an aromatic ring containing a hetero atom.

The organic group not having an aromatic ring represented by $R_{201}$, $R_{202}$ and $R_{203}$ generally has from 1 to 30 carbon atoms, and preferably from 1 to 20 carbon atoms.

$R_{201}$, $R_{202}$ and $R_{203}$ each preferably represents an alkyl group, a cycloalkyl group, an allyl group, or a vinyl group, more preferably a straight chain, branched or cyclic 2-oxoalkyl group, or an alkoxycarbonylmethyl group, and most preferably a straight chain or branched 2-oxoalkyl group.

The alkyl group represented by $R_{201}$, $R_{202}$ and $R_{203}$ may be either straight chain or branched, preferably a straight chain or branched alkyl group having from 1 to 10 carbon atoms, e.g., a methyl group, an ethyl group, a propyl group, a butyl group, and a pentyl group can be exemplified. The alkyl group represented by $R_{201}$, $R_{202}$ and $R_{203}$ is preferably a straight chain or branched 2-oxoalkyl group or an alkoxycarbonylmethyl group.

The cycloalkyl group represented by $R_{201}$, $R_{202}$ and $R_{203}$ is preferably a cycloalkyl group having from 3 to 10 carbon atoms, e.g., a cyclopentyl group, a cyclohexyl group, and a norbonyl group can be exemplified. The cycloalkyl group represented by $R_{201}$, $R_{202}$ and $R_{203}$ is preferably a cyclic 2-oxoalkyl group.

The straight chain, branched or cyclic 2-oxoalkyl group represented by $R_{201}$, $R_{202}$ and $R_{203}$ is preferably a group having >C=O on the 2-position of the above alkyl group and cycloalkyl group.

As the alkoxyl group in the alkoxycarbonylmethyl group represented by $R_{201}$, $R_{202}$ and $R_{203}$, preferably an alkoxyl group having from 1 to 5 carbon atoms, e.g., a methoxy group, an ethoxy group, a propoxy group, a butoxy group, and a pentoxy group can be exemplified.

$R_{201}$, $R_{202}$ and $R_{203}$ may further be substituted with a halogen atom, an alkoxyl group (e.g., having from 1 to 5 carbon atoms), a hydroxyl group, a cyano group, or a nitro group.

Compound (ZI-3) is a compound represented by the following formula (ZI-3) and has a phenacylsulfonium salt structure.

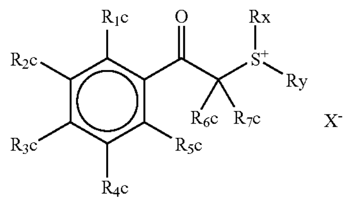
(ZI-3)

In formula (ZI-3), $R_{1c}$, $R_{2c}$, $R_{3c}$, $R_{4c}$ and $R_{5c}$ each represents a hydrogen atom, an alkyl group, a cycloalkyl group, an alkoxyl group, or a halogen atom.

$R_{6c}$ and $R_{7c}$ each represents a hydrogen atom, an alkyl group or a cycloalkyl group.

$R_x$ and $R_y$ each represents an alkyl group, a cycloalkyl group, an allyl group, or a vinyl group.

Any two or more of $R_{1c}$ to $R_{7c}$, and $R_x$ and $R_y$ may be bonded to each other to form cyclic structures, respectively, and the cyclic structures may contain an oxygen atom, a sulfur atom, an ester bond, or an amido bond. As the groups formed by any two or more of $R_{1c}$ to $R_{7c}$ and $R_x$ and $R_y$, by bonding, a butylene group, a pentylene group, etc., can be exemplified.

$X^-$ represents a non-nucleophilic anion, and the same anion as the non-nucleophilic anion represented by $X^-$ in formula (ZI) can be exemplified.

The alkyl group represented by $R_{1c}$ to $R_{7c}$ may be either straight chain or branched, e.g., a straight chain or branched alkyl group having from 1 to 20 carbon atoms, preferably a straight chain or branched alkyl group having from 1 to 12 carbon atoms, e.g., a methyl group, an ethyl group, a straight chain or branched propyl group, a straight chain or branched butyl group, and a straight chain or branched pentyl group can be exemplified.

As the cycloalkyl group represented by $R_{1c}$ to $R_{7c}$ preferably a cycloalkyl group having from 3 to 8 carbon atoms, e.g., a cyclopentyl group and a cyclohexyl group can be exemplified.

The alkoxyl group represented by $R_{1c}$ to $R_{5c}$ may be any of straight chain, branched, or cyclic, e.g., an alkoxyl group having from 1 to 10 carbon atoms, preferably a straight chain or branched alkoxyl group having from 1 to 5 carbon atoms (e.g., a methoxy group, an ethoxy group, a straight chain or branched propoxy group, a straight chain or branched butoxy group, and a straight chain or branched pentoxy group), a cyclic alkoxyl group having from 3 to 8 carbon atoms (e.g., a cyclopentyloxy group, and a cyclohexyloxy group) can be exemplified.

It is preferred that any of $R_{1c}$ to $R_{5c}$ represents a straight chain or branched alkyl group, a cycloalkyl group, or a straight chain, branched, or cyclic alkoxyl group, and more preferably the sum total of the carbon atoms of $R_{1c}$ to $R_{5c}$ is from 2 to 15, by which the solubility in a solvent is bettered and the generation of particles during preservation can be restrained.

As the alkyl group represented by $R_x$ and $R_y$, the same alkyl groups as represented by $R_{1c}$ to $R_{7c}$ can be exemplified. The alkyl group represented by $R_x$ and $R_y$ is preferably a straight chain or branched 2-oxoalkyl group or an alkoxycarbonylmethyl group.

As the cycloalkyl group represented by $R_x$ and $R_y$, the same cycloalkyl groups as represented by $R_{1c}$ to $R_{7c}$ can be exemplified. The cycloalkyl group represented by $R_x$ and $R_y$ is preferably a cyclic 2-oxoalkyl group.

As the straight chain, branched, or cyclic 2-oxoalkyl group, a group having >C=O on the 2-position of the alkyl group or the cycloalkyl group represented by $R_{1c}$ to $R_{7c}$ can be exemplified.

As the alkoxyl group in the alkoxycarbonylmethyl group, the same alkoxyl groups as represented by $R_{1c}$ to $R_{5c}$ can be exemplified.

$R_x$ and $R_y$ each preferably represents an alkyl group having 4 or more carbon atoms, more preferably 6 or more carbon atoms, and still more preferably an alkyl group having 8 or more carbon atoms.

In formulae (ZII) and (ZIII), $R_{204}$, $R_{205}$, $R_{206}$ and $R_{207}$ each represents an aryl group, an alkyl group, or a cycloalkyl group.

The aryl group represented by $R_{204}$ to $R_{207}$ is preferably a phenyl group or a naphthyl group, and more preferably a phenyl group.

The alkyl group represented by $R_{204}$ to $R_{207}$ may be either straight chain or branched, and preferably a straight chain or branched alkyl group having from 1 to 10 carbon atoms, e.g., a methyl group, an ethyl group, a propyl group, a butyl group, and a pentyl group can be exemplified.

The cycloalkyl group represented by $R_{204}$ to $R_{207}$ is preferably a cycloalkyl group having from 3 to 10 carbon atoms, e.g., a cyclopentyl group, a cyclohexyl group, and a norbonyl group can be exemplified.

$R_{204}$ to $R_{207}$ may each have a substituent. As the examples of the substituents that $R_{204}$ to $R_{207}$ may have, e.g., an alkyl group (e.g., having from 1 to 15 carbon atoms), a cycloalkyl group (e.g., having from 3 to 15 carbon atoms), an aryl group (e.g., having from 6 to 15 carbon atoms), an alkoxyl group (e.g., having from 1 to 15 carbon atoms), a halogen atom, a hydroxyl group, a phenylthio group, etc., can be exemplified.

$X^-$ represents a non-nucleophilic anion, and the same anion as the non-nucleophilic anion represented by $X^-$ in formula (ZI) can be exemplified.

Of the compounds capable of generating an acid upon irradiation with actinic ray or radiation, compounds represented by any of the following formula (ZIV), (ZV) or (ZVI) can further be exemplified as preferred compounds.

$$Ar_3—SO_2—SO_2—Ar_4 \quad \text{ZIV}$$

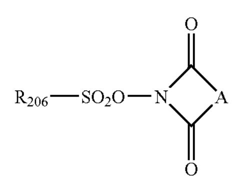
ZV

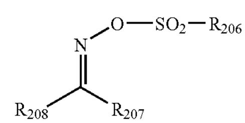
ZVI

In formulae (ZIV) to (ZVI), $Ar_3$ and $Ar_4$ each represents an aryl group.

$R_{206}$ represents an alkyl group or an aryl group.

$R_{207}$ and $R_{208}$ each represents an alkyl group, an aryl group, or an electron attractive group. $R_{207}$ preferably represents an aryl group.

$R_{208}$ preferably represents an electron attractive group, and more preferably a cyano group or a fluoroalkyl group.

A represents an alkylene group, an alkenylene group, or an arylene group.

As the compound capable of generating an acid upon irradiation with actinic ray or radiation, the compounds represented by any of formulae (ZI), (ZII) and (ZIII) are preferred.

Compound (B) is preferably a compound capable of generating an aliphatic sulfonic acid having a fluorine atom or a benzenesulfonic acid having a fluorine atom upon irradiation with actinic ray or radiation.

Compound (B) preferably has a triphenylsulfonium structure.

Compound (B) is preferably a triphenylsulfonium salt compound having an alkyl group or cycloalkyl group not substituted with a fluorine atom at the cationic portion.

Of the compounds capable of generating an acid upon irradiation with actinic ray or radiation, particularly preferred examples are shown below.

(z1)

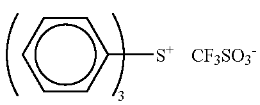

(z2)

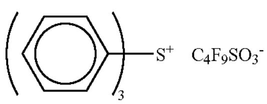

(z3)

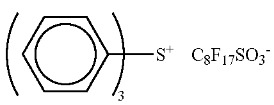

(z4)

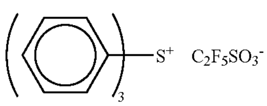

(z5)

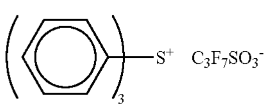

(z6)

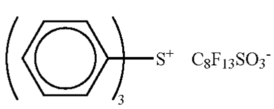

(z7)

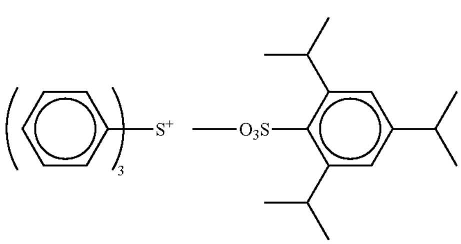

(z8)

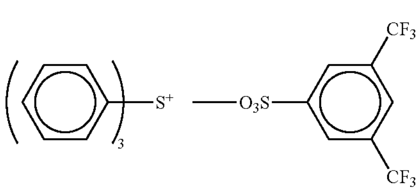

-continued (z9)

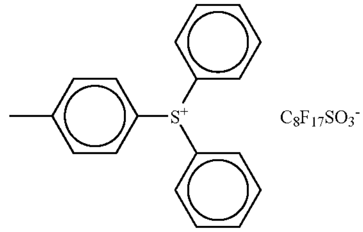

(z10)

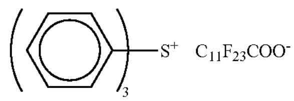

(z11)

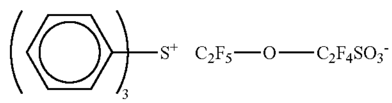

(z12)

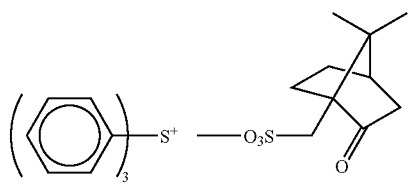

(z13)

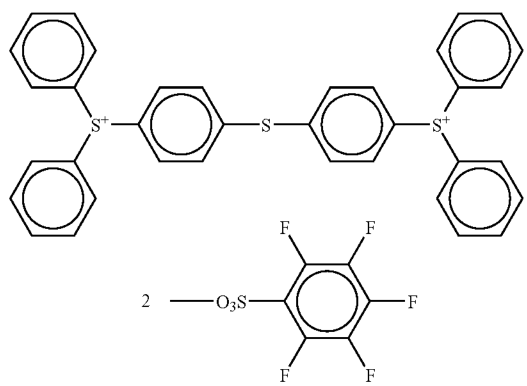

(z14)

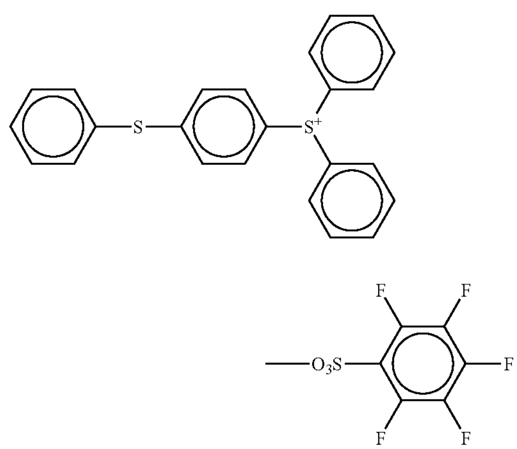

(z15)

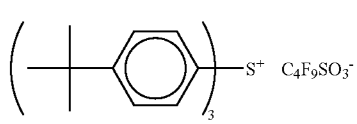

-continued
(z16)
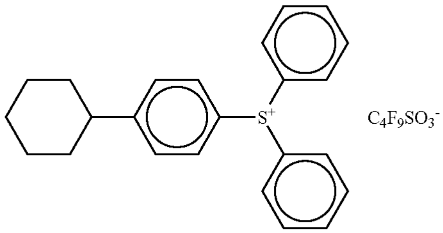
(z17)
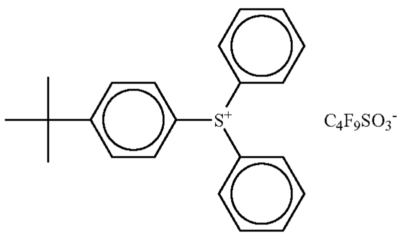
(z18)
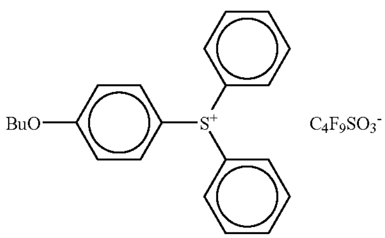
(z19)
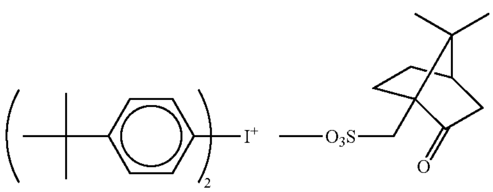
(z20)
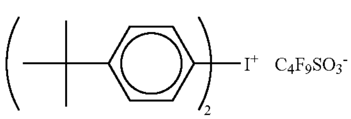
(z21)
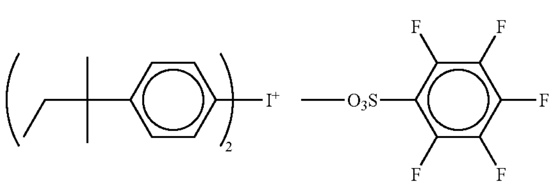
(z22)
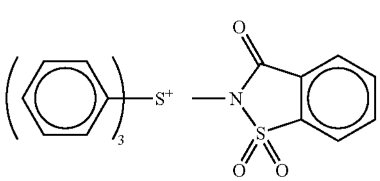
-continued
(z23)
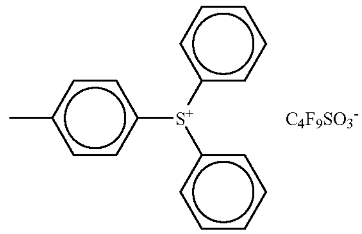
(z24)
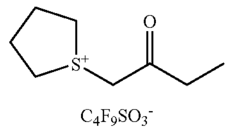
(z25)
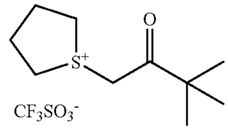
(z26)
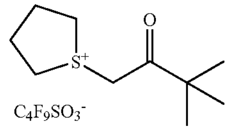
(z27)
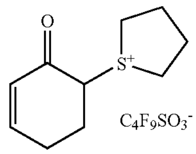
(z28)
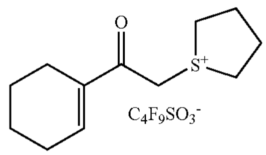
(z29)
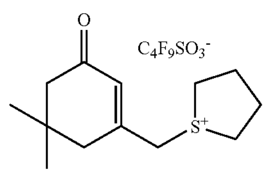
(z30)
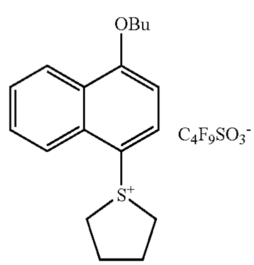
(z31)
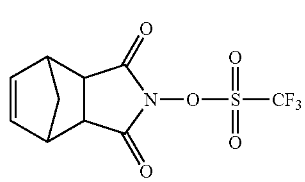

-continued
(z32)
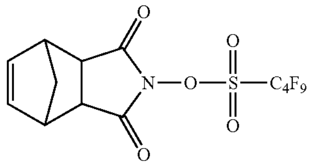
(z33)
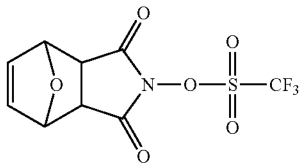
(z34)
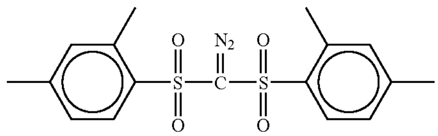
(z35)
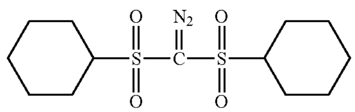
(z36)
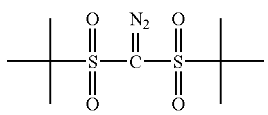
(z37)
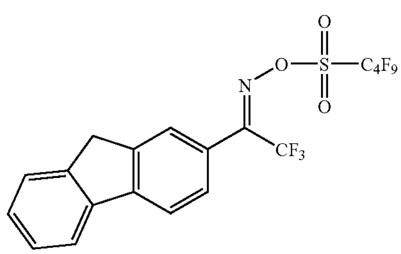
(z38)
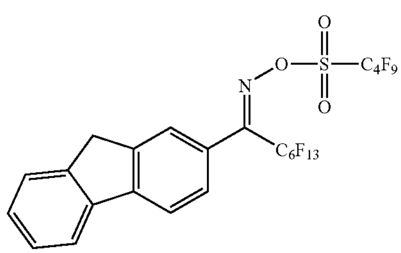
(z39)
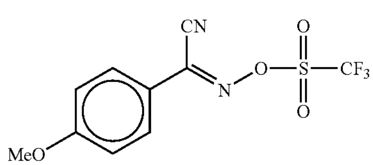
(z40)
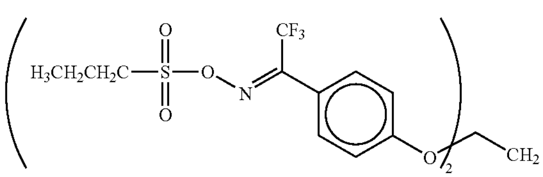
-continued
(z41)
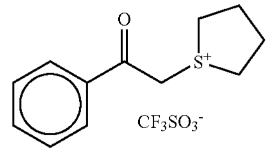
(z42)
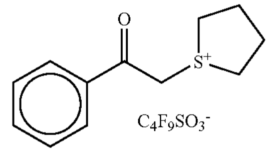
(z43)
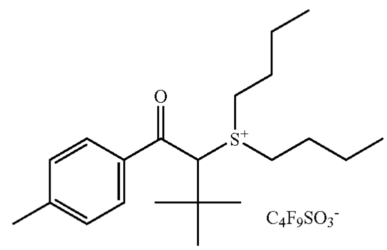
(z44)
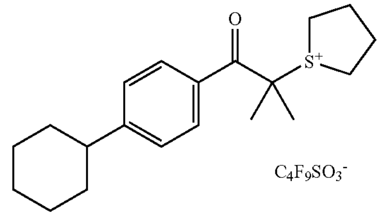
(z45)
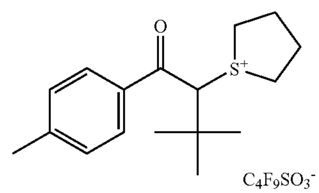
(z46)
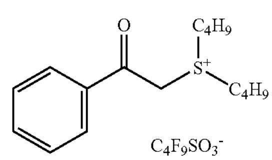
(z47)
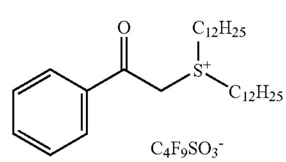
(z48)
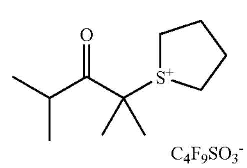

(z49)
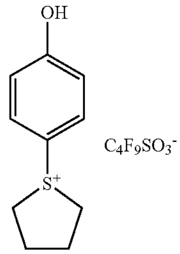
(z50)
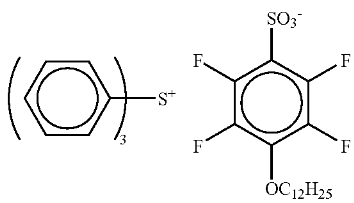
(z51)
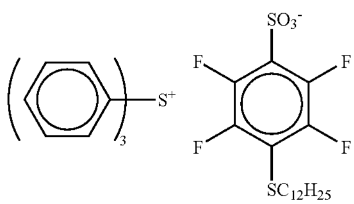
(z52)
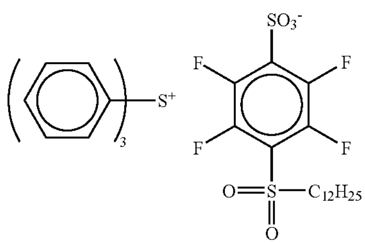
(z53)
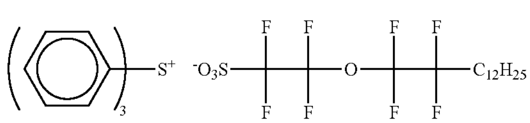
(z54)
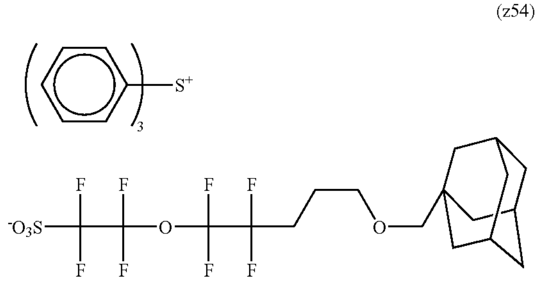
(z55)
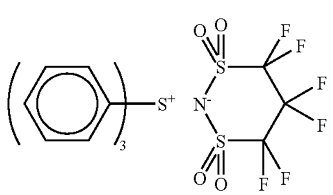
(z56)
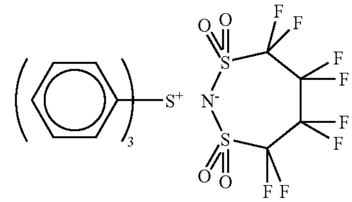
(z57)
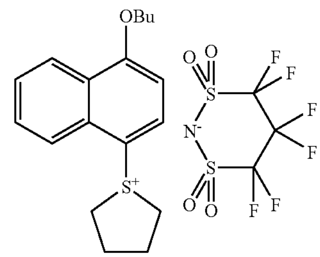
(z58)
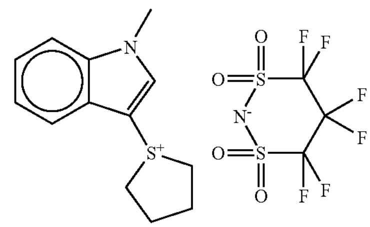
(z59)
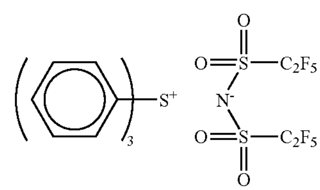
(z60)
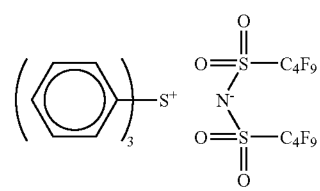
(z61)
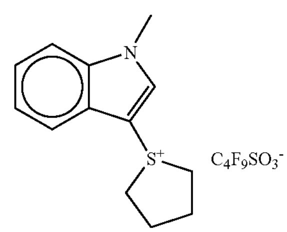
(z62)
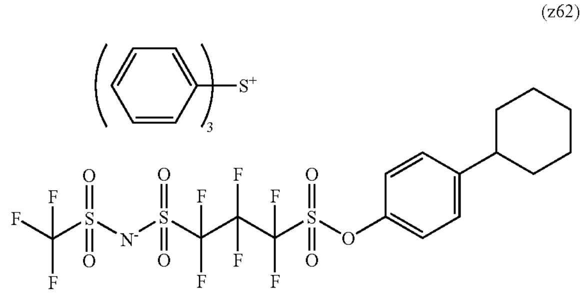

-continued
(z63)
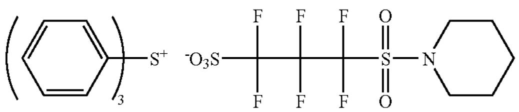
(z64)
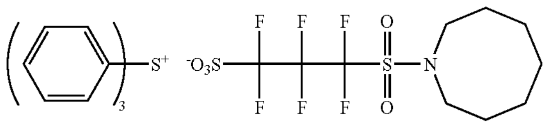
(z65)
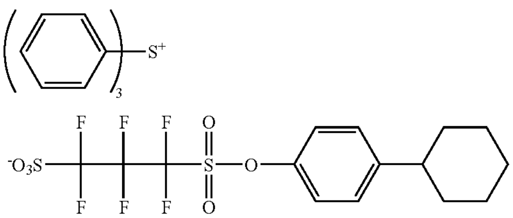
(z66)
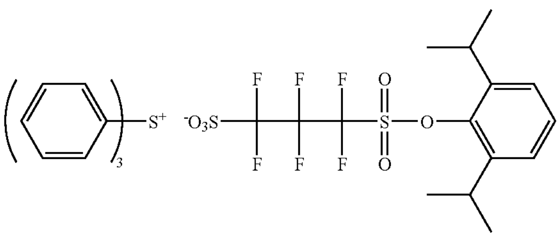
(z67)
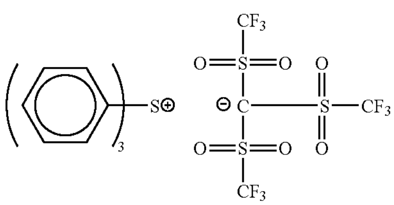
(z68)
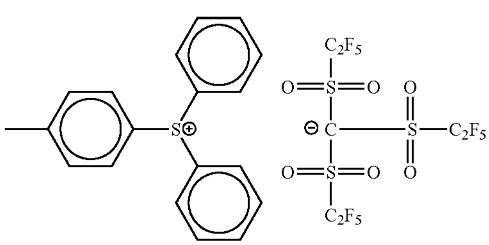
(z69)
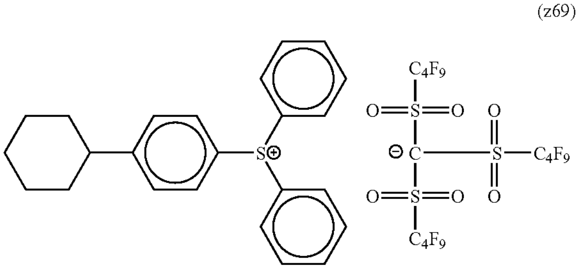
-continued
(z70)
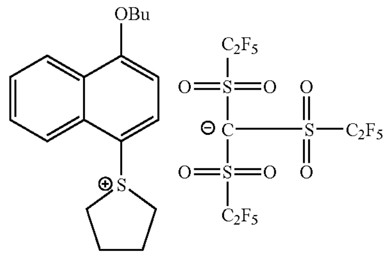
(z71)
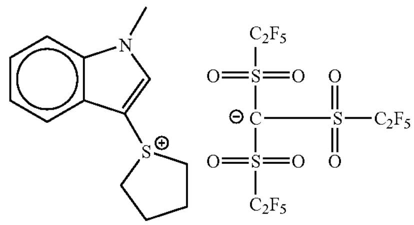
(z72)
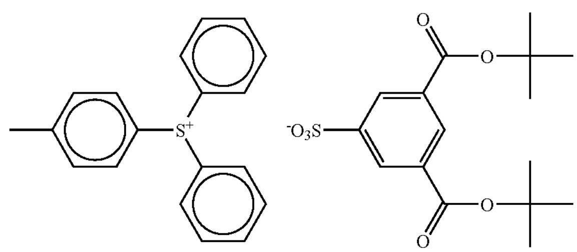
(z73)
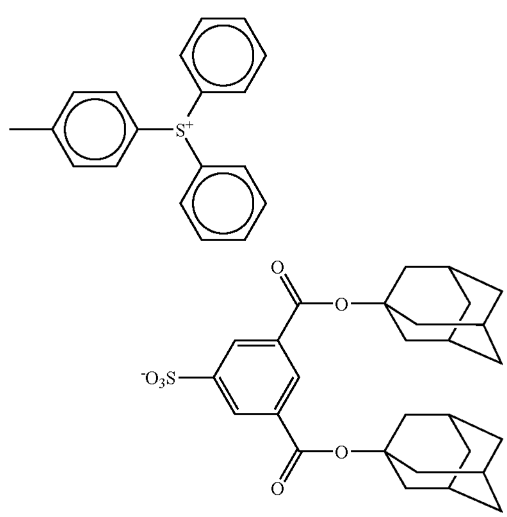

-continued (z74)

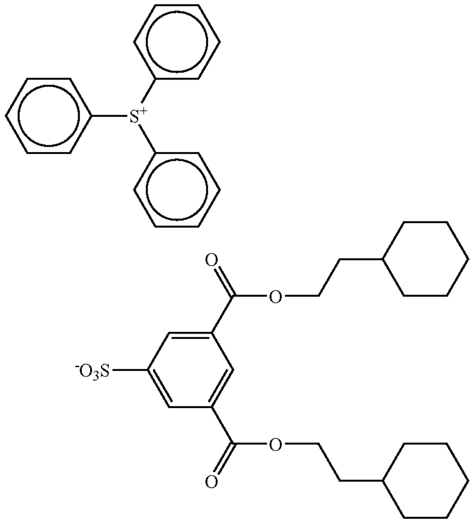

(z75)

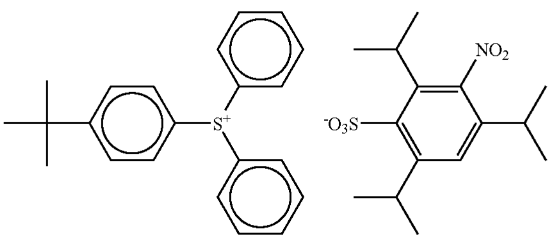

(z76)

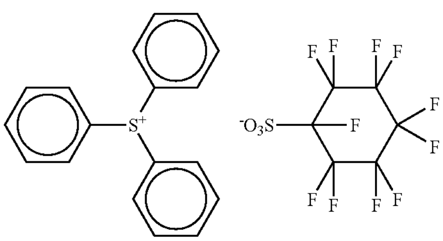

(z77)

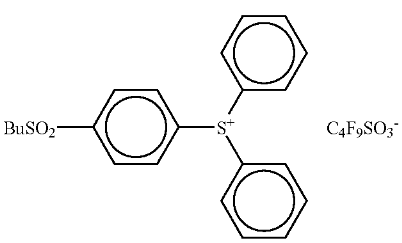

Light-acid generators can be used one kind alone, or two or more kinds can be used in combination. When two or more compounds are used in combination, it is preferred to combine compounds capable of generating two kinds of organic acids in which the total atom number exclusive of a hydrogen atom differs by 2 or more.

The content of the light-acid generators is preferably from 0.1 to 20 mass % based on all the solids content of the positive resist composition, more preferably from 0.5 to 10 mass %, and still more preferably from 1 to 7 mass %.

(C) Resin Having at Least Either a Fluorine Atom or a Silicon Atom:

The positive resist composition in the invention contains resin (C) having at least either a fluorine atom or a silicon atom.

The fluorine atom or silicon atom in Resin (C) may be introduced into the main chain of the resin or may be substituted on the side chain.

As the partial structure having a fluorine atom, resin (C) is preferably a resin having an alkyl group having a fluorine atom, a cycloalkyl group having a fluorine atom, or an aryl group having a fluorine atom.

The alkyl group (preferably having from 1 to 10 carbon atoms, and more preferably from 1 to 4 carbon atoms) having a fluorine atom is a straight chain or branched alkyl group in which at least one hydrogen atom is substituted with a fluorine atom, which group may further have other substituents.

The cycloalkyl group having a fluorine atom is a monocyclic or polycyclic cycloalkyl group in which at least one hydrogen atom is substituted with a fluorine atom, which group may further have other substituents.

As the aryl group having a fluorine atom, aryl groups such as a phenyl group and a naphthyl group in which at least one hydrogen atom is substituted with a fluorine atom are exemplified, which groups may further have other substituents.

The specific examples of the alkyl group having a fluorine atom, the cycloalkyl group having a fluorine atom, and the aryl group having a fluorine atom are shown below, but the invention is not restricted to these examples.

(F2)

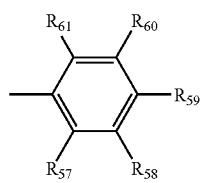

(F3)

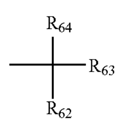

(F4)

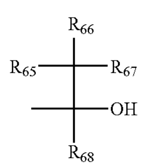

In formulae (F2) to (F4), $R_{57}$ to $R_{68}$ each represents a hydrogen atom, a fluorine atom, or an alkyl group. However, at least one of $R_{57}$ to $R_{61}$, $R_{62}$ to $R_{64}$, and $R_{65}$ to $R_{68}$, each represents a fluorine atom, or an alkyl group (preferably having from 1 to 4 carbon atoms) in which at least one hydrogen atom is substituted with a fluorine atom. It is preferred that all of $R_{57}$ to $R_{61}$ and $R_{65}$ to $R_{67}$ represent a fluorine atom. $R_{62}$, $R_{63}$ and $R_{68}$ each preferably represents an alkyl group (preferably having from 1 to 4 carbon atoms) in which at least one hydrogen atom is substituted with a fluorine atom, and more preferably a perfluoroalkyl group having from 1 to 4 carbon atoms. $R_{62}$ and $R_{63}$ may be linked to each other to form a ring.

As the specific examples of the groups represented by formula (F2), a p-fluorophenyl group, a pentafluorophenyl group, a 3,5-di(trifluoromethyl)phenyl group, etc., are exemplified.

The specific examples of the groups represented by formula (F3) include a trifluoroethyl group, a pentafluoro-propyl group, a pentafluoroethyl group, a heptafluorobutyl group, a hexafluoroisopropyl group, a heptafluoroisopropyl group, a hexafluoro(2-methyl)isopropyl group, a nonafluoro-butyl group, an octafluoroisobutyl group, a nonafluorohexyl group, a nonafluoro-t-butyl group, a perfluoroisopentyl group, a perfluorooctyl group, a perfluoro(trimethyl)hexyl group, a 2,2,3,3-tetrafluorocyclobutyl group, a perfluorocyclohexyl group and the like. A hexafluoroisopropyl group, a heptafluoroisopropyl group, a hexafluoro(2-methyl)isopropyl group, an octafluoroisobutyl group, a nonafluoro-t-butyl group, and a perfluoroisopentyl group are preferred, and a hexafluoroisopropyl group and a heptafluoroisopropyl group are more preferred.

As the specific examples of the groups represented by formula (F4), $-C(CF_3)_2OH$, $-C(C_2F_5)_2OH$, $-C(CF_3)(CH_3)OH$, $-CH(CF_3)OH$, etc., are exemplified, and $-C(CF_3)_2OH$ is preferred.

It is preferred for resin (C) to have a group represented by formula (F3).

It is more preferred for the repeating unit constituting resin (C) to contain an acrylate or methacrylate repeating unit having a group represented by formula (F3).

In addition to the repeating unit having a group represented by formula (F3), it is more preferred for resin (C) to have at least one kind of a repeating unit selected from the repeating units represented by the following formulae (C-I) and (C-II) as a copolymer component:

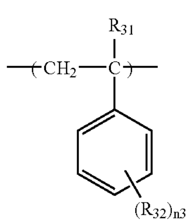

(C-I)

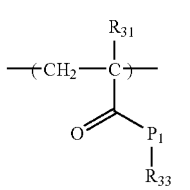

(C-II)

In formulae (C-I) and (C-II), $R_{31}$ each independently represents a hydrogen atom or a methyl group; $R_{32}$ represents a hydrocarbon group; $R_{33}$ represents a cyclic hydrocarbon group; $P_1$ represents a linking group selected from —O—, —NR— (where R represents a hydrogen atom or alkyl), and $-NHSO_2-$; and n3 represents an integer of from 0 to 4.

These repeating units may be used by one kind alone, or a plurality of repeating units may be used in combination.

As the hydrocarbon groups represented by $R_{32}$ in formula (C-I), an alkyl group, an alkyloxy group, an alkyl-substituted cycloalkyl group, an alkenyl group, an alkyl-substituted alkenyl group, an alkyl-substituted cycloalkenyl group, an alkyl-substituted aryl group, and an alkyl-substituted aralkyl group are exemplified, and of these groups, an alkyl group and an alkyl-substituted cycloalkyl group are preferred.

As the alkyl group represented by $R_{32}$, a branched alkyl group having from 1 to 20 carbon atoms is preferred. Specifically, as preferred alkyl groups, a methyl group, an ethyl group, a propyl group, a butyl group, a pentyl group, a hexyl group, a heptyl group, an octyl group, a nonyl group, an isopropyl group, an isobutyl group, a t-butyl group, a 3-pentyl group, a 2-methyl-3-butyl group, a 3-hexyl group, a 2-methyl-3-pentyl group, a 3-methyl-4-hexyl group, a 3,5-dimethyl-4-pentyl group, an isooctyl group, a 2,4,4-trimethylpentyl group, a 2-ethylhexyl group, a 2,6-dimethylheptyl group, a 1,5-dimethyl-3-heptyl group, a 2,3,5,7-tetramethyl-4-heptyl group, etc., are exemplified. More preferably, an isobutyl group, a t-butyl group, a 2-methyl-3-butyl group, a 2-methyl-3-pentyl group, a 3-methyl-4-hexyl group, a 3,5-dimethyl-4-pentyl group, a 2,4,4-trimethylpentyl group, a 2-ethylhexyl group, a 2,6-dimethylheptyl group, a 1,5-dimethyl-3-heptyl group, a 2,3,5,7-tetramethyl-4-heptyl group are exemplified.

As the alkyloxy group represented by $R_{32}$, a group obtained by bonding an ether group to an alkyl group can be exemplified.

The cycloalkyl group represented by $R_{32}$ may be monocyclic or polycyclic. Specifically, a group having a monocyclic, bicyclic, tricyclic, or tetracyclic structure having 5 or more carbon atoms can be exemplified. The carbon atom number is preferably from 6 to 30, and especially preferably from 7 to 25. The examples of preferred cycloalkyl groups include an adamantyl group, a noradamantyl group, a decalin residue, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group, and a cyclododecanyl group. More preferred cycloalkyl groups are an adamantyl group, a norbornyl group, a cyclohexyl group, a cyclopentyl group, a tetracyclododecanyl group a, and a tricyclodecanyl group. Still more preferred groups are a norbornyl group, a cyclopentyl group and a cyclohexyl group.

As the alkenyl group represented by $R_{32}$, a straight chain or branched alkenyl group having from 1 to 20 carbon atoms is preferred, and a branched alkenyl group is more preferred.

As the aryl group represented by $R_{32}$, an aryl group having from 6 to 20 carbon atoms is preferred, for example, a phenyl group and a naphthyl group can be exemplified, and a phenyl group is preferred.

As the aralkyl group represented by $R_{32}$, an aralkyl group having from 7 to 12 carbon atoms is preferred, for example, a benzyl group, a phenethyl group, and a naphthylmethyl group can be exemplified.

n3 is preferably an integer of from 1 to 4, and more preferably 1 or 2.

The preferred specific examples of the repeating units represented by formula (C-I) are shown below, but the invention is not restricted thereto.

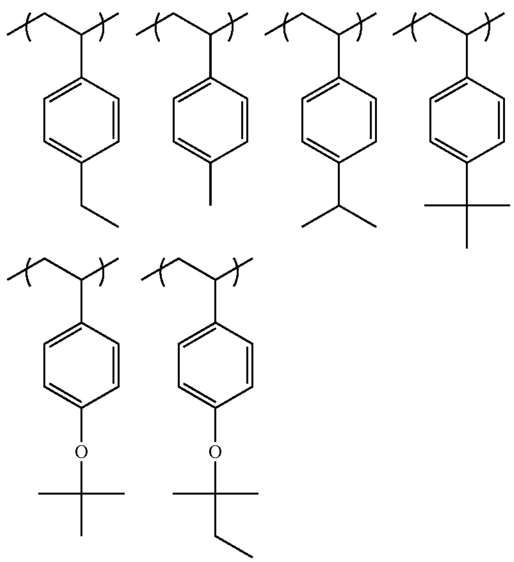

As the cyclic hydrocarbon groups represented by $R_{33}$ in formula (C-II), a cycloalkyl group, an alkyl-substituted cycloalkyl group, a cycloalkenyl group, an alkyl-substituted cycloalkenyl group, an aryl group, and an alkyl-substituted cycloaryl group are exemplified, and a cycloalkyl group and an alkyl-substituted cycloalkyl group are preferred.

The cyclic hydrocarbon group may be monocyclic or polycyclic. Specifically, a group having a monocyclic, bicyclic, tricyclic, or tetracyclic structure having 5 or more carbon atoms can be exemplified. The carbon atom number is preferably from 6 to 30, and especially preferably from 7 to 25. The examples of preferred cycloalkyl groups include an adamantyl group, a noradamantyl group, a decalin residue, a tricyclodecanyl group, a tetracyclododecanyl group, a norbornyl group, a cedrol group, a cyclopentyl group, a cyclohexyl group, a cycloheptyl group, a cyclooctyl group, a cyclodecanyl group, and a cyclododecanyl group. More preferred cycloalkyl groups are an adamantyl group, a norbornyl group, a cyclohexyl group, a cyclopentyl group, a tetracyclododecanyl group, and a tricyclodecanyl group. Still more preferred groups are a norbornyl group, a cyclopentyl group, and a cyclohexyl group.

The aryl group represented by $R_{33}$ is preferably an aryl group having from 6 to 20 carbon atoms, for example, a phenyl group and a naphthyl group can be exemplified, and a phenyl group is preferred.

It is preferred for $R_{33}$ in formula (C-II) to have at least two partial structures of —$CH_3$.

In formula (C-II), when $P_1$ represents an oxygen atom, the carbon atom directly bonded to the oxygen atom is preferably secondary or tertiary carbon atom.

The preferred specific examples of the repeating units represented by formula (C-II) are shown below. However, the invention is not restricted to these compounds. In the specific examples, Rx represents a hydrogen atom or a methyl group, Rxa and Rxb each represents an alkyl group having from 1 to 4 carbon atoms.

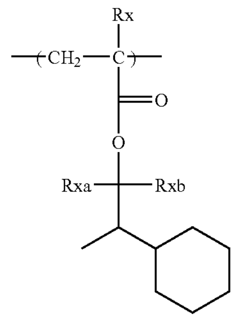

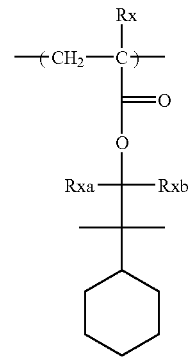

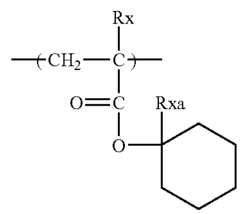

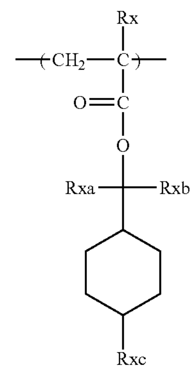

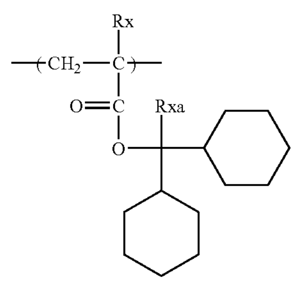

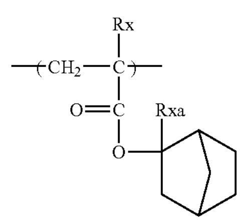

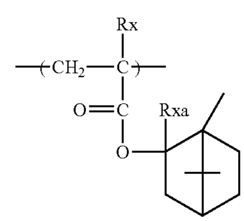

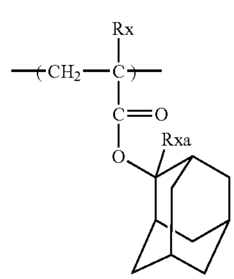

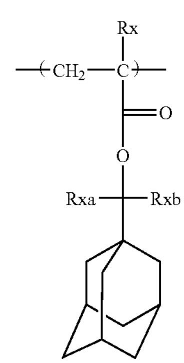

-continued

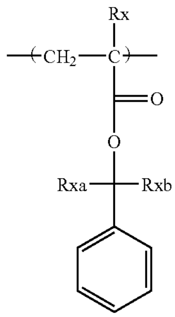

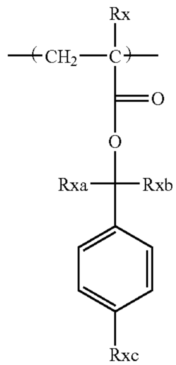

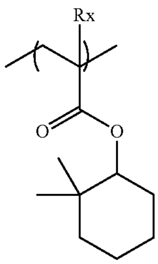

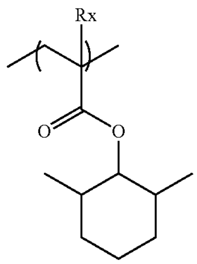

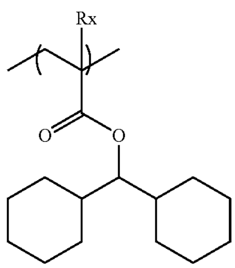

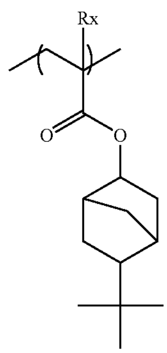

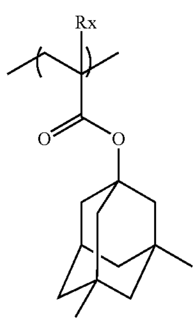

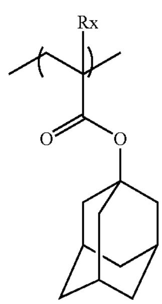

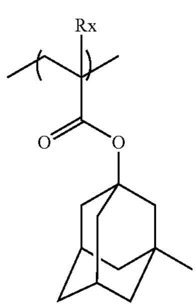

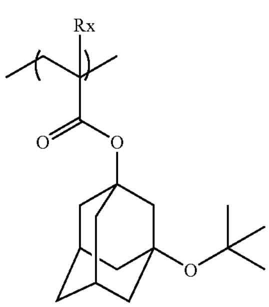

-continued

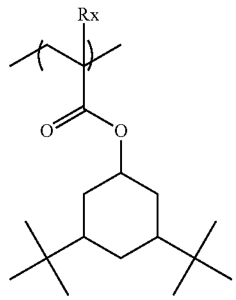

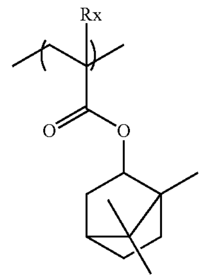

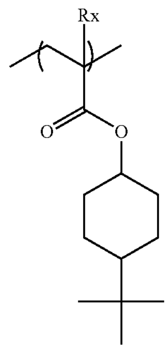

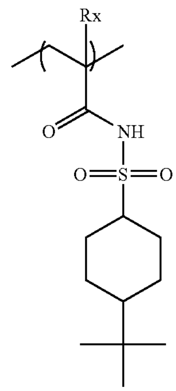

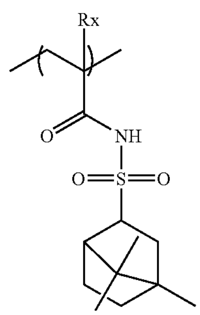

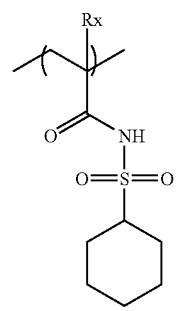

As the partial structure having a silicon atom, resin (C) is preferably a resin having an alkylsilyl structure (preferably a trialkylsilyl group) or a cyclic siloxane structure.

As the specific examples of the alkylsilyl structure and the cyclic siloxane structure, the groups represented by any of the following formulae (CS-1) to (CS-3) are exemplified.

(CS-1)

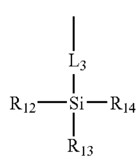

(CS-2)

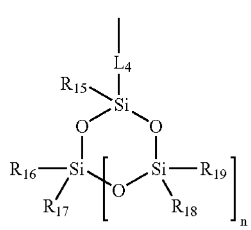

-continued (CS-3)

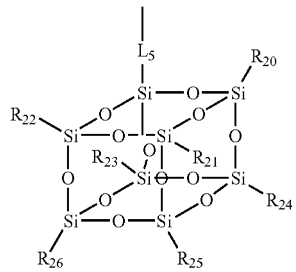

In formulae (CS-1) to (CS-3), $R_{12}$ to $R_{26}$ each represents a straight chain or branched alkyl group (preferably having from 1 to 20 carbon atoms) or a cycloalkyl group (preferably having from 3 to 20 carbon atoms).

$L_3$ to $L_5$ each represents a single bond or a divalent linking group. As the examples of the divalent linking groups, a single group or a combination of two or more groups selected from the group consisting of an alkylene group, a phenyl group, an ether group, a thioether group, a carbonyl group, an ester group, an amido group, a urethane group, and a urea group are exemplified. n represents an integer of from 1 to 5.

Resin (C) is preferably a resin having at least a repeating unit selected from the group of the repeating units represented by any of the following formulae (C-I) to (C-IV).

(C-I)

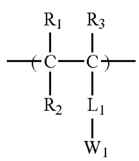

(C-II)

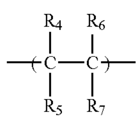

(C-III)

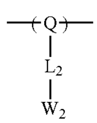

(C-IV)

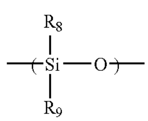

In formulae (C-I) to (C-IV), $R_1$, $R_2$ and $R_3$ each represents a hydrogen atom, a fluorine atom, a straight chain or branched alkyl group having from 1 to 4 carbon atoms, or a straight chain or branched fluoroalkyl group having from 1 to 4 carbon atoms.

$W_1$ and $W_2$ each represents an organic group having at least either a fluorine atom or a silicon atom.

$R_4$ to $R_7$ each represents a hydrogen atom, a fluorine atom, a straight chain or branched alkyl group having from 1 to 4 carbon atoms, or a straight chain or branched fluoroalkyl group having from 1 to 4 carbon atoms. However, at least one of $R_4$ to $R_7$ represents a fluorine atom. $R_4$ and $R_5$, or $R_6$ and $R_7$, may be bonded to form a ring.

$R_8$ represents a hydrogen atom or a straight chain or branched alkyl group having from 1 to 4 carbon atoms.

$R_9$ represents a straight chain or branched alkyl group having from 1 to 4 carbon atoms or a straight chain or branched fluoroalkyl group having from 1 to 4 carbon atoms.

$L_1$ and $L_2$ each represents a single bond or a divalent linking group, the content of which is the same as in $L_3$ to $L_5$.

Q represents a monocyclic or polycyclic aliphatic group. That is, Q contains bonded two carbon atoms (C—C) and represents an atomic group to form an alicyclic structure.

Formula (C-I) is more preferably represented by any of the following formulae (C-Ia)

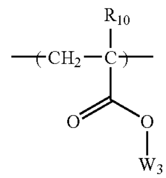

(C-Ib)

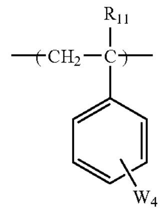

(C-Ic)

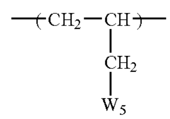

(C-Id)

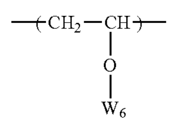

In formulae (C-Ia) to (C-Id), $R_{10}$ and $R_{11}$ each represents a hydrogen atom, a fluorine atom, a straight chain or branched alkyl group having from 1 to 4 carbon atoms, or a straight chain or branched fluoroalkyl group having from 1 to 4 carbon atoms.

$W_3$ to $W_6$ each represents an organic group having at least either a fluorine atom or a silicon atom.

When $W_1$ to $W_6$ each represents an organic group having a fluorine atom, the organic group is preferably a fluorinated, straight chain or branched alkyl group or cycloalkyl group having from 1 to 20 carbon atoms, or a fluorinated, straight chain, branched, or cyclic alkyl ether group having from 1 to 20 carbon atoms.

The examples of the fluoroalkyl groups represented by $W_1$ to $W_6$ include a trifluoroethyl group, a pentafluoropropyl group, a hexafluoroisopropyl group, a hexafluoro(2-methyl)-isopropyl group, a heptafluorobutyl group, a heptafluoroisopropyl group, an octafluoroisobutyl group, a nonafluorohexyl group, a nonafluoro-t-butyl group, a perfluoroisopentyl group, a perfluorooctyl group, a perfluoro(trimethyl)hexyl group, etc., are exemplified.

When $W_1$ to $W_6$ each represents an organic group having a silicon atom, the organic group preferably has an alkylsilyl structure or a cyclic siloxane structure. Specifically, the groups represented by any of formulae (CS-1) to (CS-3) are exemplified.

The specific examples of the repeating units represented by formula (C-I) are shown below, wherein X represents a hydrogen atom, —$CH_3$, —F, or —$CF_3$.

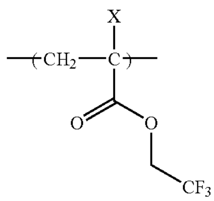
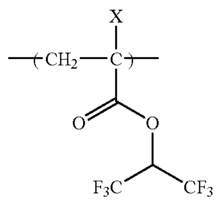
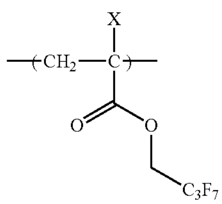
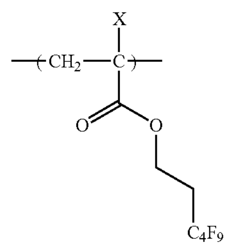
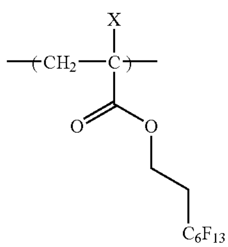
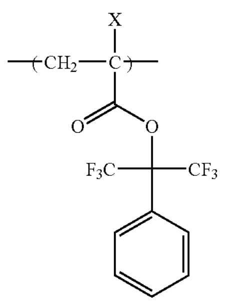
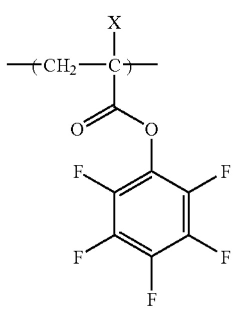
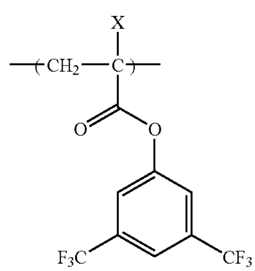
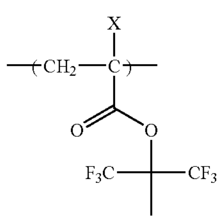
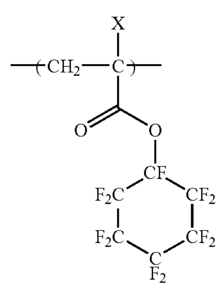
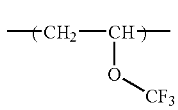
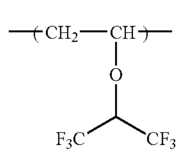
-continued
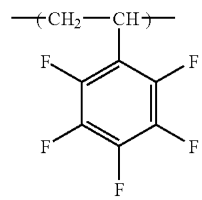
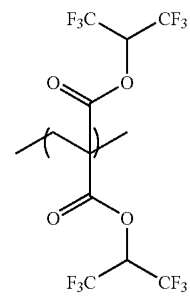
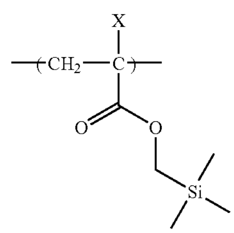
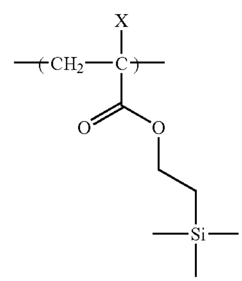
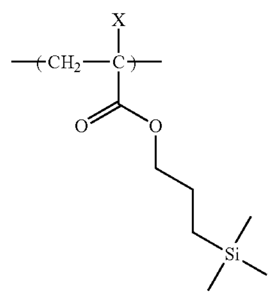
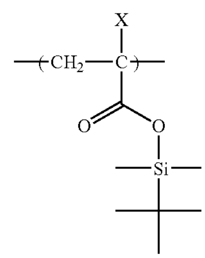
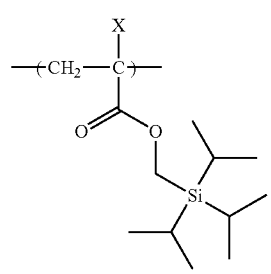
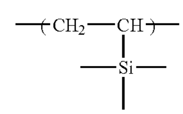
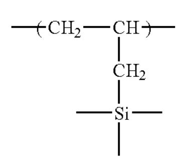
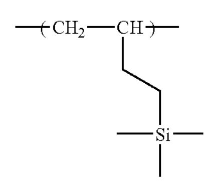
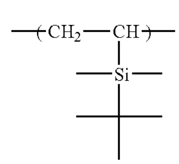
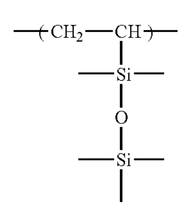

-continued

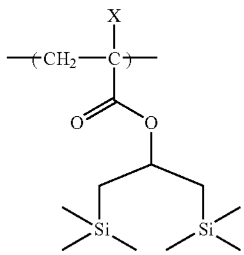

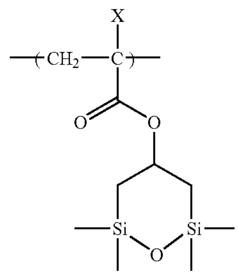

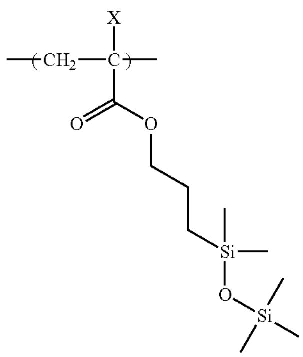

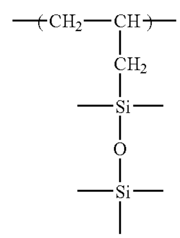

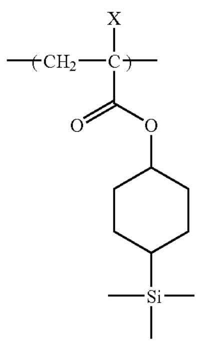

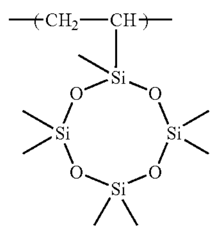

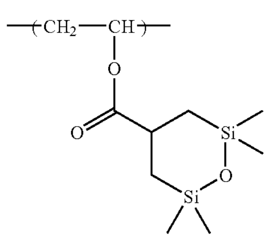

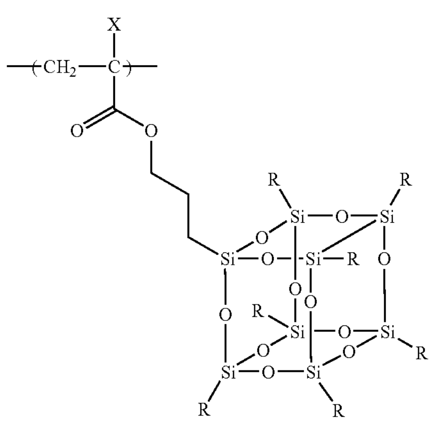

$R = CH_3, C_2H_5, C_3H_7, C_4H_9$

-continued

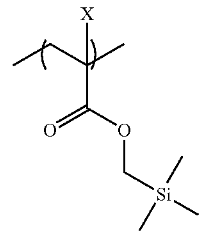

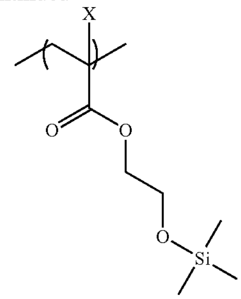

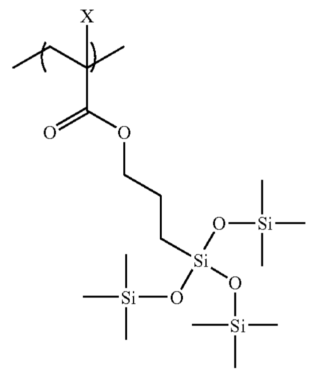

Resin (C) is preferably any resin selected from the following (C-1) to (C-6).

(C-1) A resin having a repeating unit (a) having a fluoroalkyl group (preferably having from 1 to 4 carbon atoms), more preferably a resin having a repeating unit (a) alone;

(C-2) A resin having a repeating unit (b) having a trialkylsilyl group or a cyclic siloxane structure, more preferably a resin having a repeating unit (b) alone;

(C-3) A resin having a repeating unit (a) having a fluoroalkyl group (preferably having from 1 to 4 carbon atoms), and a repeating unit (c) having a branched alkyl group (preferably having from 4 to 20 carbon atoms), a cycloalkyl group (preferably having from 4 to 20 carbon atoms), a branched alkenyl group (preferably having from 4 to 20 carbon atoms), a cycloalkenyl group (preferably having from 4 to 20 carbon atoms), or an aryl group (preferably having from 4 to 20 carbon atoms), more preferably a copolymer resin comprising a repeating unit (a) and a repeating unit (c);

(C-4) A resin having a repeating unit (b) having a trialkylsilyl group or a cyclic siloxane structure, and a repeating unit (c) having a branched alkyl group (preferably having from 4 to 20 carbon atoms), a cycloalkyl group (preferably having from 4 to 20 carbon atoms), a branched alkenyl group (preferably having from 4 to 20 carbon atoms), a cycloalkenyl group (preferably having from 4 to 20 carbon atoms), or an aryl group (preferably having from 4 to 20 carbon atoms), more preferably a copolymer resin comprising a repeating unit (b) and a repeating unit (c);

(C-5) A resin having a repeating unit (a) having a fluoroalkyl group (preferably having from 1 to 4 carbon atoms), and a repeating unit (b) having a trialkylsilyl group or a cyclic siloxane structure, more preferably a copolymer resin comprising a repeating unit (a) and a repeating unit (b); and (C-6) A resin having a repeating unit (a) having a fluoroalkyl group (preferably having from 1 to 4 carbon atoms), a repeating unit (b) having a trialkylsilyl group or a cyclic siloxane structure, and a repeating unit (c) having a branched alkyl group (preferably having from 4 to 20 carbon atoms), a cycloalkyl group (preferably having from 4 to 20 carbon atoms), a branched alkenyl group (preferably having from 4 to 20 carbon atoms), a cycloalkenyl group (preferably having from 4 to 20 carbon atoms), or an aryl group (preferably having from 4 to 20 carbon atoms), more preferably a copolymer resin comprising a repeating unit (a), a repeating unit (b), and repeating unit (c).

The repeating unit (c) having a branched alkyl group, a cycloalkyl group, a branched alkenyl group, a cycloalkenyl group, or an aryl group in resins (C-3), (C-4) and (C-6) can contain an appropriate functional group considering hydrophilic/hydrophobic properties and interaction, but it is preferred that the functional group does not contain a polar group in view of the sweepback contact angle.

In resins (C-3), (C-4) and (C-6), the content of the repeating unit (a) having a fluoroalkyl group and/or the repeating unit (b) having a trialkylsilyl group or a cyclic siloxane structure is preferably from 20 to 99 mol %.

Resin (C) is preferably a resin having a repeating unit represented by the following formula (Ia).

(Ia)

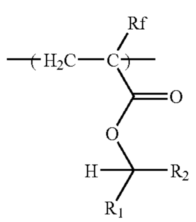

In formula (Ia), Rf represents a fluorine atom, or an alkyl group in which at least one hydrogen atom is substituted with a fluorine atom.

$R_1$ represents an alkyl group.

$R_2$ represents a hydrogen atom or an alkyl group.

The alkyl group in which at least one hydrogen atom is substituted with a fluorine atom represented by Rf in formula (Ia) is preferably an alkyl group having from 1 to 3 carbon atoms, and more preferably a trifluoromethyl group.

The alkyl group represented by $R_1$ is preferably a straight chain or branched alkyl group having from 3 to 10 carbon atoms, and more preferably a branched alkyl group having from 3 to 10 carbon atoms.

The alkyl group represented by $R_2$ is preferably a straight chain or branched alkyl group having from 1 to 10 carbon atoms.

The specific examples of the repeating units represented by formula (Ia) are shown below, but the invention is by no means restricted thereto.

In the following formulae, X represents —H, —$CH_3$, —F or —$CF_3$.

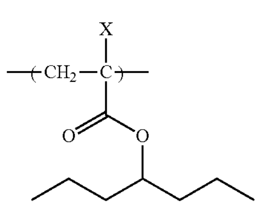

-continued

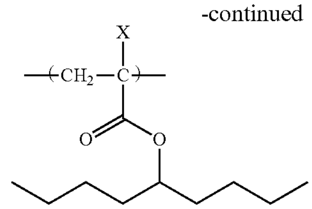

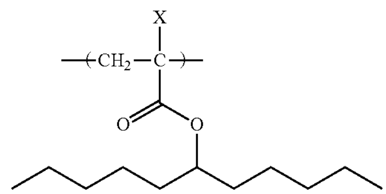

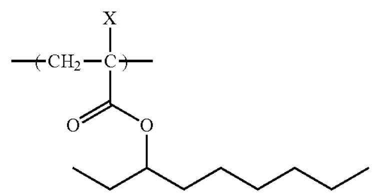

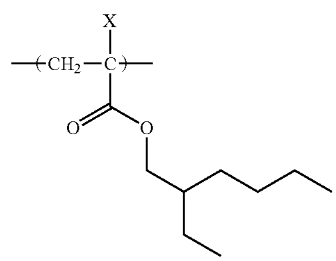

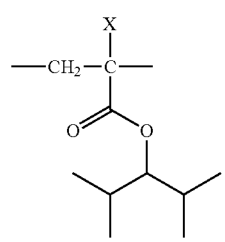

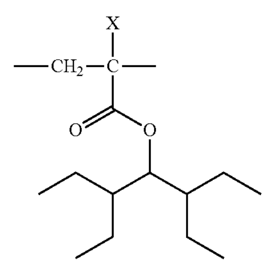

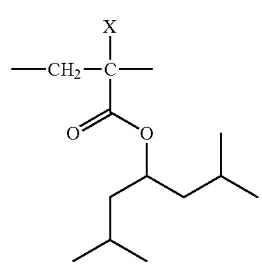

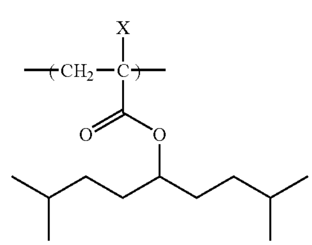

-continued

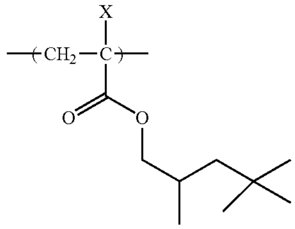

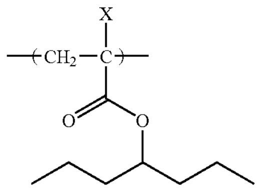

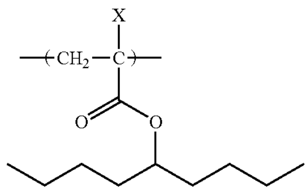

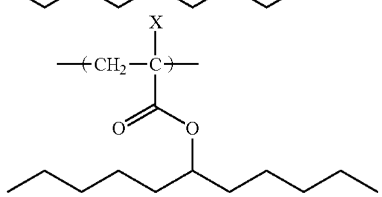

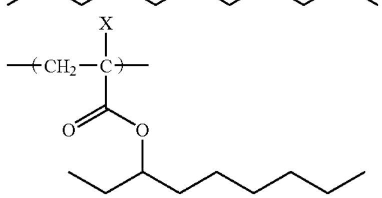

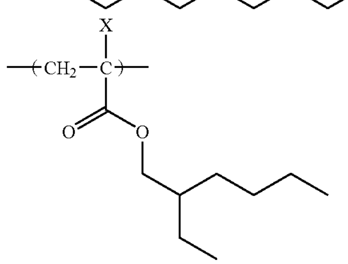

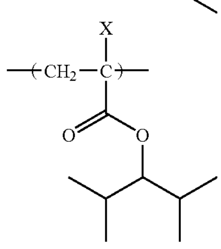

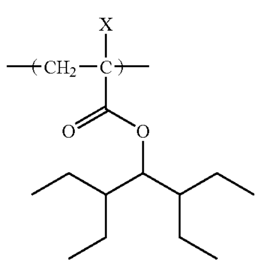

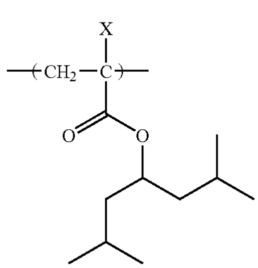

-continued

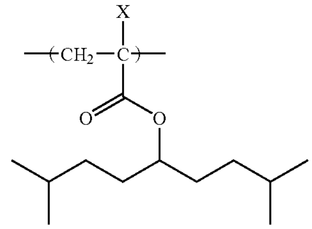

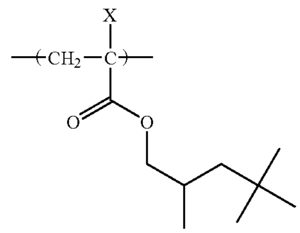

It is preferred that the repeating unit represented by formula (Ia) is polymerized with a compound represented by the following formula (I).

(I)

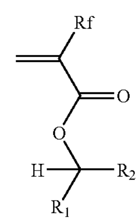

In formula (I), Rf represents a fluorine atom, or an alkyl group in which at least one hydrogen atom is substituted with a fluorine atom.

$R_1$ represents an alkyl group.

$R_2$ represents a hydrogen atom or an alkyl group.

Rf, $R_1$ and $R_2$ in formula (I) have the same meaning as Rf, $R_1$ and $R_2$ in formula (Ia) respectively.

Commercially available products may be used as the compound represented by formula (I), or synthesized compound may be used. In the case of synthesis, the compound can be obtained by chloridizing and then esterifying 2-trifluoromethylmethacrylic acid.

Resin (C) having the repeating unit represented by formula (Ia) may further have a repeating unit represented by the following formula (III).

(III)

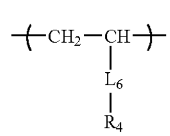

In formula (III), $R_4$ represents an alkyl group, a cycloalkyl group, an alkenyl group, a cycloalkenyl group, a trialkylsilyl group, or a group having a cyclic siloxane structure.

$L_6$ represents a single bond or a divalent linking group.

The alkyl group represented by $R_4$ in formula (III) is preferably a straight chain or branched alkyl group having from 3 to 20 carbon atoms.

The cycloalkyl group is preferably a cycloalkyl group having from 3 to 20 carbon atoms.

The alkenyl group is preferably an alkenyl group having from 3 to 20 carbon atoms.

The cycloalkenyl group is preferably a cycloalkenyl group having from 3 to 20 carbon atoms.

The trialkylsilyl group is preferably a trialkylsilyl group having from 3 to 20 carbon atoms.

The group having a cyclic siloxane structure is preferably a group having a cyclic siloxane structure having from 3 to 20 carbon atoms.

The divalent linking group represented by $L_6$ is preferably an alkylene group (preferably having from 1 to 5 carbon atoms), or an oxy group.

The specific examples of resins (C) having the repeating unit represented by formula (Ia) are shown below, but the invention is not restricted to these examples.

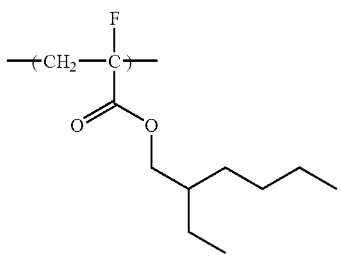

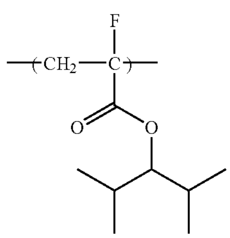

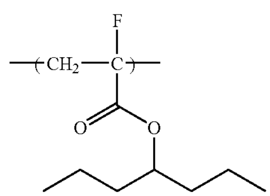

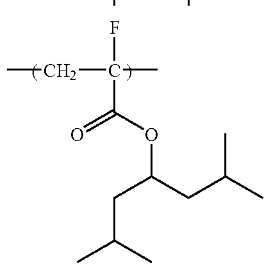

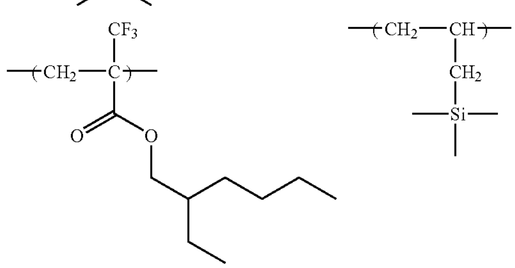

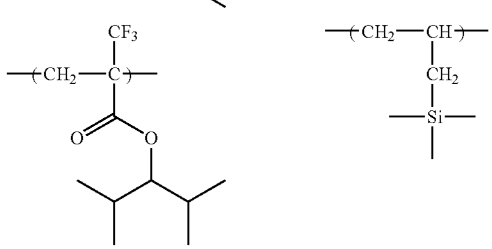

-continued

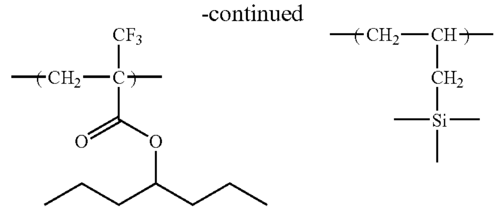

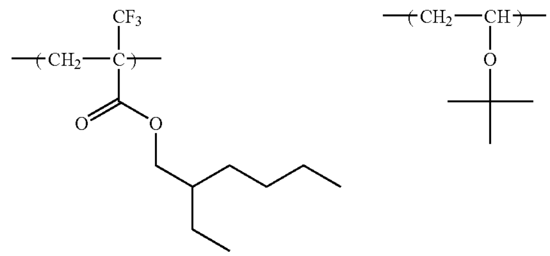

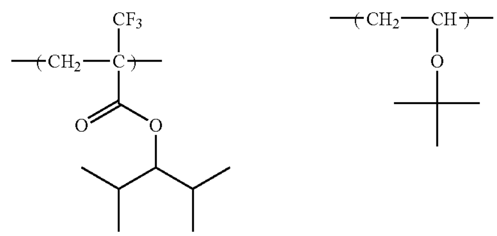

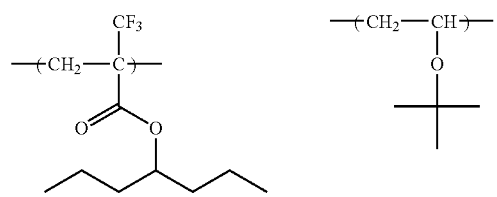

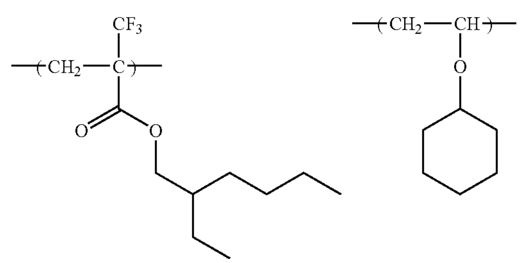

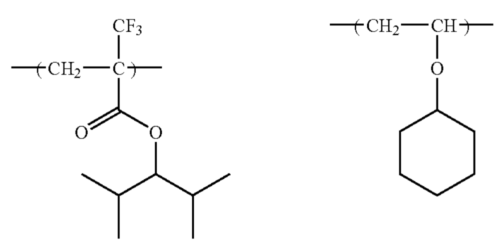

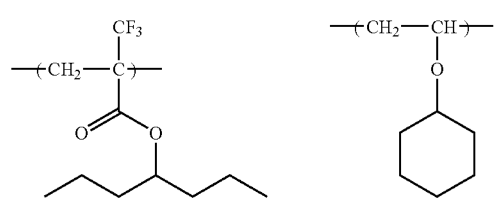

-continued
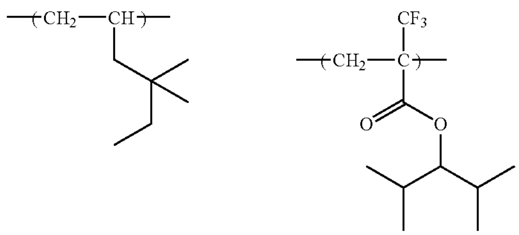
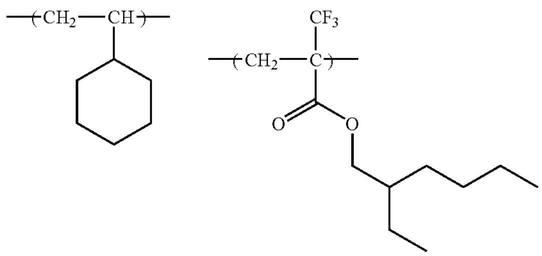
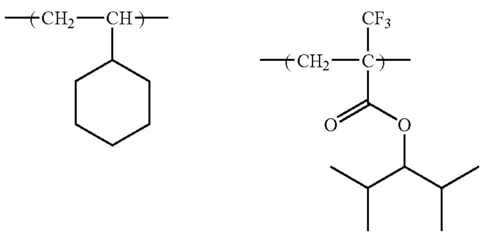
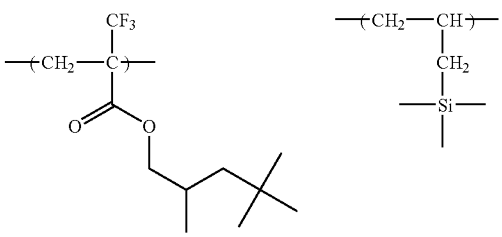
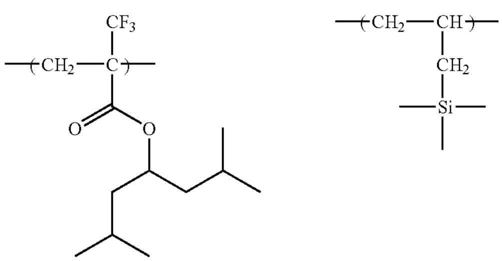
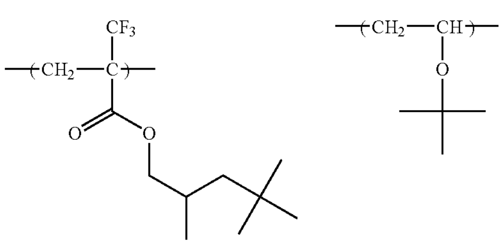
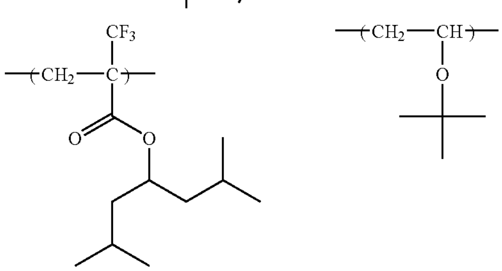
-continued
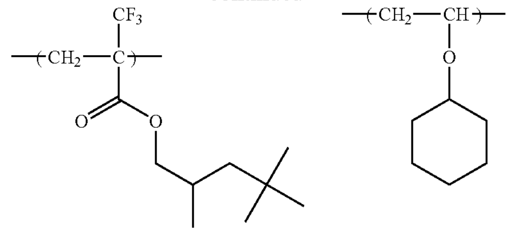
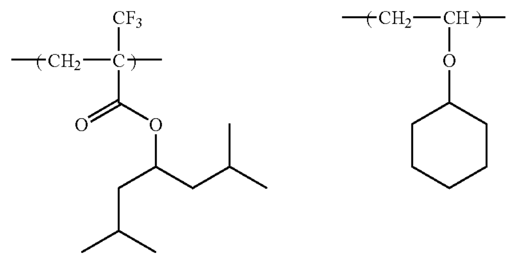
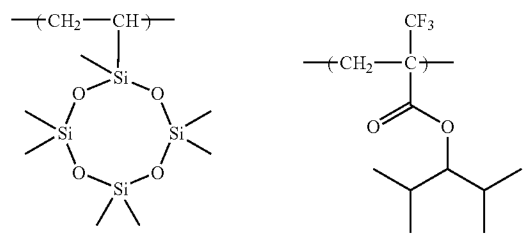
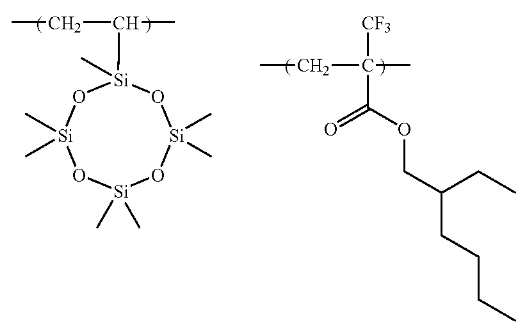
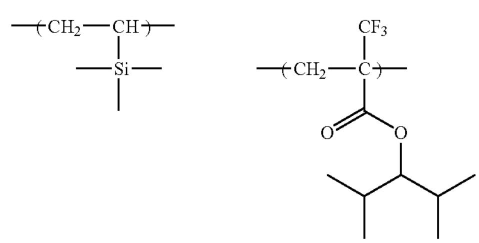
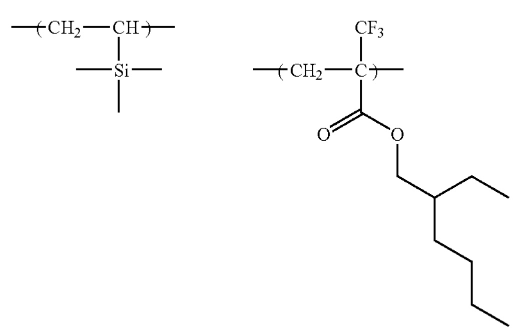

-continued

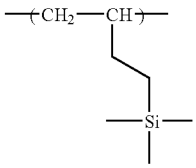
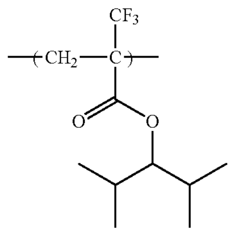

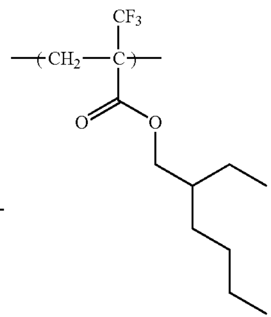
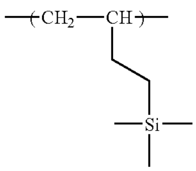

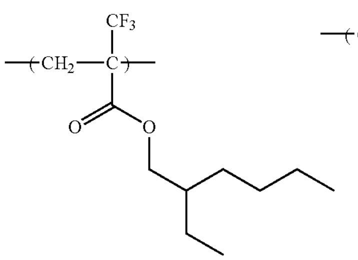
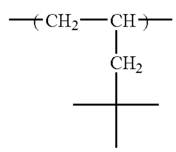

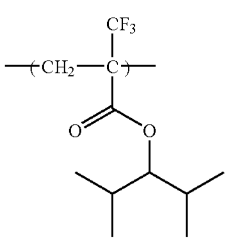
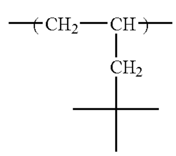

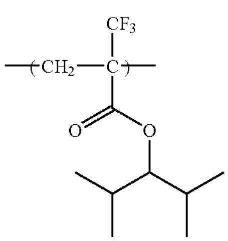
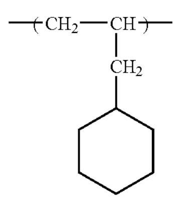

Resin (C) is preferably a resin having a repeating unit represented by the following formula (II) and a repeating unit represented by the following formula (III).

(II)

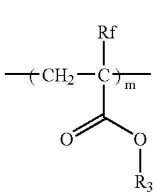

-continued (III)

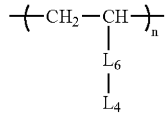

In formulae (II) and (III), Rf represents a fluorine atom, or an alkyl group in which at least one hydrogen atom is substituted with a fluorine atom.

$R_3$ represents an alkyl group, a cycloalkyl group, an alkenyl group, or a cycloalkenyl group.

$R_4$ represents an alkyl group, a cycloalkyl group, an alkenyl group, a cycloalkenyl group, a trialkylsilyl group, or a group having a cyclic siloxane structure.

$L_6$ represents a single bond or a divalent linking group.

m and n represent figures respectively satisfying $0<m<100$ and $0<n<100$.

Rf in formula (II) is the similar to same as Rf in formula (Ia).

The alkyl group represented by $R_3$ is preferably a straight chain or branched alkyl group having from 3 to 20 carbon atoms.

The cycloalkyl group is preferably a cycloalkyl group having from 3 to 20 carbon atoms.

The alkenyl group is preferably an alkenyl group having from 3 to 20 carbon atoms.

The cycloalkenyl group is preferably a cycloalkenyl group having from 3 to 20 carbon atoms.

Preferably m is from 30 to 70, and n is from 30 to 70. More preferably m is from 40 to 60, and n is from 40 to 60.

The specific examples of resins (C) having the repeating unit represented by formula (II) and the repeating unit represented by formula (III) are shown below, but the invention is not limited thereto.

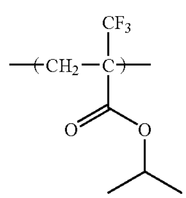
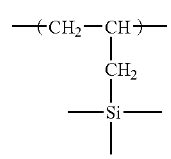

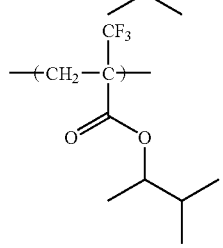
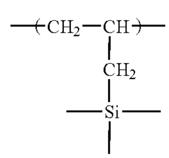

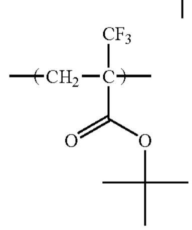
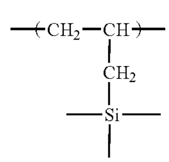

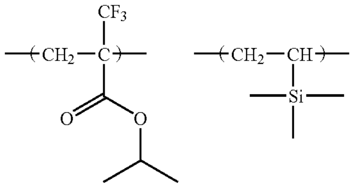
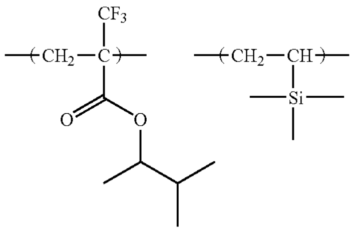
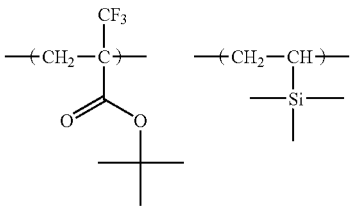
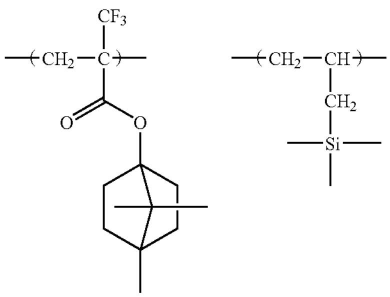
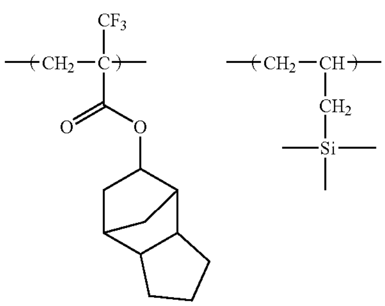
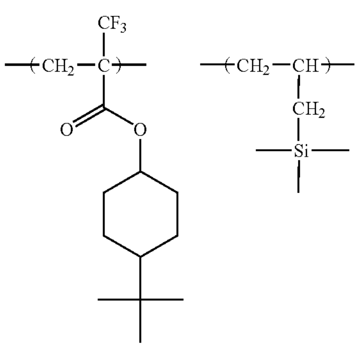
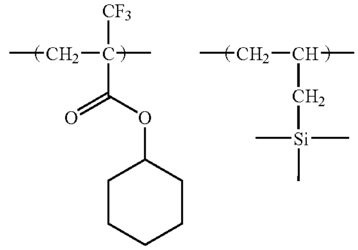
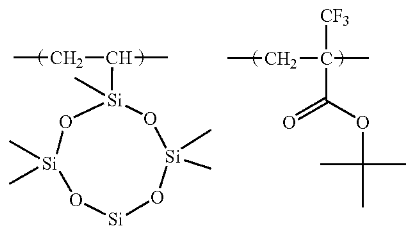
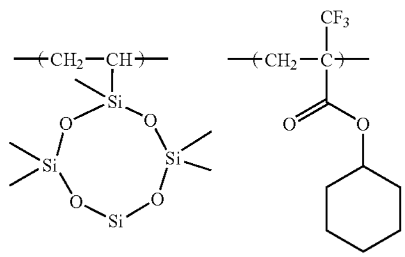
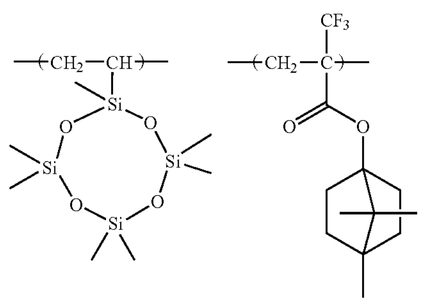
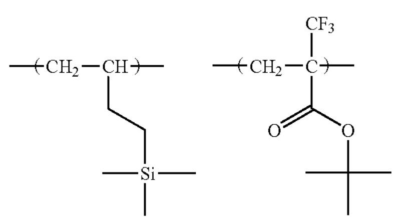
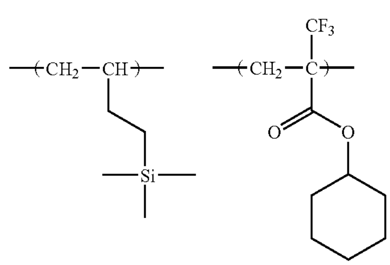

-continued

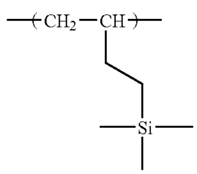
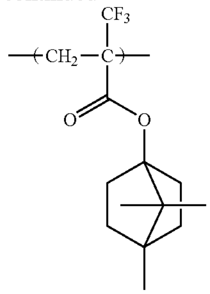

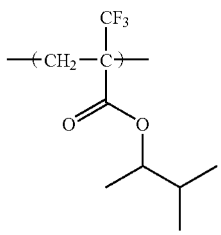
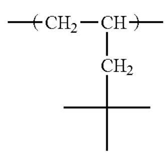

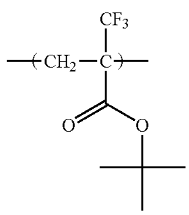
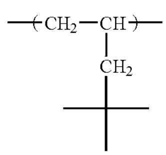

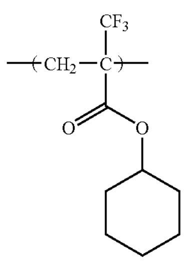
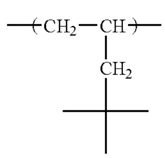

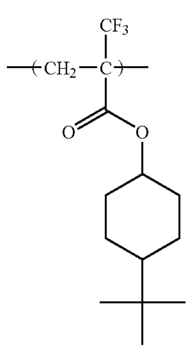
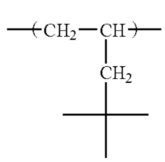

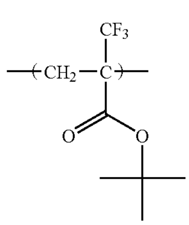
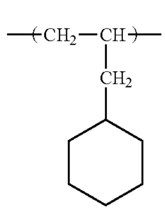

Resin (C) may have a repeating unit represented by the following formula (VIII).

(VIII)

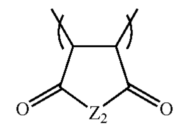

In formula (VIII), $Z_2$ represents —O— or —N($R_{41}$)—. $R_{41}$ represents a hydrogen atom, an alkyl group, or —$OSO_2$—$R_{42}$. $R_{42}$ represents an alkyl group, a cycloalkyl group, or a camphor residue. The alkyl group represented by $R_{41}$ and $R_{42}$ may be substituted with a halogen atom (preferably a fluorine atom), etc.

It is preferred that resin (C) is stable to an acid and insoluble in an alkali developer.

It is preferred in the light of the following ability of an immersion liquid that resin (C) does not have an alkali-soluble group and a group increasing solubility in a developing solution by the action of an acid and alkali.

The total amount of the repeating units having an alkali-soluble group or a group increasing solubility in a developing solution by the action of an acid and alkali contained in resin (C) is preferably 20 mol % or less based on all the repeating units constituting resin (C), more preferably from 0 to 10 mol %, and still more preferably from 0 to 5 mol %.

Further, when resin (C) contains a hydrophilic polar group, the following ability of an immersion liquid is liable to lower, so that it is more preferred not to have a polar group selected from among a hydroxyl group, an alkylene glycols, ethers, and a sulfone group.

(x) The alkali-soluble groups include, groups having a phenolic hydroxyl group, a carboxylic acid group, a fluorinated alcohol group, a sulfonic acid group, a sulfonamido group, a sulfonylimido group, an (alkylsulfonyl)(alkylcarbonyl)-methylene group, an (alkylsulfonyl)(alkylcarbonyl) imido group, a bis(alkylcarbonyl)methylene group, a bis (alkyl-carbonyl)imido group, a bis(alkylsulfonyl)methylene group, a bis(alkylsulfonyl)imido group, a tris(alkylcarbonyl)-methylene group, or a tris(alkylsulfonyl)methylene group.

(y) The groups capable of decomposing by the action of an alkali (an alkali developer) to increase solubility in the alkali developer include, e.g., a lactone group, an ester group, a sulfonamido group, an acid anhydride, an acid imido group, etc.

(z) As the groups capable of decomposing by the action of an acid to increase solubility in a developing solution, the same groups as the acid-decomposable groups in acid-decomposable resin (A) are exemplified.

However, a repeating unit represented by the following formula (pA-C) has no or extremely little decomposability by the action of an acid as compared with the acid-decomposable group of resin (A), so that such a repeating unit is regarded as substantially equivalent to non-acid decomposable.

(pA-c)

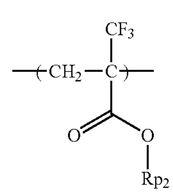

In formula (pA-c), $Rp_2$ represents a hydrocarbon group having a tertiary carbon atom bonded to the oxygen atom in the formula.

When resin (C) has a silicon atom, the content of the silicon atom is preferably from 2 to 50 mass % based on the molecular weight of resin (C), and more preferably from 2 to 30 mass %. Further, it is preferred that the content of the repeating unit containing the silicon atom is from 10 to 100 mass % in resin (C), and more preferably from 20 to 100 mass %.

When resin (C) has a fluorine atom, the content of the fluorine atom is preferably from 5 to 80 mass % based on the molecular weight of resin (C), and more preferably from 10 to 80 mass %. Further, it is preferred that the content of the repeating unit containing the fluorine atom is from 10 to 100 mass % in resin (C), and more preferably from 30 to 100 mass %.

The residual amount of monomers in resin (C) is preferably from 0 to 10 mass %, more preferably from 0 to 5 mass %, and still more preferably from 0 to 1 mass %.

The addition amount of resin (C) in the positive resist composition is preferably from 0.1 to 5 mass % based on all the solids content of the resist composition, more preferably from 0.2 to 3.0 mass %, and still more preferably from 0.3 to 2.0 mass %.

In the invention, component (C) is a resin having the degree of molecular weight dispersion (Mw/Mn) of 1.3 or less and weight average molecular weight (Mw) of $1.0\times10^4$ or less, more preferably the degree of dispersion of 1.3 or less and weight average molecular weight of $0.8\times10^4$ or less, and still more preferably the degree of dispersion of 1.3 or less and weight average molecular weight of $0.7\times10^4$ or less. The most preferred resin is a resin having the degree of dispersion of 1.25 or less and weight average molecular weight of from $0.2\times10^4$ to $0.6\times10^4$. Here, the weight average molecular weight is defined by polystyrene equivalent of gel permeation chromatography (GPC).

As resins controlled in the degree of dispersion and molecular weight as above, commercially available products can be used, alternatively the resins can be synthesized with a living radical polymerization initiator, or can be manufactured by removing low molecular weight components using purification by fraction of solvents.

The measured value of GPC in the invention is a value measured on the following condition.

Apparatus: HLC-8220 GPC (manufactured by Tosoh Corporation)
Detector: differential refractometer (RI detector)
Pre-column: TSKGUARDCOLUMN HXL-L 6 mm×40 mm (manufactured by Tosoh Corporation)
Sample side column: the following four columns are directly coupled in order (manufactured by Tosoh Corporation)
  TSK-GEL GMHXL 7.8 mm×300 mm
  TSK-GEL G4000HXL 7.8 mm×300 mm
  TSK-GEL G3000HXL 7.8 mm×300 mm
  TSK-GEL G2000HXL 7.8 mm×300 mm
Reference side column: the same as the sample side column
Temperature of thermostatic chamber: 40° C.
Moving bed: THF
Quantity of flow of moving bed on the sample side: 1.0 ml/min
Quantity of flow of moving bed on the reference side: 0.3 ml/min
Sample concentration: 0.1 wt %
Quantity of pouring of sample: 107 μl
Data sampling time: 16 to 46 minutes after pouring of sample
Sampling pitch: 300 msec Similarly to acid-decomposable resin (A), it is preferred that the amount of residual monomers and oligomer components of resin (C) is less than the established value, for example, 0.1 mass % by HPLC, at the same time low in impurities such as metals, by which not only sensitivity, resolution, process stability and a pattern form as a resist can be bettered but also a resist free from foreign matters in liquid and free from aging fluctuation of sensitivity can be obtained.

Various commercially available products can be used as resin (C), or resin (C) can be synthesized according to ordinary methods (e.g., radical polymerization). For example, as ordinary methods, a batch polymerization method of performing polymerization by dissolving a monomer seed and an initiator in a solvent and heating, and a dropping polymerization method of adding a solution of a monomer seed and an initiator into a heated solvent by dropping over 1 to 10 hours are exemplified, and a dropping polymerization method is preferred. As the reaction solvents, ethers, e.g., tetrahydrofuran, 1,4-dioxane, and diisopropyl ether, ketones, e.g., methyl ethyl ketone and methyl isobutyl ketone, ester solvents, e.g., ethyl acetate, amide solvents, e.g., dimethylformamide and dimethylacetamide, and solvents capable of dissolving a composition of the invention described later, e.g., propylene glycol monomethyl ether acetate, propylene glycol monomethyl ether, and cyclohexanone are exemplified. It is more preferred to use the same solvent in polymerization as used in a resist composition in the invention, by which the generation of particles during preservation can be restrained.

It is preferred to perform polymerization reaction in the atmosphere of inert gas such as nitrogen or argon. Polymerization is initiated with commercially available radical polymerization initiators (e.g., azo initiators, peroxide and the like). As radical polymerization initiators, azo initiators are preferred, and azo initiators having an ester group, a cyano group, or a carboxyl group are preferred. As preferred initiators, azobisisobutyronitrile, azobis-dimethylvaleronitrile, dimethyl-2,2'-azobis(2-methyl-propionate), etc., are exemplified. The concentration of reaction is from 5 to 50 mass %, and preferably from 30 to 50 mass %. The reaction temperature is generally from 10 to 150° C., preferably from 30 to 120° C., and more preferably from 60 to 100° C.

In the next place, the obtained resin is purified. Ordinary methods can be applied to the purification, e.g., a method of liquid-liquid extraction of removing residual monomers and oligomer components by water washing and combining appropriate solvents, a method of purification in a state of solution, such as ultrafiltration of removing only residual monomers having a molecular weight lower than a specific molecular weight by extraction, a reprecipitation method of removing residual monomers by dropping a resin solution to a bad solvent to thereby solidify the resin in the bad solvent, and a method of purification in a solid state by washing filtered resin slurry with a bad solvent can be used.

Resin (C) in the invention is small in the degree of dispersion as described above, and commercially available products can be used as such a resin, or the resin can be synthesized with a living radical polymerization initiator, or can be manufactured by removing low molecular weight components using purification by fraction of solvents.

In the first place, the purification by fraction of solvents is explained. Ordinary methods can be applied to the purification by fraction of solvents, e.g., a method of liquid-liquid extraction of removing residual monomer and oligomer components by water washing and combining appropriate solvent, a method of purification in a state of solution, such as ultrafiltration of removing only residual monomers having a molecular weight lower than a specific molecular weight by extraction, a reprecipitation method of removing residual monomers by dropping a resin solution to a bad solvent to thereby solidify the resin in the bad solvent, and a method of purification in a solid state by washing filtered resin slurry with a bad solvent can be used. For example, after finishing radical polymerization reaction, the reaction solution is brought into contact with a hardly soluble or insoluble solvent (bad solvent) of the acid-decomposable resin in an amount of less than 5 times the volume of the reaction solution, preferably from 4.5 to 0.5 times, more preferably from 3 to 0.5 times, and still more preferably from 1 to 0.5 times, whereby the resin is precipitated as a solid.

The solvents for use in precipitation or reprecipitation from a polymer solution (precipitation or reprecipitation solvents) should be sufficient so long as they are bad solvents of the polymer, and according to the kind of polymer the solvent can be used by arbitrarily selecting from, e.g., hydrocarbons (aliphatic hydrocarbons, e.g., pentane, hexane, heptane, octane, etc.; alicyclic hydrocarbons, e.g., cyclohexane, methylcyclohexane, etc.; aromatic hydrocarbons, e.g., benzene, toluene, xylene, etc.), halogenated hydrocarbons (halogenated aliphatic hydrocarbons, e.g., methylene chloride, chloroform, carbon tetrachloride, etc.; halogenated aromatic hydrocarbons, e.g., chlorobenzene, dichlorobenzene, etc.), nitro compounds (nitromethane, nitroethane, etc.), nitriles (acetonitrile, benzonitrile, etc.), ethers (chain ethers, e.g., diethyl ether, diisopropyl ether, dimethoxyethane, etc.; cyclic ethers, e.g., tetrahydrofuran, dioxane, etc.), ketones (acetone, methyl ethyl ketone, diisobutyl ketone, etc.), esters (ethyl acetate, butyl acetate, etc.), carbonates (dimethyl carbonate, diethyl carbonate, ethylene carbonate, propylene carbonate, etc.), alcohols (methanol, ethanol, propanol, isopropyl alcohol, butanol, etc.), carboxylic acids (acetic acid), and mixed solvents containing these solvents. Of these solvents, solvents containing at least hydrocarbon (especially, aliphatic hydrocarbon such as hexane, etc.) are preferred as the precipitation or reprecipitation solvents. In these solvents containing at least hydrocarbon, the proportion of the hydrocarbon (for example, aliphatic hydrocarbon, e.g., hexane) and other solvents (for example, ester, e.g., ethyl acetate, alcohols, e.g., methanol, ethanol, etc.) is the former/the latter (volume ratio, at 25° C.) of from 10/90 to 99/1, preferably the former/the latter (volume ratio, at 25° C.) of from 30/70 to 98/2, and more preferably the former/the latter (volume ratio, at 25° C.) of from 50/50 to 97/3 or so.

The use amount of a precipitation or reprecipitation solvent can be arbitrarily selected taking efficiency and yield into consideration, but generally the amount is from 100 to 10,000 mass parts per 100 mass parts of the polymer solution, preferably from 200 to 2,000 mass parts, and more preferably from 300 to 1,000 mass parts.

The caliber of a nozzle in supplying a polymer solution to a precipitation or reprecipitation solvent (a bad solvent) is preferably 4 mmϕ or less (e.g., from 0.2 to 4 mmϕ). The supplying rate (the dropping rate) of a polymer solution to a bad solvent is, for example, from 0.1 to 10 m/sec in linear velocity, and preferably from 0.3 to 5 m/sec or so.

It is preferred that precipitation or reprecipitation operation is carried out with stirring. As stirring blades for use in stirring, a desk turbine, a fan turbine (including a paddle), a bent blade turbine, a blade turbine, a faudler type, a bull margin type, an angled blade fan turbine, a propeller, a multi-stage type, an anchor type (or a horseshoe type), a gate type, a double ribbon, and a screw can be used. It is preferred to continue stirring after completion of the supply of a polymer solution for further 10 minutes or more, especially preferably for 20 minutes or more. When stirring time is short, there are cases where the content of monomer in polymer particles cannot be sufficiently reduced. It is also possible to mix and stir a polymer solution and a bad solvent with a line mixer in place of a stirring blade.

The temperature in carrying out precipitation or reprecipitation can be arbitrarily selected taking efficiency and workability into consideration, but the temperature is generally from 0 to 50° C. or so, preferably around room temperature (e.g., from 20 to 35° C. or so). Precipitation or reprecipitation can be carried out according to known methods such as a batch system and a continuous system with generally used mixers, e.g., a stirring tank.

A precipitated or reprecipitated particulate polymer is generally subjected to ordinary solid-liquid separation such as filtration and centrifugation, and then drying, and offered to use. Filtration is performed with a filter resisting to solvents preferably under pressure. Drying is generally carried out under atmospheric pressure or reduced pressure (preferably under reduced pressure), at a temperature of from 30 to 100° C. or so, preferably from 30 to 50° C. or so.

Incidentally, a resin may be dissolved in a solvent after once being precipitated and separated, and then may be brought into contact with a hardly soluble or insoluble solvent of the resin.

That is, a method comprising the following processes can be used: after completion of radical polymerization reaction, the solution is brought into contact with a hardly soluble or insoluble solvent of the acid-decomposable resin to thereby precipitate a resin (process a), the resin is separated from the solution (process b), the resin is again dissolved in a solvent to prepare resin solution A (process c), a resin as a solid is precipitated by bringing resin solution A into contact with a hardly soluble or insoluble solvent of the resin in an amount of less than 5 times the volume of resin solution A, preferably 3 times or less (process d), and the precipitated resin is separated (process e).

As the solvent for use in preparing resin solution A, the same solvent as the solvent used for dissolving a monomer in polymerization reaction can be used, that is, the solvent used for the preparation of resin solution A may be the same with or different from the solvent used in polymerization reaction.

Living radical polymerization is described below.

Living radical polymerization using a living radical polymerization initiator is radical polymerization capable of maintaining the activity of polymer terminals, and pseudo living polymerization wherein terminal inactivated polymer and terminal activated polymer are in equilibrium condition is also included in living radical polymerization. As the examples of living radical polymerizations, polymerization using a chain transfer agent such as polysulfide, polymerization using a radical scavenger (*Macromolecules,* 1994, 27, 7228) such as a cobalt porphyrin complex (*J. Am. Chem. Soc.,* 1994, 116, 7943), and a nitroxide compound, atomic transfer radical polymerization using an organic halogen compound and the like as an initiator and a transition metal complex as a catalyst (JP-A-2002-145972, JP-A-2002-80523, JP-A-2001-261733, JP-A-2000-264914), and polymerization having RCSS at growing terminals (WO 9801478A1, WO 9858974A1, WO 9935177A1, WO 9931144, U.S. Pat. No. 6,380,335 B1) are exemplified.

Of the living radical polymerizations for manufacturing acid-decomposable group-containing resins, in the example of using a thermal radical generator and a nitroxide compound as a polymerization initiator, a method of using a radical scavenger in the nitroxide compound of living radical polymerization initiator is described in the first place. In this polymerization, stable nitroxy free radical (=N—O.) is generally used as a radical capping agent. As such compounds, although not limitative, nitroxy free radicals from cyclic hydroxylamine, e.g., 2,2,6,6-substituted-1-piperidinyloxy radical and 2,2,5,5-substituted-1-pyrrolidinyloxy radical, are preferred. As the substituents, an alkyl group having 4 or less carbon atoms, e.g., a methyl group or an ethyl group, is preferred.

As specific examples of nitroxy free radicals, although not limitative, 2,2,6,6-tetramethyl-1-piperidinyloxy radical (TEMPO), 2,2,6,6-tetraethyl-1-piperidinyloxy radical, 2,2,6,6-tetramethyl-4-oxo-1-piperidinyloxy radical, 2,2,5,5-tetramethyl-1-pyrrolidinyloxy radical, 1,1,3,3-tetramethyl-2-isoindolinyloxy radical, and N,N-di-t-butylamineoxy radical are exemplified. It is possible to use a stable radical such as a galvinoxyl free radical in place of a nitroxy free radical.

These radical capping agents are used in combination with a thermal radical generator. It is thought that the reaction product of a radical capping agent and a thermal radical generator becomes a polymerization initiator to advance the polymerization of an addition polymerizable monomer. The proportion of both compounds is not especially restricted, but it is suitable to use from 0.1 to 10 mols of a thermal radical generator to 1 mol of a radical capping agent.

Various compounds can be used as a thermal radical generator, but peroxides and azo compounds capable of generating radicals under the polymerization temperature condition are preferred. As such peroxides, although not limitative, diacyl peroxides, e.g., benzoyl peroxide and lauroyl peroxide; dialkyl peroxides, e.g., dicumyl peroxide and di-t-butyl peroxide; peroxycarbonates, e.g., diisopropyl peroxydicarbonate and bis(4-t-butylcyclohexyl)peroxy-dicarbonate; and alkyl peresters, e.g., t-butyl peroxyoctoate and t-butyl peroxybenzoate are exemplified. Benzoyl peroxide is especially preferred. As the azo compounds, 2,2'-azobis-isobutyronitrile, 2,2'-azobis(2,4-dimethylvaleronitrile), 2,2'-azobis(4-methoxy-2,4-dimethylvaleronitrile), and azobisisodimethyl butyrate are exemplified, and azobisiso-dimethyl butyrate and 2,2'-azobisisobutyronitrile are especially preferred.

As reported in *Macromolecules*, Vol. 28, p. 2993 (1995), alkoxylamine compounds represented by formulae (9) and (10) as shown below can be used as polymerization initiators in place of using a thermal radical generator and a radical capping agent.

(9)

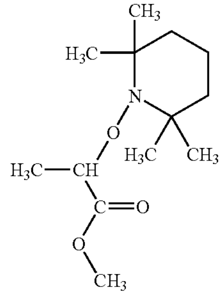

-continued (10)

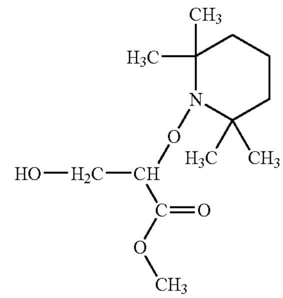

In a case where an alkoxylamine compound is used as polymerization initiator, a polymer having a functional group at terminal can be obtained by using a compound having a functional group such as a hydroxyl group as shown in formula (10).

Polymerization conditions of monomers, solvents and polymerization temperature used in the polymerization of using a radical scavenger such as the above nitroxide compounds are not restricted and these conditions may be the same as the conditions used in the atomic transfer radical polymerization described below.

As living radical polymerization initiators, a polymerization initiator comprising a transition metal complex and an organic halogen compound, and a Lewis acid or amine can be used.

As the central metal constituting the transition metal complex, the elements belonging to $7^{th}$ to $11^{th}$ groups of the Periodic Table (according to the Periodic Table described in *Kagaku Binran Kisohen I* (*Chemical Handbook, Elementary Course I*), Revised $4^{th}$ Edition, compiled by Nippon Kagaku-Kai (1993)), such as iron, copper, nickel, rhodium, ruthenium and rhenium are preferably exemplified. Ruthenium and copper are especially preferred of these elements.

As the specific examples of the transition metal complexes having ruthenium as the central metal, dichlorotris-(triphenylphosphine)ruthenium, dichlorotris(tributyl-phosphine) ruthenium, dichloro(cyclooctadiene)ruthenium, dichlorobenzeneruthenium, dichloro-p-cymeneruthenium, dichloro(norbornadiene)ruthenium, cis-dichlorobis(2,2'-bipyridine)ruthenium, dichlorotris(1,10-phenanthroline)-ruthenium, carbonylchlorohydridetris(triphenylphosphine)-ruthenium, chlorocyclopentadienylbis(triphenylphosphine)-ruthenium, chloropentamethylcyclopentadienylbis (triphenyl-phosphine)ruthenium, and chloroindenylbis (triphenyl-phosphine)ruthenium are exemplified. Of these compounds, dichlorotris(triphenylphosphine)ruthenium, chloropentamethylcyclopentadienylbis(triphenylphosphine) ruthenium, and chloroindenylbis(triphenylphosphine)ruthenium are especially preferred.

Organic halogen compounds function as polymerization initiators. As such organic halogen compounds, an α-halogeno-carbonyl compound or an α-halogenocarboxylate can be used, and α-halogenocarboxylate is especially preferred. The specific examples thereof include ethyl 2-bromo-2-methylpropanoate, 2-hydroxyethyl 2-bromopropionate, and dimethyl 2-chloro-2,4,4-trimethylglutarate.

Lewis acids or amines function as activating agents. As such Lewis acids, aluminum trialkoxides, e.g., aluminum triisopropoxide and aluminum tri(t-butoxide); bis-(substituted aryloxy)alkylaluminum, e.g., bis(2,6-di-t-butylphenoxy)methylaluminum and bis(2,4,6-tri-t-butyl-phenoxy) methylaluminum; tris(substituted aryloxy)aluminum, e.g., tris(2,6-diphenylphenoxy)aluminum; and titanium tetraalkoxide, e.g., titanium tetraisopropoxide can be exemplified. Aluminum trialkoxide is preferred, and aluminum triisopropoxide is especially preferred.

As amines, aliphatic amines such as aliphatic primary amines, e.g., methylamine, ethylamine, propylamine, isopropylamine and butylamine, aliphatic secondary amines, e.g., dimethylamine, diethylamine, dipropylamine, diisopropylamine and dibutylamine, and aliphatic tertiary amines, e.g., trimethylamine, triethylamine, tripropylamine, triisopropylamine and tributylamine; aliphatic polyamines, e.g., N,N,N',N'-tetramethylethylenediamine, N,N,N',N",N"-pentamethyldiethylenetriamine, and 1,1,4,7,10,10-hexamethyltriethylenetetramine; aromatic amines such as aromatic primary amines, e.g., aniline and toluidine, aromatic secondary amines, e.g., diphenylamine, aromatic tertiary amines, e.g., triphenylamine can be exemplified. Of these amines, aliphatic amines are preferred, and butylamine, dibutylamine and tributylamine are especially preferred.

The proportion of each component in a polymerization initiator comprising a transition metal complex and an organic halogen compound, and a Lewis acid or amine is not always restricted, but polymerization is liable to be lagging when the proportion of a transition metal complex to an organic halogen compound is too low, in contrast with this, the molecular weight distribution of the obtained polymer is liable to broaden when the proportion is too high. Therefore, the molar ratio of a transition metal complex/an organic halogen compound is preferably in a range of from 0.05/1 to 1/1. Further, polymerization is liable to be lagging when the proportion of a Lewis acid or amine to a transition metal complex is too low, on the other hand, the molecular weight distribution of the obtained polymer is liable to broaden when the proportion is too high, so that the molar ratio of an organic halogen compound/a Lewis acid or amine is preferably in a range of from 1/1 to 1/10.

The living radical polymerization initiators can be generally prepared by blending a transition metal complex, a polymerization initiator of an organic halogen compound, and an activating agent of a Lewis acid or amine by ordinary methods immediately before use. Alternatively, a transition metal complex, a polymerization initiator and an activating agent may be preserved separately, added to a polymerization reaction system severally, and blended in the polymerization reaction system to function as a living radical polymerization initiator.

As other living radical polymerization initiator, a compound represented by the following formula (8) can be exemplified.

(8)

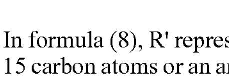

In formula (8), R' represents an alkyl group having from 1 to 15 carbon atoms or an aryl group that may contain an ester group, an ether group, an amino group or an amido group, Y represents a single bond, an oxygen atom, a nitrogen atom, or a sulfur atom, and R" represents an alkyl group having from 1 to 15 carbon atoms or an aryl group that may contain an ester group, an ether group, or an amino group.

When Y represents a single bond, R' especially preferably represents a methyl group, an ethyl group, a propyl group, a butyl group, a cyclohexyl group, a norbornyl group, a dinorbornyl group, an adamantyl group, a phenyl group, a benzyl group, a hydroxymethyl group, a hydroxyethyl group, or a hydroxycyclohexyl group.

When Y represents an oxygen atom, R' especially preferably represents a methyl group, an ethyl group, a propyl group, a butyl group, a cyclohexyl group, a norbornyl group, a dinorbornyl group, an adamantyl group, a phenyl group, a benzyl group, a hydroxymethyl group, a hydroxyethyl group, or a hydroxycyclohexyl group.

When Y represents a nitrogen atom, R'—Y— in formula (8) is (R')(R')N—, and at that time, each R' especially preferably represents a methyl group, an ethyl group, a propyl group, a butyl group, a cyclohexyl group, a norbornyl group, a dinorbornyl group, an adamantyl group, a phenyl group, a benzyl group, a hydroxymethyl group, a hydroxyethyl group, a hydroxycyclohexyl group, a piperidinyl group, a dimethylamino group, a diethylamino group, or an acetamido group. R' may form a ring, and at that time, groups represented by any of the following formulae (8-1), (8-2) and (8-3) are exemplified as the ring.

(8-1)

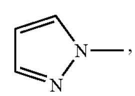

(8-2)

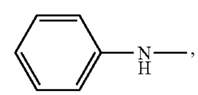

(8-3)

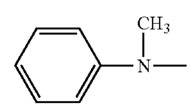

When Y represents a sulfur atom, R' especially preferably represents a methyl group, an ethyl group, a propyl group, a butyl group, a cyclohexyl group, a norbornyl group, a dinorbornyl group, an adamantyl group, a phenyl group, a benzyl group, a hydroxymethyl group, a hydroxyethyl group, or a hydroxycyclohexyl group.

As the especially preferred specific examples of R", groups represented by any of the following formulae (8-4) to (8-8) are exemplified.

(8-4)

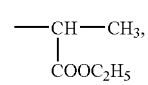

(8-5)

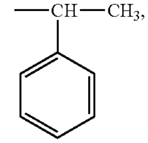

(8-6)

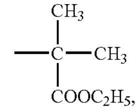

(8-7)

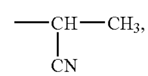

-continued (8-8)

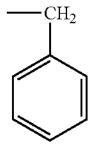

The above-shown polymerization initiators can be used in combination with thermal or photo-radical generators. As the specific examples of thermal radical generators, 2,2-azobis (isobutyronitrile), 2,2'-azobis(2-cyano-2-butane), dimethyl 2,2'-azobisdimethylisobutyrate, 4,4'-azobis(4-cyanopentanoic acid), 1,1'-azobis (cyclohexanecarbonitrile), 2-(t-butylazo)-2-cyanopropane, 2,2'-azobis[2-methyl-N-(1,1)-bis(hydroxymethyl)-2-hydroxyethyl]propionamide, 2,2'-azobis(2-methyl-N-hydroxyethyl)propionamide, 2,2'-azobis-(N,N'-dimethyleneisobutylamidine)dihydrochloride, 2,2'-azobis(2-amidinopropane)dihydrochloride, 2,2'-azobis(N,N'-dimethyleneisobutylamine), 2,2'-azobis {2-methyl-N-[1,1-bis-(hydroxymethyl)-2-hydroxyethyl]propionamide}, 2,2'-azobis-{2-methyl-N-[1,1-bis(hydroxymethyl)ethyl] propionamide}, 2,2'-azobis-[2-methyl-N-(2-hydroxyethyl) propionamide], 2,2'-azobis(isobutyramido)dihydrate, 2,2'-azobis(2,2,4-trimethylpentane), 2,2'-azobis(2-methylpropane), t-butyl-peroxyacetate, t-butylperoxybenzoate, t-butylperoxyoctoate, t-butylperoxyneodecanoate, t-butylperoxyisobutyrate, t-amylperoxypivalate, t-butylperoxypivalate, diisopropyl-peroxydicarbonate, dicyclohexylperoxydicarbonate, dicumyl peroxide, dibenzoyl peroxide, dilauroyl peroxide, potassium peroxydisulfate, ammonium peroxydisulfate, butyl di-t-hyponitrite, and dicumyl hyponitrite are exemplified.

The solvents for use in living radical polymerization include cycloalkanes, e.g., cyclohexane and cycloheptane; saturated carboxylic esters, e.g., ethyl acetate, n-butyl acetate, i-butyl acetate, methyl propionate, and propylene glycol monomethyl ether acetate; alkyllactones, e.g., γ-butyrolactone; ethers, e.g., tetrahydrofuran, dimethoxy-ethanes, and diethoxyethanes; alkyl ketones, e.g., 2-butanone, 2-heptanone, and methyl isobutyl ketone; cycloalkyl ketones, e.g., cyclohexanone; alcohols, e.g., 2-propanol and propylene glycol monomethyl ether; aromatic compounds, e.g., toluene, xylene and chlorobenzene; non-protonic polar solvents, e.g., dimethylformamide, dimethyl sulfoxide, dimethylacetamide, and N-methyl-2-pyrrolidone; and solvent-less are exemplified.

These solvents may be used alone, or two or more solvents may be used as mixture.

The reaction temperature in the above polymerization is generally from 40 to 150° C., preferably from 50 to 130° C., and the reaction time is generally from 1 to 96 hours, preferably from 1 to 48 hours.

It is preferred that each repeating unit constituting resin (C) of the invention does not form a block, and the resin is a randomly polymerized polymer.

As a means of randomly polymerizing the monomer constituting each repeating unit, it is effective to polymerize monomers forming repeating units represented by formulae (1) to (7) at a time, or by dropping the mixture of the monomers.

It is preferred that the amount of residual monomers and oligomer components of the obtained resin (C) is less than the established value, for example, 0.1 mass % by HPLC, at the same time low in impurities such as halogens or metals, by which not only sensitivity, resolution, process stability and a pattern form as a resist can further be improved but also a resist free from foreign matters in liquid and free from aging fluctuation of sensitivity can be obtained.

There are cases where resin (C) obtained by living radical polymerization has residual groups derived from the polymerization initiator at molecular chain terminals. The resin may contain the residual groups, but these residual groups can be removed by utilizing an excess radical polymerization initiator. The terminal treatment can be performed to a finished polymerization reaction product after completion of the living radical polymerization reaction, or polymer terminal processing can be carried out after purification of a once produced polymer.

Those capable of generating radicals on the condition of the treatment of molecular chain terminal groups can be used as the radical polymerization initiators. As the radical generating conditions, high energy radiation, such as heat, light, γ-rays and electron beams are exemplified.

As the examples of the radical polymerization initiators, initiators such as peroxide and azo compounds are exemplified. As the specific examples of the radical polymerization initiators, although not limitative, t-butyl hydroperoxide, t-butyl perbenzoate, benzoyl peroxide, 2,2'-azobis(2,4-dimethylvaleronitrile), 2,2'-azobisisobutyronitrile (AIBN), 1,1'-azobis(cyclohexanecarbonitrile), dimethyl-2,2'-azobisisobutyrate (MAIB), benzoin ether, and benzophenone are exemplified.

When a thermal radical polymerization initiator is used, the temperature of the processing reaction of resin terminal groups is about 20 to 200° C., preferably from 40 to 150° C., and more preferably from 50 to 100° C. The atmosphere of the reaction is inert atmosphere such as nitrogen or argon, or air atmospheric. The reaction may be performed under atmospheric pressure or under pressure. The amount of the radical polymerization initiator that can be used is, as the radical amount that the radical polymerization initiator generates, from the mols of 1 to 800% of the total mol number of the residual groups present in the polymer to be terminal-processed, preferably from the mols of 50 to 400%, more preferably from the mols of 100 to 300%, and still more preferably from the mols of 200 to 300%.

The reaction time of the terminal processing is from 0.5 to 72 hours, preferably from 1 to 24 hours, and more preferably from 2 to 12 hours. The removal of the residual groups such as thio groups from the polymer terminals is at least 50%, preferably at least 75%, more preferably 85%, and still more preferably 95%. The terminals of the polymer having been subjected to the terminal processing are replaced with novel radical seeds, for example, fragments of the radical initiator derived from the radical initiator used in the terminal processing reaction. The thus-obtained polymer has novel groups at terminals and can be used according to uses.

The residual groups derived from a polymerization initiator can also be removed by polymer terminal processing according to the methods disclosed in WO 02/090397.

In the invention, resins (C) can be used alone, or two or more resins can be used as mixture.

(D) Organic Solvent:

As the solvents that can be used for dissolving the above each component to prepare a positive resist composition, e.g., alkylene glycol monoalkyl ether carboxylate, alkylene glycol monoalkyl ether, alkyl lactate, alkyl alkoxypropionate, cyclic lactones having from 4 to 10 carbon atoms, monoketone compounds having from 4 to 10 carbon atoms which may contain a ring, alkylene carbonate, alkyl alkoxy acetate, and alkyl pyruvate can be exemplified.

As the alkylene glycol monoalkyl ether carboxylate, e.g., propylene glycol monomethyl ether acetate, propylene glycol monoethyl ether acetate, propylene glycol monopropyl ether acetate, propylene glycol monobutyl ether acetate, propylene glycol monomethyl ether propionate, propylene glycol monoethyl ether propionate, ethylene glycol monomethyl ether acetate, ethylene glycol monoethyl ether acetate are preferably exemplified.

As the alkylene glycol monoalkyl ether, e.g., propylene glycol monomethyl ether, propylene glycol monoethyl ether, propylene glycol monopropyl ether, propylene glycol monobutyl ether, ethylene glycol monomethyl ether, and ethylene glycol monoethyl ether are preferably exemplified.

As the alkyl lactate, e.g., methyl lactate, ethyl lactate, propyl lactate, and butyl lactate are preferably exemplified.

As the alkyl alkoxypropionate, e.g., ethyl 3-ethoxy-propionate, methyl 3-methoxypropionate, methyl 3-ethoxy-propionate, and ethyl 3-methoxypropionate are preferably exemplified.

As the cyclic lactones having from 4 to 10 carbon atoms, e.g., β-propiolactone, β-butyrolactone, γ-butyrolactone, α-methyl-γ-butyrolactone, β-methyl-γ-butyrolactone, γ-valerolactone, γ-caprolactone, γ-octanoic lactone, α-hydroxy-γ-butyrolactone are preferably exemplified.

As the monoketone compounds having from 4 to 10 carbon atoms which may contain a ring, e.g., 2-butanone, 3-methylbutanone, pinacolone, 2-pentanone, 3-pentanone, 3-methyl-2-pentanone, 4-methyl-2-pentanone, 2-methyl-3-pentanone, 4,4-dimethyl-2-pentanone, 2,4-dimethyl-3-pentanone, 2,2,4,4-tetramethyl-3-pentanone, 2-hexanone, 3-hexanone, 5-methyl-3-hexanone, 2-heptanone, 3-heptanone, 4-heptanone, 2-methyl-3-heptanone, 5-methyl-3-heptanone, 2,6-dimethyl-4-heptanone, 2-octanone, 3-octanone, 2-nonane, 3-nonane, 5-nonane, 2-decanone, 3-decanone, 4-decanone, 5-hexen-2-one, 3-penten-2-one, cyclopentanone, 2-methylcyclopentanone, 3-methylcyclopentanone, 2,2-dimethylcyclopentanone, 2,4,4-trimethylcyclopentanone, cyclohexanone, 3-methylcyclo-hexanone, 4-methylcyclohexanone, 4-ethylcyclohexanone, 2,2-dimethylcyclohexanone, 2,6-dimethylcyclohexanone, 2,2,6-trimethylcyclohexanone, cycloheptanone, 2-methyl-cycloheptanone, and 3-methylcycloheptanone are preferably exemplified.

As the alkylene carbonate, e.g., propylene carbonate, vinylene carbonate, ethylene carbonate, and butylene carbonate are preferably exemplified.

As the alkyl alkoxy acetate, e.g., 2-methoxyethyl acetate, 2-ethoxyethyl acetate, 2-(2-ethoxyethoxy)ethyl acetate, 3-methoxy-3-methylbutyl acetate, and 1-methoxy-2-propyl acetate are preferably exemplified.

As the alkyl pyruvate, e.g., methyl pyruvate, ethyl pyruvate, and propyl pyruvate are preferably exemplified.

Solvents having a boiling point of 130° C. or more under room temperature and atmospheric pressure are preferably used, and specifically cyclopentanone, γ-butyrolactone, cyclohexanone, ethyl lactate, ethylene glycol monoethyl ether acetate, propylene glycol monomethyl ether acetate, ethyl 3-ethoxypropionate, ethyl pyruvate, 2-ethoxyethyl acetate, 2-(2-ethoxyethoxy)ethyl acetate, and propylene carbonate are exemplified.

In the invention, these solvents may be used alone or two or more solvents may be used in combination.

In the invention, a mixed solvent comprising a solvent containing a hydroxyl group in the structure and a solvent not containing a hydroxyl group in the structure may be used as an organic solvent.

As the solvent containing a hydroxyl group, ethylene glycol, ethylene glycol monomethyl ether, ethylene glycol monoethyl ether, propylene glycol, propylene glycol monomethyl ether, propylene glycol monoethyl ether, and ethyl lactate can be exemplified. Of these solvents, propylene glycol monomethyl ether and ethyl lactate are particularly preferred.

As the solvent not containing a hydroxyl group, e.g., propylene glycol monomethyl ether acetate, ethylethoxy propionate, 2-heptanone, γ-butyrolactone, cyclohexanone, butyl acetate, N-methylpyrrolidone, N,N-dimethylacetamide, and dimethyl sulfoxide can be exemplified. Of these solvents, propylene glycol monomethyl ether acetate, ethylethoxy propionate, 2-heptanone, γ-butyrolactone, cyclohexanone, and butyl acetate are especially preferred, and propylene glycol monomethyl ether acetate, ethylethoxy propionate and 2-heptanone are most preferred.

The mixing ratio (by mass) of the solvent containing a hydroxyl group and the solvent not containing a hydroxyl group is from 1/99 to 99/1, preferably from 10/90 to 90/10, and more preferably from 20/80 to 60/40. A mixed solvent comprising 50 mass % or more of a solvent not containing a hydroxyl group is especially preferred in the point of coating uniformity.

The solvent is preferably a mixed solvent comprising two or more kinds of solvents containing propylene glycol monomethyl ether acetate.

(E) Basic Compounds:

For reducing the fluctuation of performances due to aging from exposure to heating, it is preferred for a positive resist composition of the invention to contain basic compound (E).

As preferred basic compounds, compounds having a structure represented be any of the following formulae (A) to (E) can be exemplified.

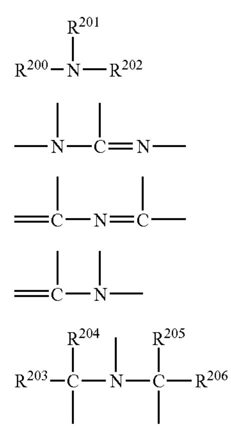

(A)
(B)
(C)
(D)
(E)

In formulae (A) to (E), $R^{200}$, $R^{201}$ and $R^{202}$, which may be the same or different, each represents a hydrogen atom, an alkyl group (preferably having from 1 to 20 carbon atoms), a cycloalkyl group (preferably having from 3 to 20 carbon atoms), or an aryl group (having from 6 to 20 carbon atoms), and $R^{201}$ and $R^{202}$ may be bonded to each other to form a ring.

The alkyl group may be unsubstituted or substituted, and as the alkyl group having a substituent, an aminoalkyl group having from 1 to 20 carbon atoms, a hydroxyalkyl group having from 1 to 20 carbon atoms, and a cyanoalkyl group having from 1 to 20 carbon atoms are preferred.

$R^{203}$, $R^{204}$, $R^{205}$ and $R^{206}$, which may be the same or different, each represents an alkyl group having from 1 to 20 carbon atoms.

These alkyl groups in formulae (A) to (E) are more preferably unsubstituted.

As preferred examples of basic compounds, guanidine, aminopyrrolidine, pyrazole, pyrazoline, piperazine, aminomorpholine, aminoalkylmorpholine, and piperidine can be exemplified. As more preferred compounds, compounds having an imidazole structure, a diazabicyclo structure, an onium hydroxide structure, an onium carboxylate structure, a trialkylamine structure, an aniline structure, or a pyridine structure, alkylamine derivatives having a hydroxyl group and/or an ether bond, and aniline derivatives having a hydroxyl group and/or an ether bond can be exemplified.

As the compounds having an imidazole structure, imidazole, 2,4,5-triphenylimidazole, and benzimidazole can be exemplified. As the compounds having a diazabicyclo structure, 1,4-diazabicyclo[2,2,2]octane, 1,5-diazabicyclo[4,3,0]nona-5-ene, and 1,8-diazabicyclo[5,4,0]undeca-7-ene can be exemplified. As the compounds having an onium hydroxide structure, triarylsulfonium hydroxide, phenacylsulfonium hydroxide, sulfonium hydroxide having a 2-oxoalkyl group, specifically triphenylsulfonium hydroxide, tris(t-butylphenyl)sulfonium hydroxide, bis(t-butylphenyl)iodonium hydroxide, phenacylthiophenium hydroxide, and 2-oxopropyl-thiophenium hydroxide can be exemplified. The compounds having an onium carboxylate structure are compounds having an onium hydroxide structure in which the anionic part is carboxylated, e.g., acetate, adamantane-1-carboxylate and perfluoroalkyl carboxylate are exemplified. As the compounds having a trialkylamine structure, tri(n-butyl)amine and tri(n-octyl)amine are exemplified. As the aniline compounds, 2,6-diisopropylaniline, N,N-dimethylaniline, N,N-dibutyl-aniline, and N,N-dihexylaniline are exemplified. As the alkylamine derivatives having a hydroxyl group and/or an ether bond, ethanolamine, diethanolamine, triethanolamine, and tris(methoxyethoxyethyl)amine are exemplified. As the aniline derivatives having a hydroxyl group and/or an ether bond, N,N-bis(hydroxyethyl)aniline is exemplified.

These basic compounds are used alone or in combination of two or more kinds.

The use amount of basic compounds is generally from 0.001 to 10 mass % based on the solids content of the positive resist composition, and preferably from 0.01 to 5 mass %.

The proportion of use amount of the acid generator to basic compound in a composition is preferably acid generator/basic compound (molar ratio) of from 2.5 to 300. That is, from the points of sensitivity and resolution, the molar ratio is preferably 2.5 or more, and in view of the restraint of the reduction of resolution by the thickening of a resist pattern due to aging from exposure to heating treatment, the molar ratio is preferably 300 or less. More preferably acid generator/basic compound (molar ratio) is from 5.0 to 200, and still more preferably from 7.0 to 150.

(F) Surfactants:

It is preferred for the positive resist composition in the invention to further contain surfactant (F), and it is more preferred to contain either one or two or more of fluorine and/or silicon surfactants (a fluorine surfactant, a silicon surfactant, a surfactant containing both a fluorine atom and a silicon atom).

By containing surfactant (F), it becomes possible for the positive resist composition in the invention to provide a resist pattern excellent in sensitivity and resolution, and low in defects in adhesion and development in using an exposure light source of 250 nm or lower, in particular, 220 nm or lower.

These fluorine and/or silicon surfactants are disclosed, e.g., in JP-A-62-36663, JP-A-61-226746, JP-A-61-226745, JP-A-62-170950, JP-A-63-34540, JP-A-7-230165, JP-A-8-62834, JP-A-9-54432, JP-A-9-5988, JP-A-2002-277862, U.S. Pat. Nos. 5,405,720, 5,360,692, 5,529,881, 5,296,330, 5,436,098, 5,576,143, 5,294,511 and 5,824,451. The commercially available surfactants shown below can also be used as they are.

As the commercially available fluorine or silicon surfactants usable in the invention, e.g., Eftop EF301 and EF303 (manufactured by Shin-Akita Kasei Co., Ltd.), Fluorad FC 430, 431 and 4430 (manufactured by Sumitomo 3M Limited), Megafac F171, F173, F176, F189, F13, F110, F177, F120, and R08 (manufactured by Dainippon Ink and Chemicals Inc.), Sarfron S-382, SC 101, 102, 103, 104, 105 and 106 (manufactured by ASAHI GLASS CO., LTD.), Troy Sol S-366 (manufactured by Troy Chemical Co., Ltd.), GF-300 and Gf-150 (manufactured by TOAGOSEI CO., LTD.), Sarfron S-393 (manufactured by SEIMI CHEMICAL CO., LTD.), Eftop EF121, EF122A, EF122B, RF122C, EF125M, EF135M, EF351, 352, EF801, EF802, and EF601 (manufactured by JEMCO INC.), PF636, PF656, PF6320 and PF6520 (manufactured by OMNOVA), and FTX-204D, 208G, 218G, 230G, 204D, 208D, 212D, 218, and 222D (manufactured by NEOS) are exemplified. In addition, polysiloxane polymer KP-341 (manufactured by Shin-Etsu Chemical Co., Ltd.) can also be used as a silicon surfactant.

In addition to these known surfactants as exemplified above, surfactants using polymers having fluoro-aliphatic groups derived from fluoro-aliphatic compounds manufactured by a telomerization method (also called a telomer method) or an oligomerization method (also called an oligomer method) can be used. Fluoro-aliphatic compounds can be synthesized by the method disclosed in JP-A-2002-90991.

As polymers having fluoro-aliphatic groups, copolymers of monomers having fluoro-aliphatic groups and (poly(oxyalkylene)) acrylate and/or (poly(oxyalkylene)) methacrylate are preferred, and they may be distributed at random or may be block copolymerized. As the poly(oxyalkylene) groups, a poly(oxyethylene) group, a poly(oxypropylene) group, and a poly(oxybutylene) group are exemplified. Further, the polymers may be units having alkylenes different in chain length in the same chain length, such as a block combination of poly(oxyethylene and oxypropylene and oxyethylene), and a block combination of poly(oxyethylene and oxypropylene). In addition, copolymers of monomers having fluoro-aliphatic groups and poly(oxyalkylene)acrylate (or methacrylate) may be not only bipolymers but also terpolymers or higher polymers obtained by copolymerization of monomers having different two or more kinds of fluoro-aliphatic groups or different two or more kinds of poly(oxyalkylene)acrylates (or methacrylates) at the same time.

For example, as commercially available surfactants, Megafac F178, F470, F473, F475, F476 and F472 (manufactured by Dainippon Ink and Chemicals Inc.) can be exemplified. Further, copolymers of acrylate (or methacrylate) having a $C_6F_{13}$ group and poly(oxyalkylene)acrylate (or methacrylate), and copolymers of acrylate (or methacrylate) having a $C_3F_7$ group, poly(oxyethylene)acrylate (or methacrylate), and poly(oxypropylene)acrylate (or methacrylate) are exemplified.

In the invention, surfactants other than fluorine and/or silicon surfactants can also be used. Specifically, nonionic surfactants, such as polyoxyethylene alkyl ethers, e.g., polyoxyethylene lauryl ether, polyoxyethylene stearyl ether, polyoxyethylene cetyl ether, polyoxyethylene oleyl ether, etc., polyoxyethylene alkylallyl ether, e.g., polyoxyethylene octylphenol ether, polyoxyethylene nonylphenol ether, etc., polyoxyethylene-polyoxypropylene block copolymers, sorbitan fatty acid esters, e.g., sorbitan monolaurate, sorbitan monopalmitate, sorbitan monostearate, sorbitan monooleate, sorbitan trioleate, sorbitan tristearate, etc., and polyoxyethylene sorbitan fatty acid esters, e.g., polyoxy-ethylene sorbitan monolaurate, polyoxyethylene sorbitan monopalmitate, polyoxyethylene sorbitan monostearate, polyoxyethylene sorbitan trioleate, polyoxyethylene sorbitan tristearate, etc., can be exemplified.

These surfactants may be used alone or may be used in combination of some kinds.

The amount of surfactants (F) is preferably in proportion of from 0.01 to 10 mass % based on all the amount of the positive resist composition (excluding solvents), and more preferably from 0.1 to 5 mass %.

(G) Carboxylic Acid Onium Salt:

The positive resist composition in the invention may further contain carboxylic acid onium salt (G). As the carboxylic acid onium salt, carboxylic acid sulfonium salt, carboxylic acid iodonium salt, carboxylic acid ammonium salt, etc., can be exemplified. As carboxylic acid onium salt (G), iodonium salt and sulfonium salt are especially preferred. It is preferred that the carboxylate residue of carboxylic acid onium salt (G) of the invention does not contain an aromatic group and a carbon-carbon double bond. An especially preferred anion moiety is a straight chain or branched, monocyclic or polycyclic alkylcarboxylate anion having from 1 to 30 carbon atoms, and the carboxylate anion in which a part or all of the alkyl groups are substituted with fluorine atoms is more preferred. An oxygen atom may be contained in the alkyl chain, by which the transparency to the lights of 220 nm or less is ensured, sensitivity and resolution are enhanced, and condensation and rarefaction dependency and exposure margin are improved.

As fluorine-substituted carboxylate anions, anions of fluoroacetic acid, difluoroacetic acid, trifluoroacetic acid, pentafluoropropionic acid, heptafluorobutyric acid, nonafluoropentanoic acid, perfluorododecanoic acid, perfluorotridecanoic acid, perfluorocyclohexanecarboxylic acid, 2,2-bistrifluoromethylpropionic acid, etc., are exemplified.

These carboxylic acid onium salts (G) can be synthesized by reacting sulfonium hydroxide, iodonium hydroxide, or ammonium hydroxide and carboxylic acid with silver oxide in an appropriate solvent.

The content of carboxylic acid onium salt (G) in a composition is generally from 0.1 to 20 mass % to all the solids content of the composition, preferably from 0.5 to 10 mass %, and more preferably from 1 to 7 mass %.

(H) Other Additives:

If necessary, dyes, plasticizers, photosensitizers, light absorbers, alkali-soluble resins, dissolution inhibitors, and compounds for accelerating solubility in a developing solution (e.g., phenolic compounds having a molecular weight of 1,000 or less, alicyclic or aliphatic compounds having a carboxyl group) may further be added to the positive resist composition in the present invention.

Such phenolic compounds having a molecular weight of 1,000 or less can be easily synthesized with referring to the methods disclosed, e.g., in JP-A-4-122938, JP-A-2-28531, U.S. Pat. No. 4,916,210, and EP 219294.

As the specific examples of the alicyclic or aliphatic compounds having a carboxyl group, carboxylic acid derivatives having a steroid structure, e.g., cholic acid, deoxycholic acid, and lithocholic acid, adamantanecarboxylic acid derivatives, adamantanedicarboxylic acid, cyclohexanecarboxylic acid, cyclohexanedicarboxylic acid, etc., are exemplified, but the invention is not limited to these compounds.

(I) Pattern-Forming Method:

From the improvement of resolution, the positive resist composition in the invention is preferably used in a film thickness of from 30 to 250 nm, and more preferably from 30 to 200 nm of film thickness. Such a film thickness can be obtained by setting the concentration of solids content in the positive resist composition in a proper range having appropriate viscosity to thereby improve a coating property and a film-forming property.

The concentration of solids content in the positive resist composition is generally from 1 to 10 mass %, more preferably from 1 to 8.0 mass %, and still more preferably from 1.0 to 6.0 mass %.

The positive resist composition in the invention is used by dissolving the above components in a prescribed organic solvent, preferably in a mixed solvent as described above, filtering the resulting solution through a filter, and coating the solution on a prescribed support as follows. Filters for filtration are preferably made of polytetrafluoroethylene, polyethylene or nylon having a pore diameter of preferably 0.1 μm or less, more preferably 0.05 μm or less, and still more preferably 0.03 μm or less.

For example, a positive resist composition is coated on a substrate such as the one used in the manufacture of precision integrated circuit elements (e.g., silicon/silicon dioxide coating) by an appropriate coating method with a spinner or a coater and dried to form a photosensitive film. Incidentally, a known antireflection film may be coated on a substrate in advance.

The photosensitive film is then irradiated with actinic ray or radiation through a prescribed mask, and the exposed film is preferably subjected to baking (heating), and then development and rinsing, whereby a good pattern can be obtained.

As actinic rays or radiation, infrared rays, visible rays, ultraviolet rays, far ultraviolet rays, X-rays and electron beams can be exemplified, preferably far ultraviolet rays of wavelengths of 250 nm or less, more preferably 220 nm or less, and especially preferably from 1 to 200 nm. Specifically, a KrF excimer laser (248 nm), an ArF excimer laser (193 nm), an $F_2$ excimer laser (157 nm), X-rays and electron beams are exemplified, and an ArF excimer laser, an $F_2$ excimer laser, EUV (13 nm), and electron beams are preferably used.

Prior to formation of a resist film, an antireflection film may be coated on a substrate in advance.

As antireflection films, an inorganic film type, e.g., titanium, titanium dioxide, titanium nitride, chromium oxide, carbon, and amorphous silicon, and an organic film type comprising a light absorber and a polymer material are exemplified, and any of these materials can be used. As the organic antireflection films, commercially available organic antireflection films such as DUV30 series and DUV-40 series (manufactured by Brewer Science), AR-2, AR-3 and AR-5 (manufactured by Shipley Company LLC), etc., are exemplified and any of these products can also be used.

In a development process, an alkali developer is used as follows. As the alkali developer of a resist composition, alkali aqueous solutions of inorganic alkalis, e.g., sodium hydroxide, potassium hydroxide, sodium carbonate, sodium silicate, sodium metasilicate, aqueous ammonia, etc., primary amines, e.g., ethylamine, n-propylamine, etc., secondary amines, e.g., diethylamine, di-n-butylamine, etc., tertiary amines, e.g., triethylamine methyldiethylamine, etc., alcohol amines, e.g., dimethylethanolamine, triethanolamine, etc., quaternary ammonium salts, e.g., tetramethylammonium hydroxide, tetraethylammonium hydroxide, etc., and cyclic amines, e.g., pyrrole, piperidine, etc., can be used.

An appropriate amount of alcohols and surfactants may be added to these alkali developers.

The alkali concentration of alkali developers is generally from 0.1 to 20 mass %.

The pH of alkali developing solutions is generally from 10.0 to 15.0.

Further, an appropriate amount of alcohols and surfactants may be added to the alkali aqueous solution.

Pure water can also be used as a rinsing liquid and an appropriate amount of surfactant may be added to a rinsing liquid.

After development process or rinsing process, a process to remove the developing solution or rinsing liquid on the pattern can be performed with a supercritical fluid.

The positive resist composition in the invention may be applied to a multilayer resist process (in particular, three-layered resist process). A multilayer resist method includes the following processes.

(a) A lower resist layer comprising organic materials is formed on the substrate to be processed.

(b) An intermediate layer and an upper resist layer comprising organic materials capable of crosslinking or decomposing upon irradiation with radiation are laminated on the lower resist layer in order.

(c) After a prescribed pattern is formed on the upper resist layer, the intermediate layer, the lower layer and the substrate are subjected to etching in order.

As the intermediate layer, organopolysiloxane (a silicone resin) or an $SiO_2$ coating solution (SOG) is generally used. As the lower resist, a proper organic polymer film is used, but various well-known photoresists may be used. For example, each series of FH series and FHi series (manufactured by Fuji Film Arch Chemicals, Inc.), and PFI series (manufactured by Sumitomo Chemical Co., Ltd.) can be exemplified.

The thickness of the lower resist layer is preferably from 0.1 to 4.0 μm, more preferably from 0.2 to 2.0 μm, and especially preferably from 0.25 to 1.5 μm. The thickness of 0.1 μm or more is preferred in the point of an antireflection property and dry etching resistance, and 4.0 μm or less is preferred from the viewpoint of aspect ratio, and prevention of falling down of the pattern of a formed micro pattern.

At the time of irradiation with actinic ray or radiation, exposure (immersion exposure) may be performed by filling a liquid (an immersion medium) having higher refractive index than that of air between a resist film and a lens, by which resolution can be raised. As the immersion medium, any liquids can be used so long as they are liquids higher in refractive index than air, but pure water is preferred. An overcoat layer may further be provided on a photosensitive film so that an immersion medium and the photosensitive film are not directly touched in performing immersion exposure, by which the elution of the composition from the photosensitive film to the immersion medium is restrained and development defect can be reduced.

An immersion liquid for use in immersion exposure is described below.

An immersion liquid having a temperature coefficient of refractive index as small as possible is preferred so as to be transparent to the exposure wavelength and to hold the distortion of optical image reflected on the resist to the minimum. In particular, when the exposure light source is an ArF excimer laser (wavelength: 193 nm), it is preferred to use water as the immersion liquid for easiness of availability and easy handling property, in addition to the above points.

Further, in view of the improvement of refractive index, a medium having a refractive index of 1.5 or more can also be used, e.g., an aqueous solution and an organic solvent can be used as the medium.

When water is used as an immersion liquid, to reduce the surface tension of water and to increase the surface activity, a trace amount of additive (a liquid) that does not dissolve the resist layer on a wafer and has a negligible influence on the optical coating of the lower surface of a lens may be added. As the additive, aliphatic alcohols having a refractive index almost equal to the refractive index of water is preferred, specifically methyl alcohol, ethyl alcohol and isopropyl alcohol are exemplified. By the addition of an alcohol having a refractive index almost equal to that of water, even if the alcohol component in water is evaporated and the concentration of the content is changed, the fluctuation of the refractive index of the liquid as a whole can be made extremely small. On the other hand, when substances opaque to the light of 193 nm or impurities largely different from water in a refractive index are mixed, these substances bring about the distortion of the optical image reflected on the resist. Accordingly, the water used is preferably distilled water. Further, pure water filtered through an ion exchange filter may be used.

The electric resistance of water is preferably 18.3 MΩ·cm or higher, and TOC (organic substance concentration) is preferably 20 ppb or lower. Further, it is preferred that water has been subjected to deaeration treatment.

It is possible to heighten lithographic performance by increasing the refractive index of an immersion liquid. From such a point of view, additives capable of heightening a refractive index may be added to water, or heavy water ($D_2O$) may be used in place of water.

By the addition of resin (C) to a photosensitive film formed of the photosensitive composition of the invention, resin (C) is unevenly distributed on the surface layer of the photosensitive film. When water is used as the immersion medium, the sweepback contact angle of the surface of the photosensitive film formed of the photosensitive composition to water is improved, and following ability of immersion water can be improved.

Resin (C) is unevenly distributed at interface as described above, and, unlike surfactant (F), need not necessarily contain a hydrophilic group in the molecule, and may not contribute to uniform blending of polar and non-polar substances.

The resist composition in the invention as formed to a resist film has the sweepback contact angle of water to the resist film of preferably 70° or more. Here, the sweepback contact angle is the angle under normal temperature and atmospheric pressure. The sweepback contact angle is the going back contact angle at the time when a resist film is inclined and a droplet begins to drop.

A film that is hardly soluble in an immersion liquid (hereinafter also referred to as "topcoat") may be provided between a positive resist film comprising the positive resist composition of the invention and an immersion liquid so as to prevent the resist film from touching the immersion liquid directly. The necessary functions required of a topcoat are aptitude for coating on the upper layer of a resist, the transparency to radiation, particularly the transparency to light of 193 nm, and the insolubility in an immersion liquid. It is preferred that a topcoat is not mixed with a resist and capable of being coated uniformly on a resist upper layer.

From the viewpoint of the transparency to 193 nm, polymers not containing aromatic groups are preferred as a topcoat. Specifically, hydrocarbon polymers, acrylic ester polymers, polymethacrylic acid, polyacrylic acid, polyvinyl ether, silicon-containing polymers and fluorine-containing polymers are exemplified. Resin (C) may be used as a topcoat. Considering that impurities eluting from a topcoat to an immersion liquid soil an optical lens, the residual monomer components of the polymer contained in a topcoat is preferably less.

When a topcoat is peeled, a developing solution may be used, or a remover may be used separately. As the remover, solvents low in osmosis into a resist are preferred. In view of capable of performing peeling process at the same time with the development process of a resist, peeling by an alkali developer is preferred. From the viewpoint of performing peeling by an alkali developer, a topcoat is preferably acidic, but from the point of non-intermixture with a resist, a topcoat may be neutral or alkaline.

Resolution increases when there is no difference in the refractive indexes between a topcoat and an immersion liquid. When water is used as the immersion liquid in an ArF excimer laser (wavelength: 193 nm) exposure light source, it is preferred that the refractive index of the topcoat for ArF immersion exposure is preferably near the refractive index of the immersion liquid. For bringing the refractive index of the topcoat near to that of the immersion liquid, it is preferred for the topcoat to contain a fluorine atom. Further, from the viewpoint of the transparency and refractive index, the topcoat is preferably a thin film.

It is preferred that a topcoat should not be mixed with a resist, and further not mixed with an immersion liquid. From this point of view, when water is used as the immersion liquid, the solvent of the topcoat is preferably a medium that is hardly soluble in the solvent of the resist and non-water-soluble. Further, when the immersion liquid is an organic solvent, the topcoat may be water-soluble or non-water-soluble.

Example 1

The invention will be described in further detail with reference to specific examples, but the invention should not be construed as being restricted thereto.

Synthetic Example 1

Synthesis of Resin (1)

Under nitrogen current, 8.6 g of cyclohexanone is put in a three-neck flask and heated at 80° C. A solution obtained by dissolving 9.8 g of 2-adamantylisopropyl methacrylate, 4.4 g of dihydroxyadamantyl methacrylate, 8.9 g of norbornanelactone methacrylate, and a polymerization initiator V-601 (manufactured by Wako Pure Chemical Industries) in an amount of 8 mol % based on the monomer in 79 g of cyclohexanone is dripped into the flask over 6 hours. After finishing dripping, the solution is further reacted at 80° C. for 2 hours. After allowing the reaction solution to cool, the reaction solution is dripped into a mixed solution of 800 ml of hexane and 200 ml of ethyl acetate over 20 minutes, and the precipitated powder is filtered out and dried to obtain 19 g of resin (1). The weight average molecular weight as the standard polystyrene equivalent of the obtained resin is 8,800, and the degree of dispersion (Mw/Mn) is 1.9.

The structures of acid-decomposable resin (A) for use in the examples are shown below. In the following Table 1, the molar ratio of repeating unit (from the left hand in order) in each resin, weight average molecular weight, and the degree of dispersion are shown.

TABLE 1

(1)

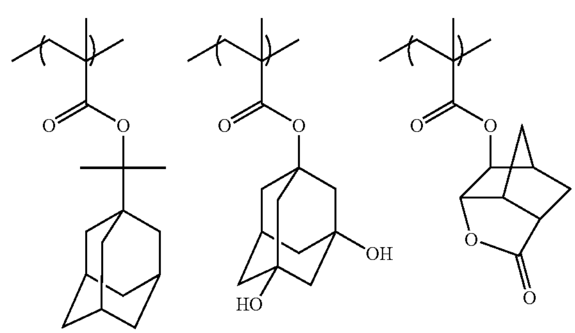

(2)

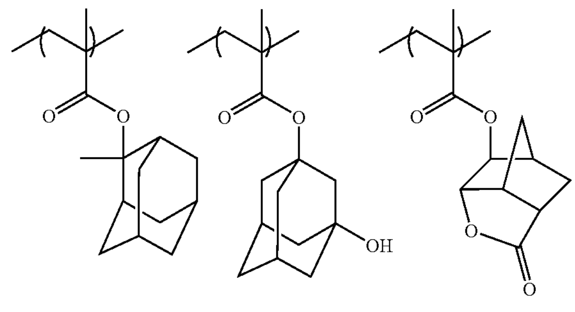

TABLE 1-continued
(3)
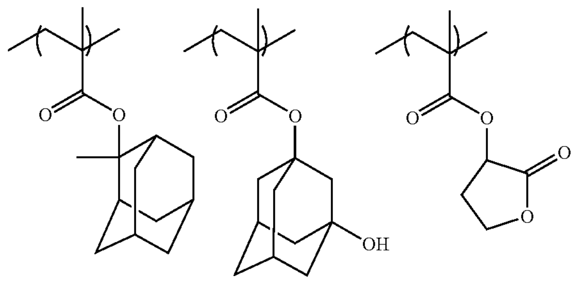
(4)
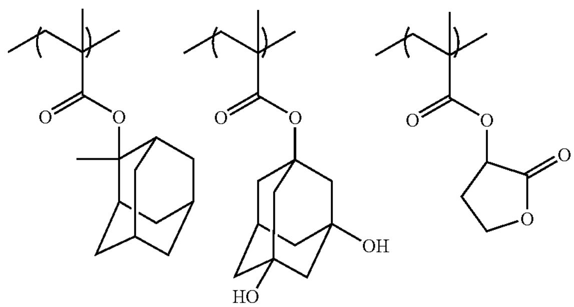
(5)
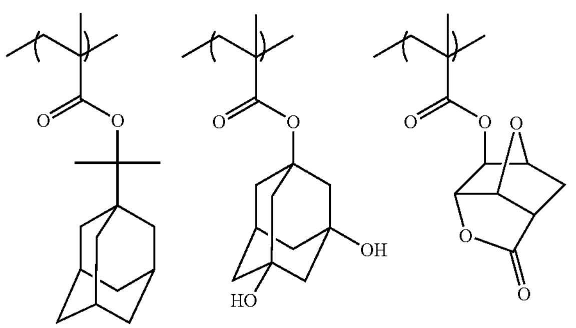
(6)
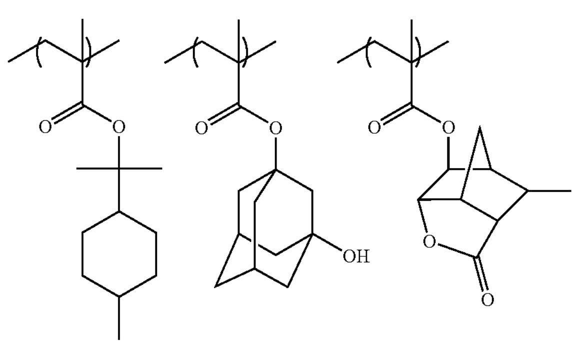

TABLE 1-continued
(7)
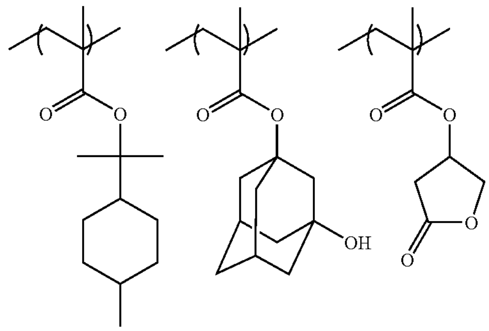
(8)
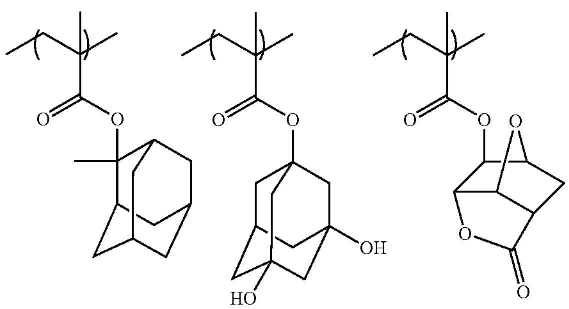
(9)
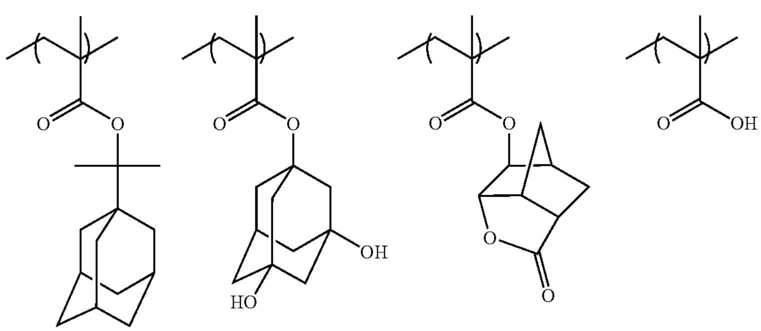
(10)
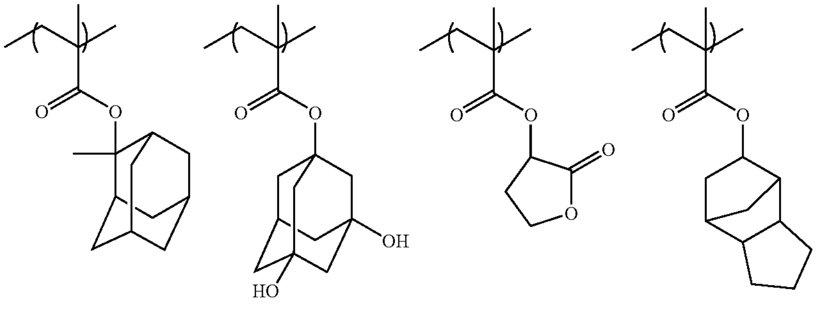

TABLE 1-continued
(11)
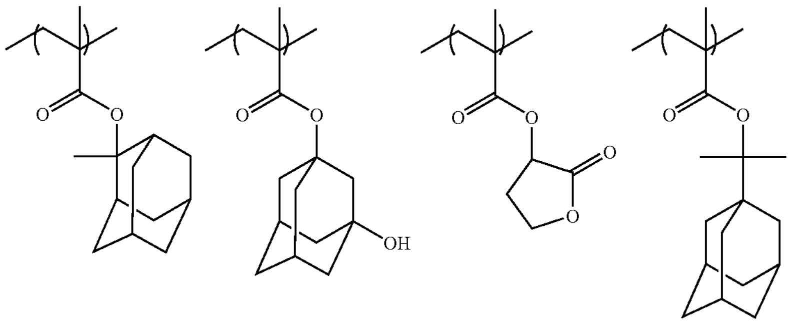
(12)
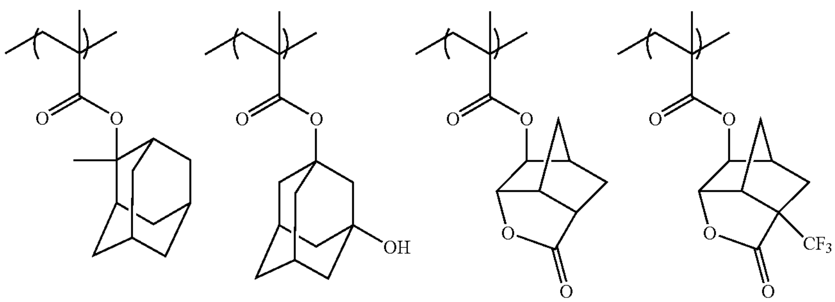
(13)
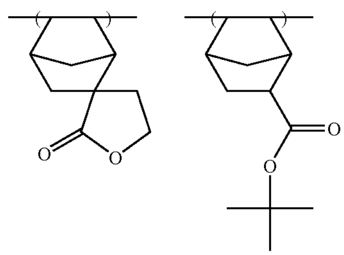
(14)
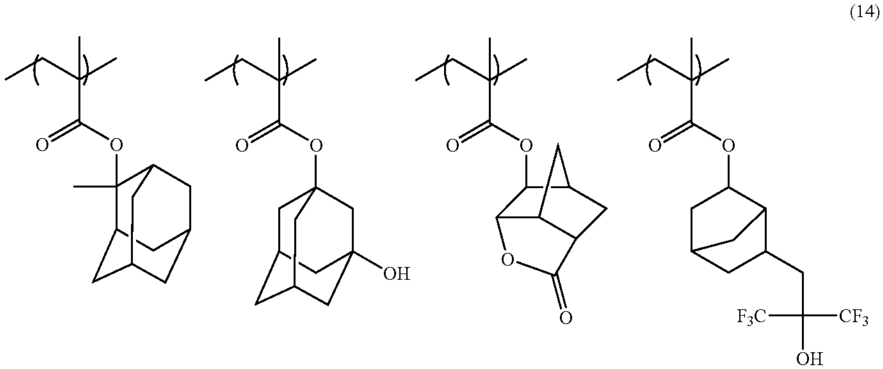

TABLE 1-continued
(15)
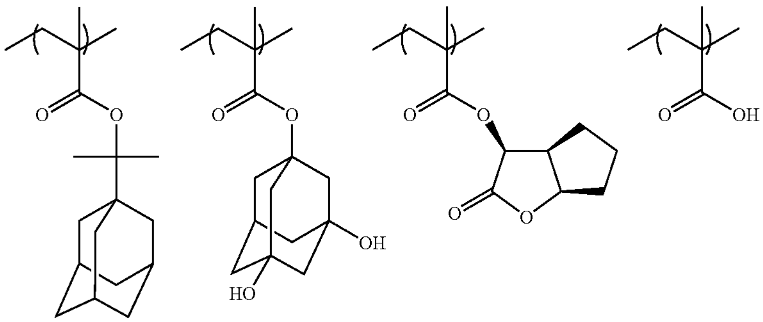
(16)
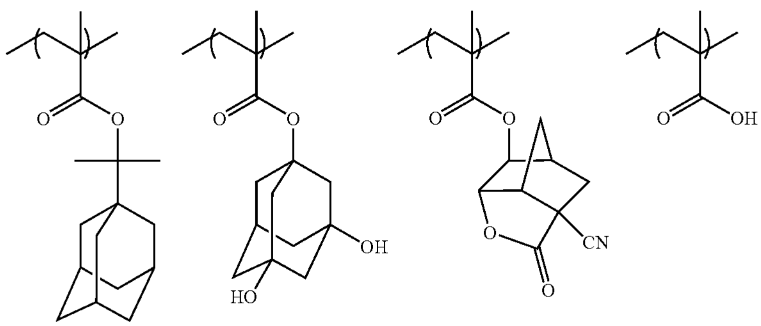
(17)
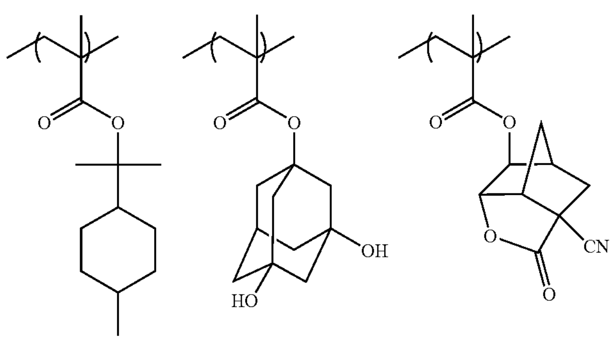
(18)
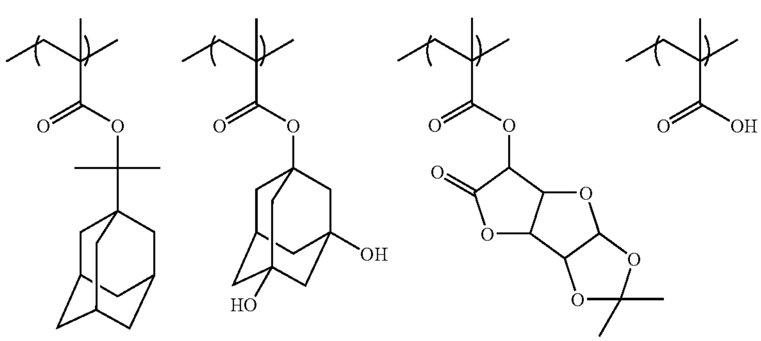

TABLE 1-continued
(19)
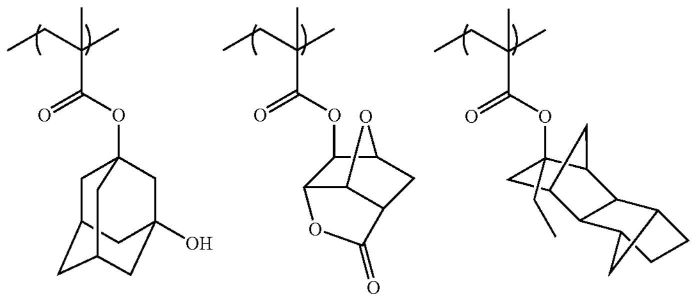
(20)
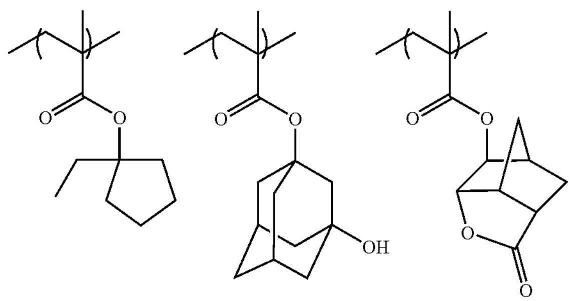
(21)
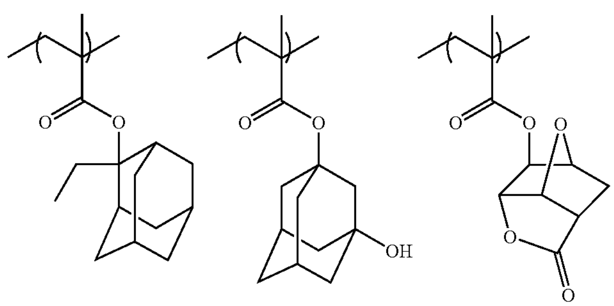
(22)
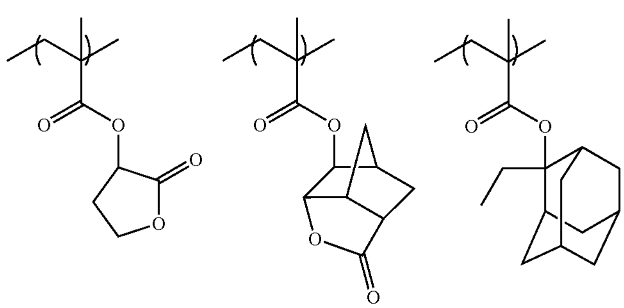

TABLE 1-continued
(23)
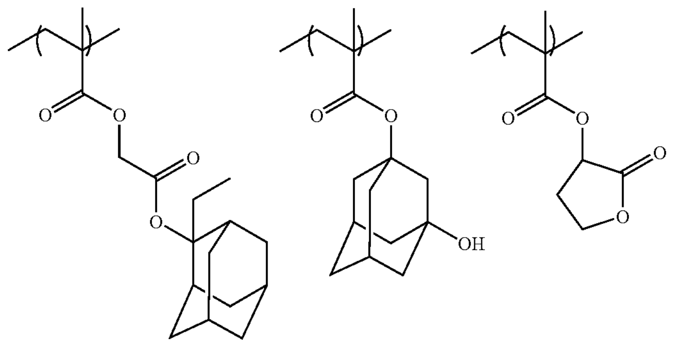
(24)
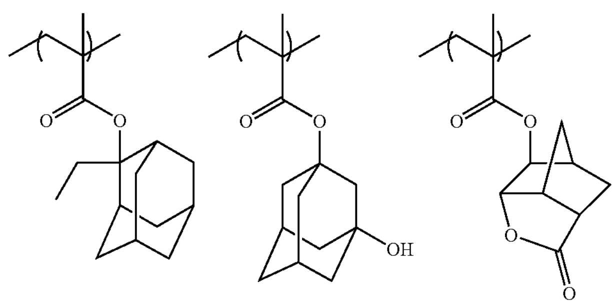
(25)
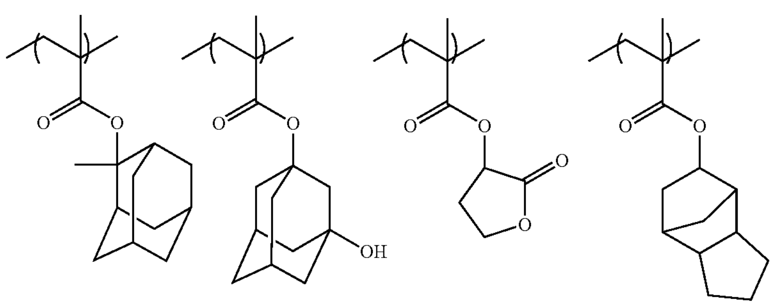
| Resin | Composition | Mw | Mw/Mn |
|---|---|---|---|
| 1 | 50/10/40 | 8,800 | 1.9 |
| 2 | 40/22/38 | 12,000 | 2.0 |
| 3 | 34/33/33 | 11,000 | 2.3 |
| 4 | 45/15/40 | 10,500 | 2.1 |
| 5 | 30/25/45 | 8,400 | 2.3 |
| 6 | 39/20/41 | 10,500 | 2.1 |
| 7 | 49/10/41 | 9,500 | 2.5 |
| 8 | 35/32/33 | 14,000 | 2.6 |
| 9 | 40/20/35/5 | 12,500 | 2.4 |
| 10 | 40/15/40/5 | 10,000 | 1.8 |
| 11 | 40/15/40/5 | 9,800 | 2.3 |
| 12 | 35/20/40/5 | 6,100 | 2.3 |
| 13 | 50/50 | 5,200 | 2.1 |
| 14 | 30/30/30/10 | 8,600 | 2.5 |
| 15 | 40/20/35/5 | 12,000 | 2.1 |
| 16 | 30/20/40/10 | 8,000 | 2.0 |
| 17 | 40/10/50 | 6,000 | 1.8 |
| 18 | 30/20/40/10 | 8,500 | 1.5 |
| 19 | 30/40/30 | 9,500 | 1.9 |
| 20 | 40/10/50 | 7,700 | 1.7 |
| 21 | 35/30/35 | 9,800 | 1.8 |
| 22 | 25/25/50 | 8,800 | 1.8 |
| 23 | 50/25/25 | 6,500 | 1.6 |
| 24 | 50/30/20 | 10,000 | 1.9 |
| 25 | 40/20/20/20 | 6,400 | 1.7 |

Synthesizing Method A

Synthesis of Resin (C-20) (Radical Polymerization):

Hexafluoroisopropyl acrylate (4.44 g) (manufactured by Wako Pure Chemical Industries) is dissolved in propylene glycol monomethyl ether acetate to obtain 16.0 g of a solution having solid content concentration of 20%. To the obtained solution is added 2 mol % (0.0921 g) of a polymerization initiator V-601 (manufactured by Wako Pure Chemical Industries), and the mixed solution is dripped into 1.78 g of propylene glycol monomethyl ether acetate heated at 80° C. under nitrogen current over 3 hours. After finishing dripping, the reaction solution is stirred for 2 hours to obtain reaction solution (1). After termination of the reaction, reaction solution (1) is cooled to room temperature, and then dripped into a mixed solvent of methanol/water (1/2) of 20 times in amount. A separated oily compound is recovered by decantation to obtain objective resin (1).

The weight average molecular weight of the resin as the standard polystyrene equivalent found by GPC measurement is 8,000, and the degree of dispersion is 1.8.

Synthesizing Method B

Synthesis of Resin (C-20) (Solvent Fraction 1):

Resin (1) (20 g) is dissolved in 180 g of tetrahydrofuran, and the resulting solution is put into 200 g of a mixed solvent of hexane/ethyl acetate (90/10). The upper layer solution is eliminated by decantation, a separated oily compound is recovered and again dissolved in 120 ml of THF, and the solution is dripped into a mixed solvent of hexane/ethyl acetate (90/10) of 10 times in amount to thereby obtain objective resin (C-20).

The weight average molecular weight of the resin as the standard polystyrene equivalent found by GPC measurement is 7,000, and the degree of dispersion is 1.4.

Synthesizing Method B'

Synthesis of Resin (C-20) (Solvent Fraction 2):

Resin (1) (20 g) is dissolved in 180 g of methanol, and the resulting solution is put into 200 g of a mixed solvent of methanol/water (1/1). The upper layer solution is eliminated by decantation, a separated oily compound is recovered and again dissolved in 120 ml of THF, and the solution is dripped into a mixed solvent of methanol/water (1/1) of 10 times in amount to thereby obtain objective resin (C-20).

The weight average molecular weight of the resin as the standard polystyrene equivalent found by GPC measurement is 6,000, and the degree of dispersion is 1.3.

Synthesizing Method C

Synthesis of Resin (C-20) (Living Radical Polymerization):

Hexafluoroisopropyl acrylate (14.44 g) (manufactured by Wako Pure Chemical Industries), 58 g of t-butylbenzene, 0.1078 g of polymerization initiator V-601 (manufactured by Wako Pure Chemical Industries), and 0.319 g of the compound shown below are mixed in advance. The solution is stirred at 90° C. for 9 hours in the presence of nitrogen. After finishing stirring, the polymer solution is allowed to cool to 30° C. or lower. After that, 1.078 g of V-601 is added to the polymer solution, heated to 80° C. with stirring for 8 hours to effect terminal treatment. After termination of the reaction, the solution is allowed to cool to 30° C. or lower, and then dripped into 1,200 ml of a mixed solvent of methanol/water (1/2). A separated oily compound is recovered by decantation and dried at 40° C. for 12 hours to obtain objective resin (1).

The weight average molecular weight of the resin as the standard polystyrene equivalent found by GPC measurement is 6,000, and the degree of dispersion is 1.2.

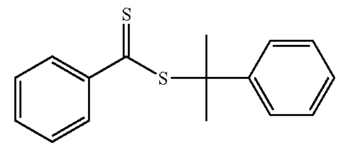

Other resins are also synthesized in the same manner. The structural formulae of resins (C-1) to (C-70) are shown below. In the following Table 2, the molar ratio of repeating unit (corresponding to each repeating unit from the left hand in order) in each resin, the weight average molecular weight, the degree of dispersion, the form, and the glass transition temperature are shown.

TABLE 2

(C-1)

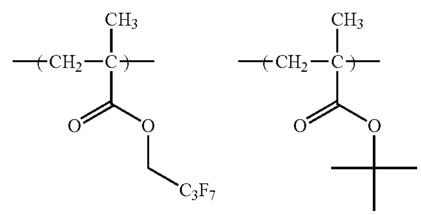

(C-2)

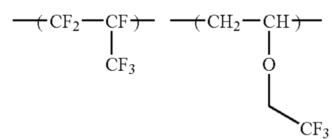

(C-3)

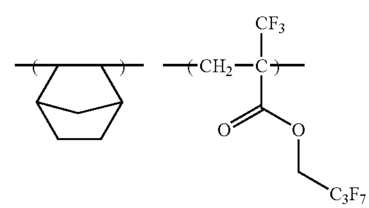

(C-4)

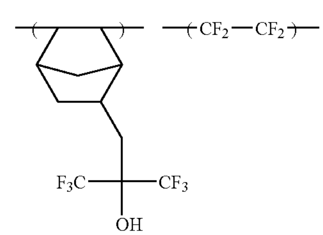

(C-5)

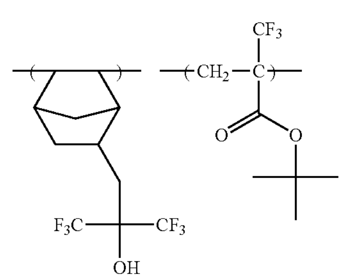

TABLE 2-continued
(C-6)
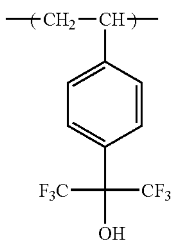
(C-7)
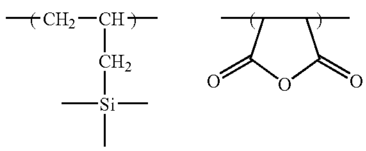
(C-8)
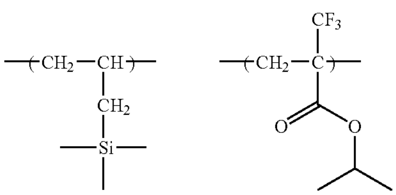
(C-9)
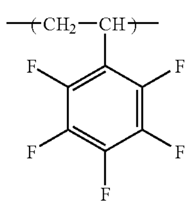
(C-10)
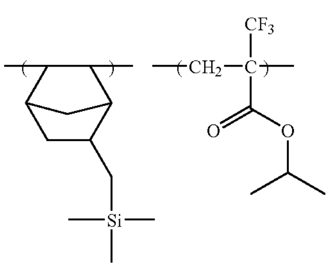
(C-11)
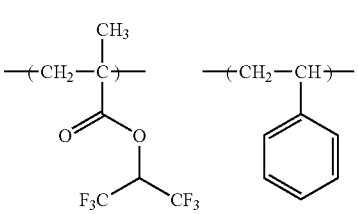
TABLE 2-continued
(C-12)
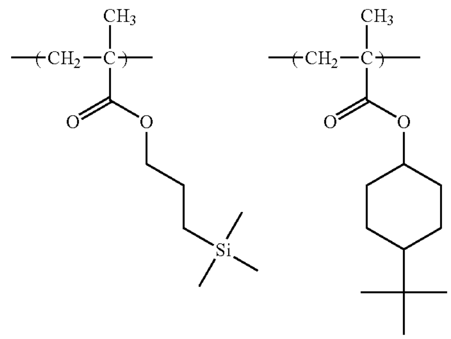
(C-13)
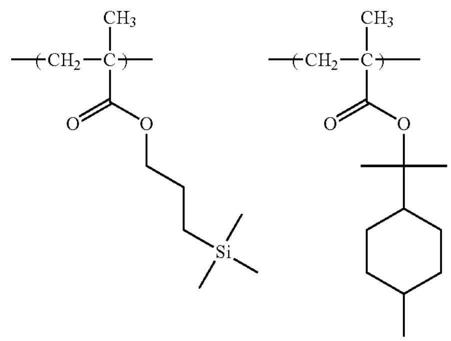
(C-14)
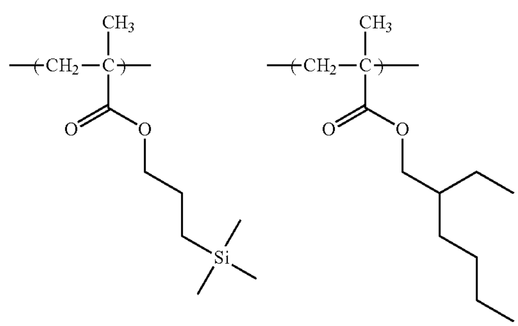
(C-15)
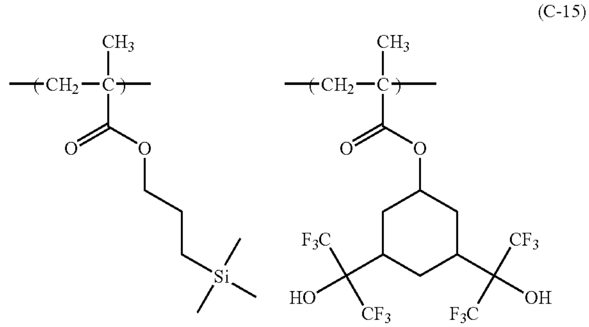

TABLE 2-continued
(C-16)
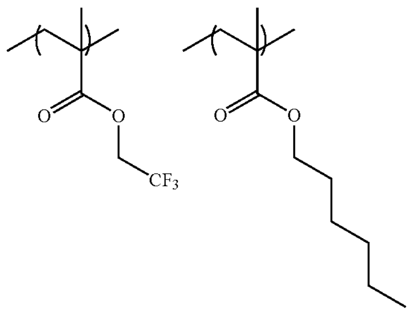
(C-17)
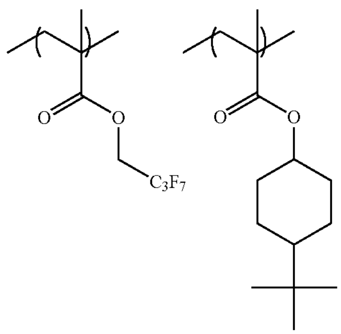
(C-18)
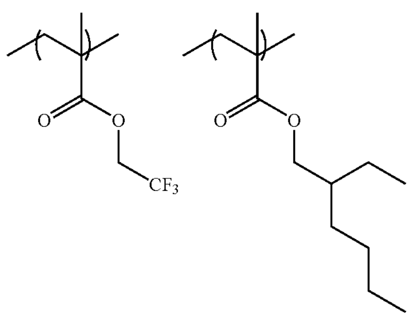
(C-19)
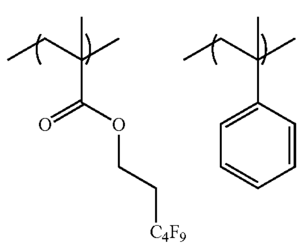
(C-20)
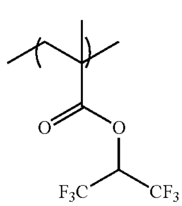
TABLE 2-continued
(C-21)
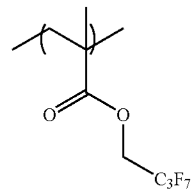
(C-22)
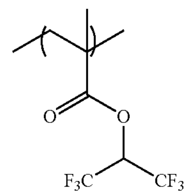
(C-23)
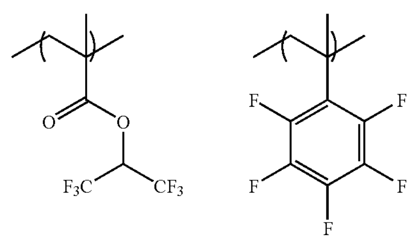
(C-24)
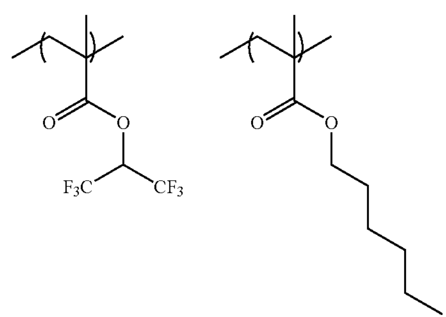
(C-25)
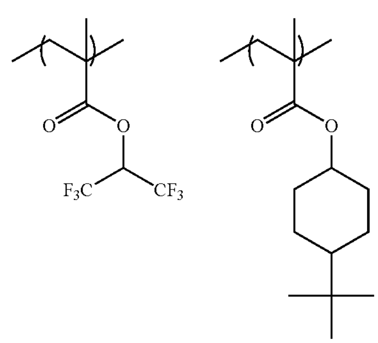

TABLE 2-continued
(C-26)
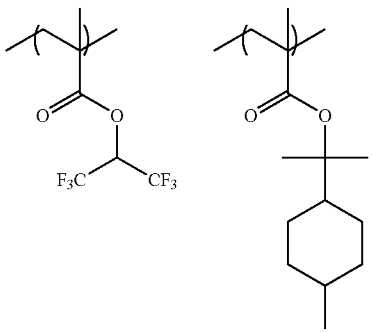
(C-27)
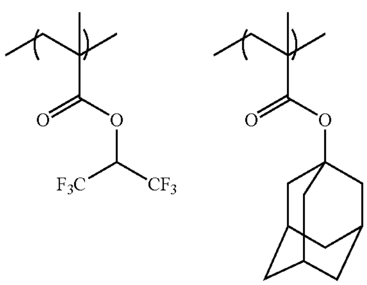
(C-28)
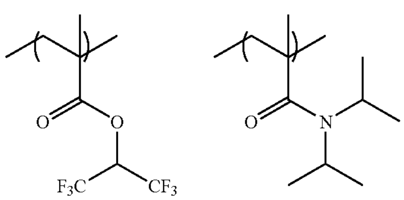
(C-29)
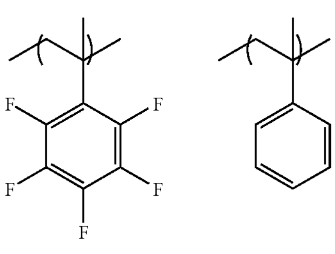
(C-30)
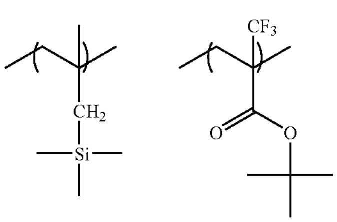
TABLE 2-continued
(C-31)
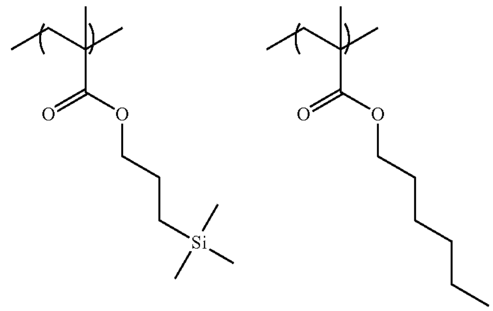
(C-32)
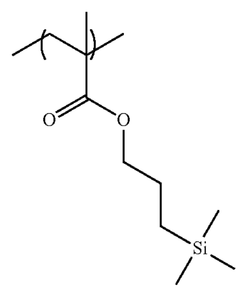
(C-33)
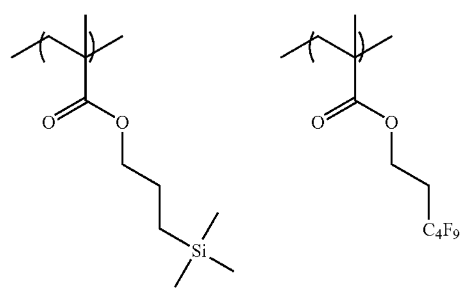
(C-34)
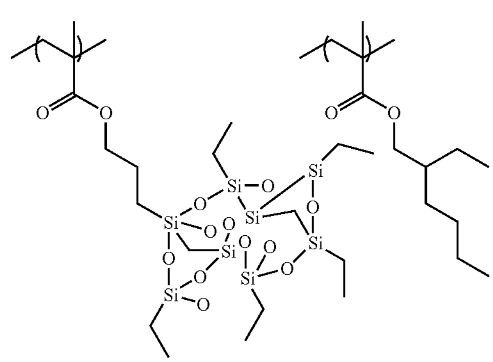

TABLE 2-continued
(C-35)
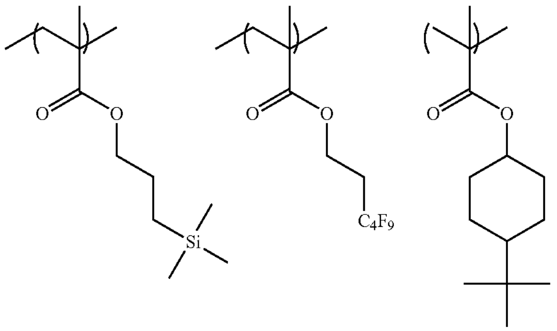
(C-36)
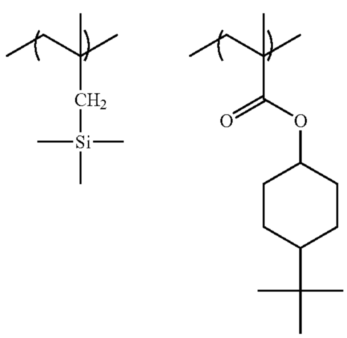
(C-37)
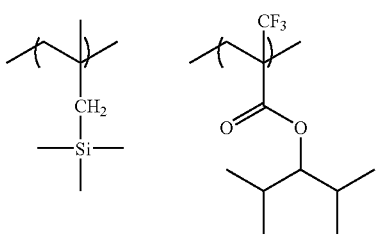
(C-38)
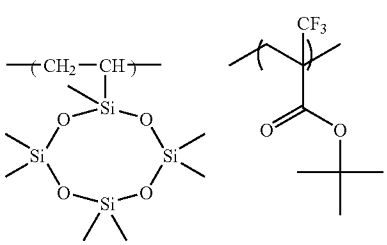
(C-39)
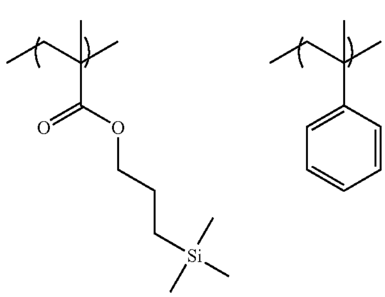
TABLE 2-continued
(C-40)
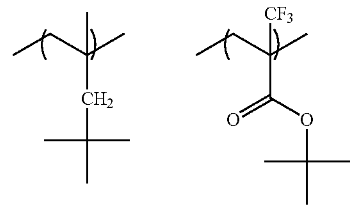
(C-41)
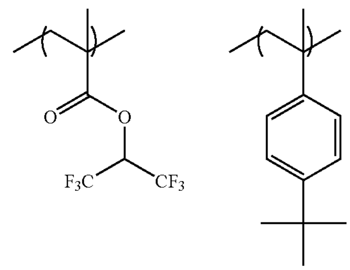
(C-42)
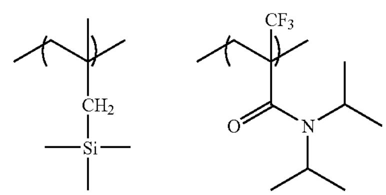
(C-43)
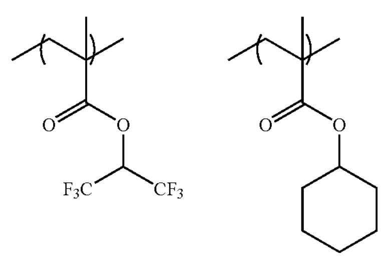
(C-44)
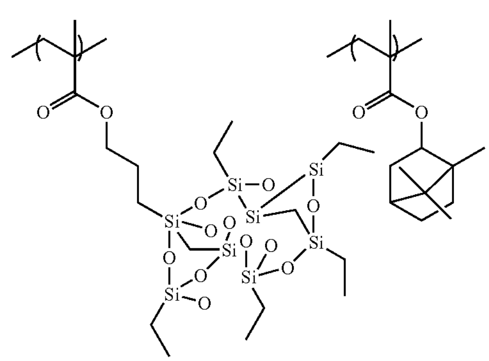

TABLE 2-continued
(C-45)
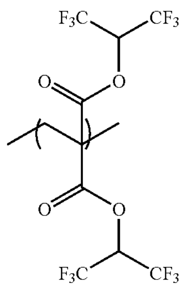
(C-46)
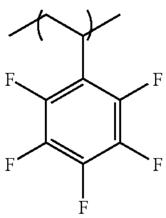
(C-47)
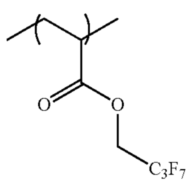
(C-48)
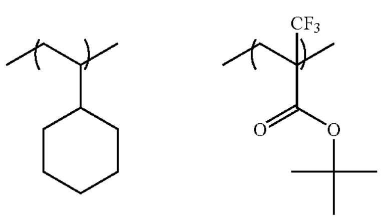
(C-49)
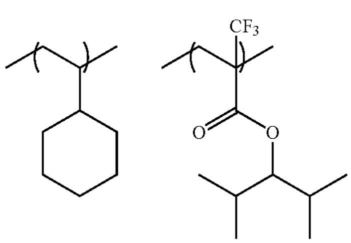
(C-50)
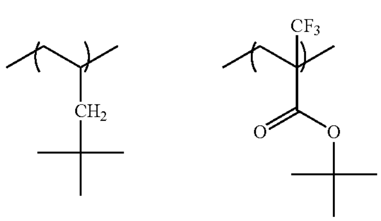
TABLE 2-continued
(C-51)
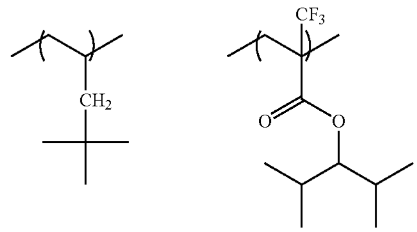
(C-52)
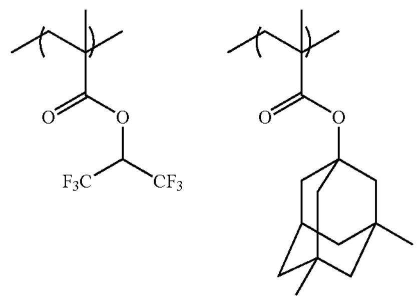
(C-53)
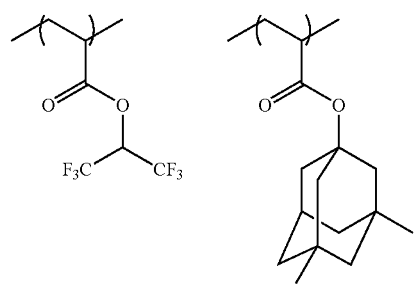
(C-54)
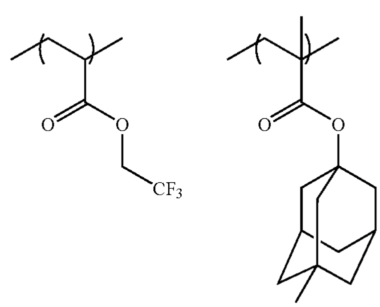
(C-55)
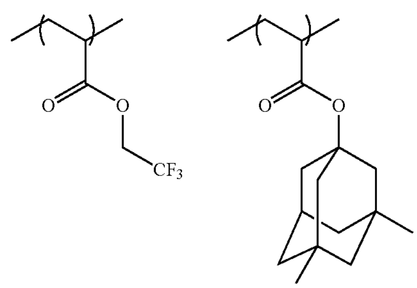

TABLE 2-continued
(C-56)
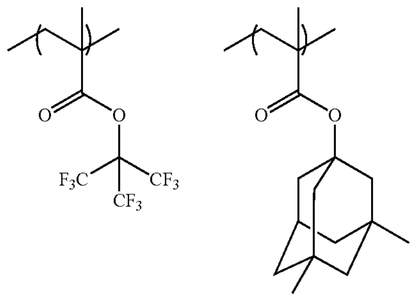
(C-57)
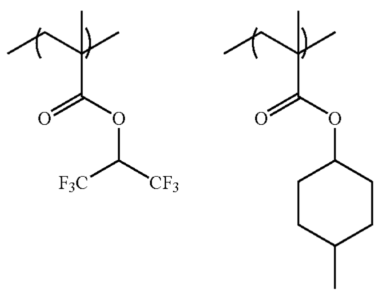
(C-58)
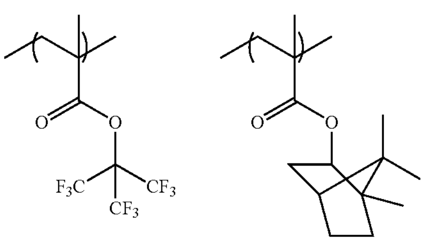
(C-59)
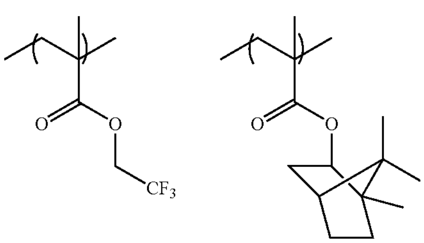
(C-60)
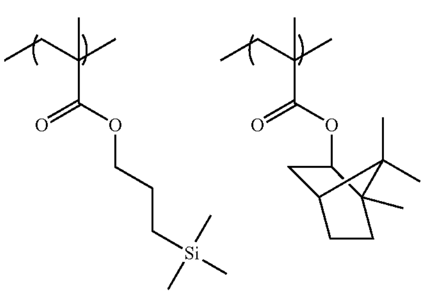
TABLE 2-continued
(C-61)
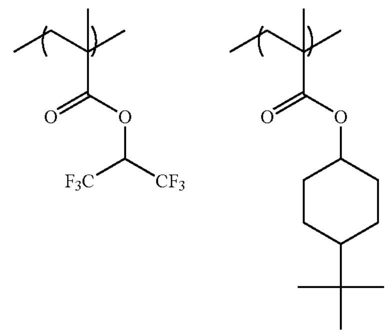
(C-62)
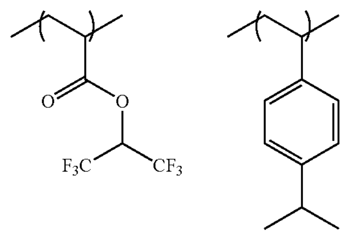
(C-63)
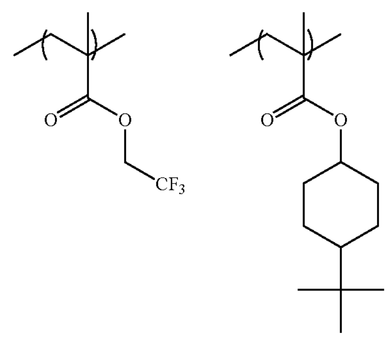
(C-64)
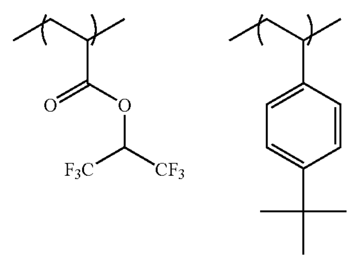
(C-65)
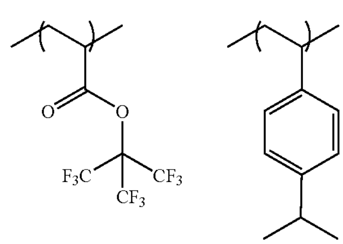

TABLE 2-continued (C-66)

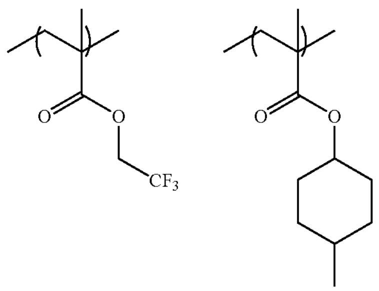

(C-67)

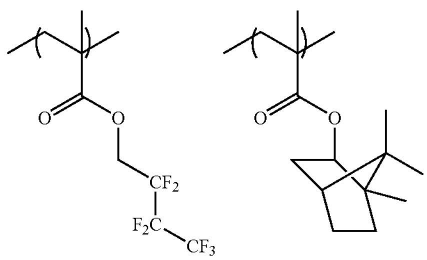

(C-68)

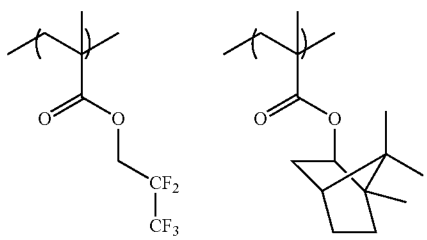

(C-69)

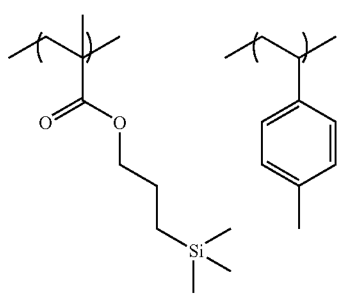

(C-70)

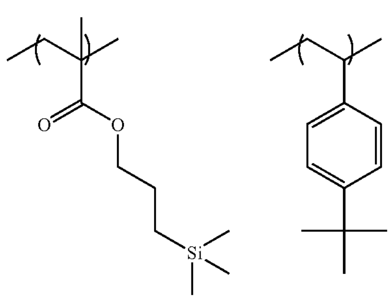

TABLE 2-continued

| Resin | Composition | Mw | Mw/Mn | Form | Tg |
|---|---|---|---|---|---|
| C-1 | 50/50 | 8,800 | 2.1 | Solid | 60 |
| C-2 | 50/50 | 5,200 | 1.8 | Liquid | <25 |
| C-3 | 50/50 | 4,800 | 1.9 | Solid | 150 |
| C-4 | 50/50 | 5,300 | 1.9 | Solid | 100 |
| C-5 | 50/50 | 6,200 | 1.9 | Solid | >160 |
| C-6 | 100 | 12,000 | 2.0 | Solid | 100 |
| C-7 | 50/50 | 5,800 | 1.9 | Solid | 100 |
| C-8 | 50/50 | 6,300 | 1.9 | Solid | 80 |
| C-9 | 100 | 5,500 | 2.0 | Solid | 80 |
| C-10 | 50/50 | 7,500 | 1.9 | Solid | >160 |
| C-11 | 70/30 | 10,200 | 2.2 | Solid | 80 |
| C-12 | 40/60 | 15,000 | 2.2 | Solid | 130 |
| C-13 | 40/60 | 13,000 | 2.2 | Solid | 130 |
| C-14 | 80/20 | 11,000 | 2.2 | Liquid | <25 |
| C-15 | 60/40 | 9,800 | 2.2 | Solid | 90 |
| C-16 | 50/50 | 8,000 | 2.2 | Liquid | <25 |
| C-17 | 50/50 | 7,600 | 2.0 | Solid | 70 |
| C-18 | 50/50 | 12,000 | 2.0 | Liquid | <25 |
| C-19 | 20/80 | 6,500 | 1.8 | Solid | 45 |
| C-20 | 100 | 4,000 | 1.6 | Solid | 35 |
| C-21 | 100 | 6,000 | 1.6 | Liquid | <25 |
| C-22 | 100 | 2,000 | 1.6 | Solid | 35 |
| C-23 | 50/50 | 6,000 | 1.7 | Solid | 70 |
| C-24 | 50/50 | 8,800 | 1.9 | Liquid | <25 |
| C-25 | 50/50 | 7,800 | 2.0 | Solid | 100 |
| C-26 | 50/50 | 8,000 | 2.0 | Solid | 100 |
| C-27 | 80/20 | 8,000 | 1.8 | Solid | 140 |
| C-28 | 30/70 | 7,000 | 1.7 | Solid | 100 |
| C-29 | 50/50 | 6,500 | 1.6 | Solid | 100 |
| C-30 | 50/50 | 6,500 | 1.6 | Solid | 100 |
| C-31 | 50/50 | 9,000 | 1.8 | Liquid | <25 |
| C-32 | 100 | 10,000 | 1.6 | Liquid | <25 |
| C-33 | 70/30 | 8,000 | 2.0 | Liquid | <25 |
| C-34 | 10/90 | 8,000 | 1.8 | Solid | 100 |
| C-35 | 30/30/40 | 9,000 | 2.0 | Solid | 80 |
| C-36 | 50/50 | 6,000 | 1.4 | Solid | 110 |
| C-37 | 50/50 | 5,500 | 1.5 | Solid | 90 |
| C-38 | 50/50 | 4,800 | 1.8 | Solid | 100 |
| C-39 | 60/40 | 5,200 | 1.8 | Solid | 50 |
| C-40 | 50/50 | 8,000 | 1.S | Solid | 100 |
| C-41 | 20/80 | 7,500 | 1.8 | Solid | 120 |
| C-42 | 50/50 | 6,200 | 1.6 | Solid | 100 |
| C-43 | 60/40 | 16,000 | 1.8 | Solid | 80 |
| C-44 | 80/20 | 10,200 | 1.8 | Solid | 100 |
| C-45 | 100 | 3,000 | 1.3 | Solid | |
| C-46 | 100 | 8,000 | 1.3 | Solid | |
| C-47 | 100 | 8,000 | 1.3 | Solid | |
| C-48 | 50/50 | 8,000 | 1.3 | Solid | |
| C-49 | 50/50 | 8,000 | 1.3 | Solid | |
| C-50 | 40/60 | 6,000 | 1.3 | Solid | |
| C-51 | 50/50 | 7,000 | 1.3 | Solid | |
| C-52 | 50/50 | 5,000 | 1.3 | Solid | |
| C-53 | 50/50 | 6,000 | 1.1 | Solid | |
| C-54 | 50/50 | 9,000 | 1.3 | Solid | |
| C-55 | 40/60 | 8,000 | 1.3 | Solid | |
| C-56 | 30/70 | 9,000 | 1.3 | Solid | |
| C-57 | 50/50 | 8,000 | 1.3 | Solid | |
| C-58 | 30/70 | 6,000 | 1.3 | Solid | |
| C-59 | 70/30 | 6,000 | 1.2 | Solid | |
| C-60 | 20/80 | 5,000 | 1.3 | Solid | |
| C-61 | 50/50 | 6,000 | 1.3 | Solid | |
| C-62 | 50/50 | 8,000 | 1.3 | Solid | |
| C-63 | 50/50 | 6,000 | 1.3 | Solid | |
| C-64 | 40/60 | 8,000 | 1.3 | Solid | |
| C-65 | 30/70 | 9,000 | 1.3 | Solid | |
| C-66 | 50/50 | 5,000 | 1.3 | Solid | |
| C-67 | 50/50 | 6,000 | 1.3 | Solid | |
| C-68 | 70/30 | 6,000 | 1.3 | Solid | |
| C-69 | 60/40 | 8,500 | 1.3 | Solid | |
| C-70 | 50/50 | 7,000 | 1.3 | Solid | |

EXAMPLES AND COMPARATIVE EXAMPLES

Preparation of Resist

The components of each sample shown in Table 3 below are dissolved in a solvent to prepare a solution having the concentration of solids content of 6 mass %, and each solution is filtered through a polyethylene filter having a pore diameter of 0.1 μm, whereby a positive resist solution is obtained. The thus prepared positive resist solutions are evaluated by the following methods. The results of evaluations are shown in Table 3. Regarding each component in Table 3, when two or more components are used, the ratio is mass ratio. In Table 3, the molar ratio of repeating unit (corresponding to each repeating unit from the left hand in order) in resin (C), the weight average molecular weight, the degree of dispersion, and the synthesizing method are shown.

In the synthesizing methods, "A" means ordinary radical polymerization, "B" and "B'" are cases where the solvents are fractioned, and "C" is living radical polymerization. Further, the compositional ratio is shown from the left hand in order of each formula.

Test of Image Performance:

Exposure Condition (1):

An organic antireflection film ARC29A (manufactured by Nissan Chemical Industries, Ltd.) is coated on a silicon wafer, and baked at 205° C. for 60 seconds to form an antireflection film having a thickness of 78 nm. The prepared positive resist composition is coated thereon, and baked at 130° C. for 60 seconds to form a resist film having a thickness of 250 nm. The obtained wafer is subjected to pattern exposure with an ArF excimer laser scanner (PAS 5500/1100, NA: 0.75, σo/σi=0.85/0.55, manufactured by ASML). After that, the wafer is baked at 130° C. for 60 seconds, and then subjected to development with a tetramethylammonium hydroxide aqueous solution (2.38 mass %) for 30 seconds, rinsing with pure water, and spin drying, whereby a resist pattern is obtained.

Exposure Condition (2):

This condition is to form a resist pattern by immersion exposure with pure water.

An organic antireflection film ARC29A (manufactured by Nissan Chemical Industries, Ltd.) is coated on a silicon wafer, and baked at 205° C. for 60 seconds to form an antireflection film having a thickness of 78 nm. The prepared positive resist composition is coated thereon, and baked at 130° C. for 60 seconds to form a resist film having a thickness of 250 nm. The obtained wafer is subjected to pattern exposure with an ArF excimer laser immersion scanner (NA: 0.85). As the immersion liquid, super pure water is used. After that, the wafer is baked at 130° C. for 60 seconds, and then subjected to development with a tetramethylammonium hydroxide aqueous solution (2.38 mass %) for 30 seconds, rinsing with pure water, and spin drying, whereby a resist pattern is obtained.

PED Evaluation:

In exposure conditions 1 and 2, the obtained resist pattern and a resist pattern obtained by the same operation as above after being allowed to stand for 30 minutes after exposure are observed for falling down of the pattern and pattern profile with a scanning electron microscope (S-4800, manufactured by Hitachi, Ltd.).

Taking the exposure amount required to reproduce the pattern of line and space of 90 nm as the optimal exposure amount, in regard to close pattern of line and space of 1/1 and solitary pattern of line and space of 1/1, the line width reproduced without being accompanied by falling down of a pattern in a finer mask size when the resist is exposed with the optimal exposure amount is taken as limiting line width of pattern falling. The smaller the value, the more is reproduced the finer pattern without falling down, and falling down of the pattern is difficult to occur.

Following Ability of Water:

The positive resist composition prepared is coated on a silicone wafer and baked at 130° C. for 60 seconds to form a resist film having a thickness of 160 nm. In the next place, as shown in FIG. 1, pure water 2 is filled between wafer 1 coated with the obtained positive resist composition and quartz glass substrate 3.

In this situation, quartz glass substrate 3 is moved (scanned) in parallel with the surface of resist-coated substrate 1 and the state of pure water 2 following in quartz glass substrate 3 is visually observed. Scanning speed of quartz glass substrate 3 is gradually increased, and the following ability of water is evaluated by finding the limiting scanning speed where pure water 2 cannot follow in the scanning speed of quartz glass substrate 3 and the water droplet begins to remain on the recession side. The greater the limiting scanning possible speed, the more possible is water to follow in the faster scanning speed, which shows that the following ability of water is good on the resist film.

Line Edge Roughness (LER):

Concerning the edge in the machine direction of the line pattern in the range of 5 μm, the distance from the intrinsic base line of the edge is measured at 50 points with an SEM (S-8840, manufactured by Hitachi, Ltd.), and standard deviation is found and 3σ is computed. The value of less than 5.0 is graded O, from 5.0 to 7.0 is graded Δ, and 7.0 or more is graded x. The smaller the value, the better is the performance.

Evaluation of Development Defect:

A defect detector KLA 2360 (trade name, manufactured by KLA Tencor Corporation) is used in the detection of development defect. Measurement is carried out by random mode by setting the pixel size of the defect detector at 0.16 μm and the threshold value at 20. Development defect extracted from the difference generated by registration of a comparing image and pixel unit is detected, and the number of development defects per unit area is computed. The value of less than 0.5 is graded ○, from 0.5 to 0.8 is graded Δ, and 0.8 or more is graded x. The smaller the value, the better is the performance.

TABLE 3

| | Composition | | | | | | | |
|---|---|---|---|---|---|---|---|---|
| | | | | | Resin (C) | | | |
| Example No. | Resin (2 g) | Light-Acid Generator (mg) | Solvent (mass ratio) | Basic Compound (mg) | Structural Formula (wt %) | Composition Ratio (synthetic method) | Mw ($\times 10^4$) (Mw/Mn) | Surfactant (mg) |
| Example 1 | 17 | z55/z23 (100/25) | SL-2/SL-4 (60/40) | N-5/N-1 (7/7) | C-49 (2.0) | 50/50 (B) | 0.8 (1.3) | W-4 (2) |
| Example 2 | 17 | z55/z23 (100/25) | SL-2/SL-4 (60/40) | N-5/N-1 (7/7) | C-20 (2.0) | 100 (A) | 0.6 (1.3) | W-4 (2) |
| Example 3 | 17 | z55/z23 (100/25) | SL-2/SL-4 (60/40) | N-5/N-1 (7/7) | C-20 (2.0) | 100 (C) | 0.6 (1.3) | W-4 (2) |
| Example 4 | 17 | z55/z23 (100/25) | SL-2/SL-4 (60/40) | N-5/N-1 (7/7) | C-20 (2.0) | 100 (C) | 0.5 (1.2) | W-4 (2) |

TABLE 3-continued

| | | | | | | | | |
|---|---|---|---|---|---|---|---|---|
| Example 5 | 17 | z55/z23<br>(100/25) | SL-2/SL-4<br>(60/40) | N-5/N-1<br>(7/7) | C-20<br>(2.0) | 100<br>(B') | 0.6<br>(1.3) | W-4<br>(2) |
| Example 6 | 17 | z55/z23<br>(100/25) | SL-2/SL-4<br>(60/40) | N-5/N-1<br>(7/7) | C-20<br>(2.0) | 100<br>(C) | 0.5<br>(1.2) | W-4<br>(2) |
| Example 7 | 17 | z55/z23<br>(100/25) | SL-2/SL-4<br>(60/40) | N-5/N-1<br>(7/7) | C-20<br>(2.0) | 100<br>(C) | 0.5<br>(1.2) | W-4<br>(2) |
| Example 8 | 17 | z55/z23<br>(100/25) | SL-2/SL-4<br>(60/40) | N-5/N-1<br>(7/7) | C-20<br>(2.0) | 100<br>(B) | 0.23<br>(1.1) | W-4<br>(2) |
| Example 9 | 17 | z55/z23<br>(100/25) | SL-2/SL-4<br>(60/40) | N-5/N-1<br>(7/7) | C-20<br>(2.0) | 100<br>(B) | 0.4<br>(1.3) | W-4<br>(2) |
| Example 10 | 18 | z55/z65<br>(75/75) | SL-2/SL-4<br>(60/40) | N-5/N-1<br>(7/7) | C-21<br>(5.0) | 100<br>(B') | 0.6<br>(1.3) | W-4<br>(2) |
| Example 11 | 17 | z55<br>(100) | SL-2/SL-4<br>(60/40) | N-5/N-1<br>(7/7) | C-22<br>(0.8) | 100<br>(B) | 0.2<br>(1.2) | W-4<br>(2) |
| Example 12 | 16 | z55/z51<br>(45/45) | SL-2/SL-4<br>(60/40) | N-1<br>(10) | C-37<br>(0.7) | 50/50<br>(B) | 0.5<br>(1.3) | W-4<br>(2) |

| | Results of Evaluation | | | | | | | | | | | |
|---|---|---|---|---|---|---|---|---|---|---|---|---|
| | Ordinary Exposure | | | | | Immersion Exposure | | | | | | |
| | Just after Exposure | | PED | | | Just after Exposure | | PED | | | Following Ability | De- |
| Example No. | Shape | Falling Down | Shape | Falling Down | LER | Shape | Falling Down | Shape | Falling Down | LER | of Water | velopment Defect |
| Example 1 | Rectangle | 70 | Rectangle | 70 | ○ | Rectangle | 70 | Rectangle | 70 | ○ | 250 | ○ |
| Example 2 | Rectangle | 70 | Rectangle | 70 | ○ | Rectangle | 70 | Rectangle | 70 | ○ | 250 | ○ |
| Example 3 | Rectangle | 70 | Rectangle | 70 | ○ | Rectangle | 70 | Rectangle | 70 | ○ | 250 | ○ |
| Example 4 | Rectangle | 70 | Rectangle | 70 | ○ | Rectangle | 70 | Rectangle | 70 | ○ | 250 | ○ |
| Example 5 | Rectangle | 70 | Rectangle | 70 | ○ | Rectangle | 70 | Rectangle | 70 | ○ | 250 | ○ |
| Example 6 | Rectangle | 70 | Rectangle | 70 | ○ | Rectangle | 70 | Rectangle | 70 | ○ | 250 | ○ |
| Example 7 | Rectangle | 70 | Rectangle | 70 | ○ | Rectangle | 70 | Rectangle | 70 | ○ | 250 | ○ |
| Example 8 | Rectangle | 70 | Rectangle | 70 | ○ | Rectangle | 70 | Rectangle | 70 | ○ | 250 | ○ |
| Example 9 | Rectangle | 70 | Rectangle | 70 | ○ | Rectangle | 70 | Rectangle | 70 | ○ | 250 | ○ |
| Example 10 | Rectangle | 70 | Rectangle | 72 | ○ | Rectangle | 70 | Rectangle | 73 | ○ | 250 | ○ |
| Example 11 | Rectangle | 70 | Rectangle | 70 | ○ | Rectangle | 70 | Rectangle | 70 | ○ | 250 | ○ |
| Example 12 | Rectangle | 70 | Rectangle | 70 | ○ | Rectangle | 70 | Rectangle | 70 | ○ | 250 | ○ |

| | Composition | | | | | | | |
|---|---|---|---|---|---|---|---|---|
| | | | | | Resin (C) | | | |
| Example No. | Resin (2 g) | Light-Acid Generator (mg) | Solvent (mass ratio) | Basic Compound (mg) | Structural Formula (wt %) | Composition Ratio (synthetic method) | Mw ($\times 10^4$) (Mw/Mn) | Surfactant (mg) |
| Example 13 | 1 | z2<br>(80) | SL-4/SL-2<br>(40/60) | N-5<br>(7) | C-1<br>(1.0) | 50/50<br>(B') | 0.6<br>(1.3) | W-1<br>(3) |
| Example 14 | 1 | z1<br>(60) | SL-4/SL-2<br>(40/60) | N-5<br>(7) | C-1<br>(6.0) | 50/50<br>(B) | 0.6<br>(1.3) | W-1<br>(3) |
| Example 15 | 1 | z2<br>(80) | SL-4/SL-2<br>(40/60) | N-3<br>(6) | C-2<br>(2.0) | 50/50<br>(B) | 0.6<br>(1.1) | W-1<br>(3) |
| Example 16 | 2 | z51<br>(100) | SL-2/SL-4/SL-6<br>(40/59/1) | N-6<br>(10) | C-3<br>(1.0) | 50/50<br>(B') | 0.6<br>(1.3) | W-3<br>(3) |
| Example 17 | 2 | z51<br>(100) | SL-2/SL-4/SL-6<br>(40/59/1) | N-1<br>(7) | C-4<br>(5.0) | 50/50<br>(B) | 0.6<br>(1.3) | W-3<br>(3) |
| Example 18 | 2 | z9<br>(100) | SL-2/SL-4/SL-6<br>(40/59/1) | N-2<br>(9) | C-5<br>(2.0) | 50/50<br>(B) | 0.6<br>(1.3) | W-3<br>(3) |
| Example 19 | 3 | z2/z55<br>(20/100) | SL-2/SL-4<br>(70/30) | N-3<br>(6) | C-6<br>(2.0) | 100<br>(C) | 0.6<br>(1.2) | W-6<br>(3) |
| Example 20 | 3 | z2/z15<br>(40/60) | SL-2/SL-4<br>(70/30) | N-3<br>(6) | C-7<br>(0.5) | 50/50<br>(B) | 0.6<br>(1.3) | W-6<br>(3) |
| Example 21 | 4 | z9<br>(100) | SL-2/SL-4<br>(60/40) | — | C-7<br>(1.0) | 50/50<br>(B) | 0.4<br>(1.3) | W-1<br>(5) |
| Example 22 | 5 | z65/z9<br>(20/80) | SL-3/SL-4<br>(30/70) | N-6<br>(10) | C-8<br>(1.5) | 50/50<br>(B') | 0.6<br>(1.3) | W-5<br>(4) |
| Example 23 | 6 | z44/z65<br>(25/80) | SL-2/SL-4/SL-5<br>(40/58/2) | N-1<br>(7) | C-9<br>(2.0) | 100<br>(C) | 0.2<br>(1.3) | W-1<br>(4) |

TABLE 3-continued

| | Results of Evaluation | | | | | | | | | | | |
|---|---|---|---|---|---|---|---|---|---|---|---|---|
| | Ordinary Exposure | | | | | Immersion Exposure | | | | | | |
| | Just after Exposure | | PED | | | Just after Exposure | | PED | | | Following | De- |
| Example No. | Shape | Falling Down | Shape | Falling Down | LER | Shape | Falling Down | Shape | Falling Down | LER | Ability of Water | velopment Defect |
| Example 13 | Rectangle | 71 | Rectangle | 71 | ○ | Rectangle | 71 | Rectangle | 71 | ○ | 200 | ○ |
| Example 14 | Rectangle | 71 | Rectangle | 73 | ○ | Rectangle | 71 | Rectangle | 73 | ○ | 200 | ○ |
| Example 15 | Rectangle | 70 | Rectangle | 72 | ○ | Rectangle | 70 | Rectangle | 74 | ○ | 200 | ○ |
| Example 16 | Rectangle | 70 | Rectangle | 70 | ○ | Rectangle | 70 | Rectangle | 70 | ○ | 250 | ○ |
| Example 17 | Rectangle | 71 | Rectangle | 71 | ○ | Rectangle | 71 | Rectangle | 71 | ○ | 150 | ○ |
| Example 18 | Rectangle | 71 | Rectangle | 71 | ○ | Rectangle | 71 | Rectangle | 71 | ○ | 150 | ○ |
| Example 19 | Rectangle | 71 | Rectangle | 71 | ○ | Rectangle | 71 | Rectangle | 71 | ○ | 150 | ○ |
| Example 20 | Rectangle | 71 | Rectangle | 71 | ○ | Rectangle | 71 | Rectangle | 71 | ○ | 150 | ○ |
| Example 21 | Rectangle | 71 | Rectangle | 71 | ○ | Rectangle | 71 | Rectangle | 73 | ○ | 150 | ○ |
| Example 22 | Rectangle | 70 | Rectangle | 70 | ○ | Rectangle | 70 | Rectangle | 70 | ○ | 250 | ○ |
| Example 23 | Rectangle | 70 | Rectangle | 70 | ○ | Rectangle | 70 | Rectangle | 71 | ○ | 250 | ○ |

| | Composition | | | | | | | |
|---|---|---|---|---|---|---|---|---|
| | | | | | Resin (C) | | | |
| Example No. | Resin (2 g) | Light-Acid Generator (mg) | Solvent (mass ratio) | Basic Compound (mg) | Structural Formula (wt %) | Composition Ratio (synthetic method) | Mw ($\times 10^4$) (Mw/Mn) | Surfactant (mg) |
| Example 24 | 7 | z55/z47 | SL-1/SL-2 | N-4 | C-10 | 50/50 | 0.65 | W-6 |
| | | (30/60) | (60/40) | (13) | (1.5) | (B) | (1.2) | (4) |
| Example 25 | 8 | z44/z65 | SL-1/SL-2 | N-3 | C-12 | 40/60 | 0.6 | W-2 |
| | | (50/50) | (60/40) | (6) | (2.0) | (B') | (1.3) | (3) |
| Example 26 | 9 | z65 | SL-2/SL-4/SL-6 | N-2 | C-13 | 40/60 | 0.6 | W-3 |
| | | (100) | (40/59/1) | (9) | (2.0) | (B) | (1.3) | (3) |
| Example 27 | 10 | z15/z37 | SL-2/SL-4/SL-6 | N-6 | C-8 | 50/50 | 0.6 | W-4 |
| | | (80/50) | (40/59/1) | (10) | (1.0) | (A) | (1.2) | (5) |
| Example 28 | 17 | z55/z23 | SL-2/SL-4 | N-5/N-1 | C-46 | 100 | 0.4 | W-4 |
| | | (100/25) | (60/40) | (7/7) | (2.0) | (C) | (1.2) | (2) |
| Example 29 | 18 | z55/z65 | SL-2/SL-4 | N-5/N-1 | C-47 | 100 | 0.6 | W-4 |
| | | (75/75) | (60/40) | (7/7) | (5.0) | (C) | (1.2) | (2) |
| Example 30 | 17 | z55 | SL-2/SL-4 | N-5/N-1 | C-48 | 50/50 | 0.6 | W-4 |
| | | (100) | (60/40) | (7/7) | (0.8) | (B) | (1.3) | (2) |
| Example 31 | 17 | z55/z23 | SL-2/SL-4 | N-5/N-1 | C-37 | 50/50 | 0.55 | W-4 |
| | | (100/25) | (60/40) | (7/7) | (0.7) | (B) | (1.3) | (2) |
| Example 32 | 17 | z55/z23 | SL-2/SL-4 | N-5/N-1 | C-47 | 100 | 0.8 | W-4 |
| | | (100/25) | (60/40) | (7/7) | (5.0) | (B) | (1.3) | (2) |
| Example 33 | 11 | z15/z37 | SL-2/SL-4 | N-1 | C-11 | 70/30 | 0.6 | — |
| | | (80/50) | (60/40) | (7) | (1.0) | (B') | (1.3) | |
| Example 34 | 11 | z15/z37 | SL-2/SL-4 | N-1 | C-11 | 70/30 | 0.6 | — |
| | | (80/50) | (60/40) | (7) | (1.0) | (B) | (1.2) | |

| | Results of Evaluation | | | | | | | | | | | |
|---|---|---|---|---|---|---|---|---|---|---|---|---|
| | Ordinary Exposure | | | | | Immersion Exposure | | | | | | |
| | Just after Exposure | | PED | | | Just after Exposure | | PED | | | Following | De- |
| Example No. | Shape | Falling Down | Shape | Falling Down | LER | Shape | Falling Down | Shape | Falling Down | LER | Ability of Water | velopment Defect |
| Example 24 | Rectangle | 70 | Rectangle | 70 | ○ | Rectangle | 70 | Rectangle | 70 | ○ | 250 | ○ |
| Example 25 | Rectangle | 70 | Rectangle | 70 | ○ | Rectangle | 70 | Rectangle | 70 | ○ | 250 | ○ |
| Example 26 | Rectangle | 71 | Rectangle | 71 | ○ | Rectangle | 71 | Rectangle | 71 | ○ | 200 | ○ |
| Example 27 | Rectangle | 70 | Rectangle | 70 | ○ | Rectangle | 70 | Rectangle | 70 | ○ | 250 | ○ |
| Example 28 | Rectangle | 70 | Rectangle | 70 | ○ | Rectangle | 70 | Rectangle | 70 | ○ | 250 | ○ |
| Example 29 | Rectangle | 70 | Rectangle | 72 | ○ | Rectangle | 70 | Rectangle | 73 | ○ | 250 | ○ |
| Example 30 | Rectangle | 70 | Rectangle | 70 | ○ | Rectangle | 70 | Rectangle | 70 | ○ | 250 | ○ |
| Example 31 | Rectangle | 70 | Rectangle | 70 | ○ | Rectangle | 70 | Rectangle | 70 | ○ | 250 | ○ |
| Example 32 | Rectangle | 70 | Rectangle | 70 | ○ | Rectangle | 70 | Rectangle | 70 | ○ | 250 | ○ |
| Example 33 | Rectangle | 70 | Rectangle | 70 | ○ | Rectangle | 70 | Rectangle | 73 | ○ | 250 | ○ |
| Example 34 | Rectangle | 70 | Rectangle | 70 | ○ | Rectangle | 70 | Rectangle | 73 | ○ | 250 | ○ |

TABLE 3-continued

| Example No. | Composition: Resin (2 g) | Light-Acid Generator (mg) | Solvent (mass ratio) | Basic Compound (mg) | Resin (C): Structural Formula (wt %) | Resin (C): Composition Ratio (synthetic method) | Resin (C): Mw (×10^4) (Mw/Mn) | Surfactant (mg) |
|---|---|---|---|---|---|---|---|---|
| Example 35 | 21 | z2 (80) | SL-2 (100) | N-7 (7) | C-67 (1.0) | 50/50 (B) | 0.6 (1.3) | W-3 (2) |
| Example 36 | 19 | z2 (80) | SL-1 (100) | N-7 (7) | C-22 (1.5) | 100 (B) | 0.8 (1.3) | W-1 (2) |
| Example 37 | 22 | z23/z75 (50/50) | SL-2/SL-5 (60/40) | N-3 (6) | C-1 (1.0) | 70/30 (B) | 0.6 (1.3) | W-1 (2) |
| Example 38 | 23 | z2/z42 (50/40) | SL-2/SL-5 (60/40) | N-3 (6) | C-25 (0.5) | 100 (B) | 0.4 (1.3) | W-1 (2) |
| Example 39 | 24 | z2 (80) | SL-2/SL-3 (60/40) | N-7 (7) | C-37 (0.7) | 50/50 (B) | 0.6 (1.3) | W-1 (2) |
| Example 40 | 25 | z2/z15 (50/50) | SL-2/SL-3 (60/40) | N-4 (6) | C-47 (5.0) | 100 (B) | 0.8 (1.3) | W-1 (3) |
| Example 41 | 20 | z2/z15 (50/50) | SL-2 (100) | N-8 (7) | C-11 (1.0) | 70/30 (B) | 0.6 (1.3) | W-1 (2) |
| Example 42 | 15 | z55/z65 (40/60) | SL-2/SL-4 (60/40) | N-1 (7) | C-23 (1.0) | 50/50 (B) | 0.6 (1.2) | W-4 (2) |
| Example 43 | 14 | z65 (100) | SL-2/SL-4 (60/40) | N-1 (7) | C-23 (1.0) | 50/50 (B) | 0.6 (1.2) | W-4 (2) |
| Example 44 | 12 | z55/z65 (40/60) | SL-1/SL-2 (50/50) | N-3 (6) | C-64 (1.0) | 40/60 (B) | 0.8 (1.3) | W-1 (3) |
| Example 45 | 13 | z2/z15 (40/60) | SL-2/SL-4/SL-6 (40/59/1) | N-6 (10) | C-41 (1.0) | 50/50 (B) | 0.5 (1.3) | W-4 (5) |

| Example No. | Ordinary Exposure: Just after Exposure Shape | Falling Down | PED Shape | Falling Down | LER | Immersion Exposure: Just after Exposure Shape | Falling Down | PED Shape | Falling Down | LER | Following Ability of Water | Development Defect |
|---|---|---|---|---|---|---|---|---|---|---|---|---|
| Example 35 | Rectangle | 70 | Rectangle | 70 | ○ | Rectangle | 70 | Rectangle | 70 | ○ | 250 | ○ |
| Example 36 | Rectangle | 70 | Rectangle | 70 | ○ | Rectangle | 70 | Rectangle | 70 | ○ | 250 | ○ |
| Example 37 | Rectangle | 70 | Rectangle | 70 | ○ | Rectangle | 70 | Rectangle | 70 | ○ | 250 | ○ |
| Example 38 | Rectangle | 70 | Rectangle | 70 | ○ | Rectangle | 70 | Rectangle | 70 | ○ | 250 | ○ |
| Example 39 | Rectangle | 70 | Rectangle | 70 | ○ | Rectangle | 70 | Rectangle | 70 | ○ | 250 | ○ |
| Example 40 | Rectangle | 70 | Rectangle | 70 | ○ | Rectangle | 70 | Rectangle | 70 | ○ | 250 | ○ |
| Example 41 | Rectangle | 70 | Rectangle | 70 | ○ | Rectangle | 70 | Rectangle | 73 | ○ | 250 | ○ |
| Example 42 | Rectangle | 70 | Rectangle | 70 | ○ | Rectangle | 70 | Rectangle | 73 | ○ | 250 | ○ |
| Example 43 | Rectangle | 70 | Rectangle | 70 | ○ | Rectangle | 70 | Rectangle | 72 | ○ | 250 | ○ |
| Example 44 | Rectangle | 70 | Rectangle | 70 | ○ | Rectangle | 70 | Rectangle | 72 | ○ | 250 | ○ |
| Example 45 | Rectangle | 70 | Rectangle | 70 | ○ | Rectangle | 70 | Rectangle | 70 | ○ | 250 | ○ |

| Example No. | Composition: Resin (2 g) | Light-Acid Generator (mg) | Solvent (mass ratio) | Basic Compound (mg) | Resin (C): Structural Formula (wt %) | Resin (C): Composition Ratio (synthetic method) | Resin (C): Mw (×10^4) (Mw/Mn) | Surfactant (mg) |
|---|---|---|---|---|---|---|---|---|
| Example 46 | 14 | z62 (120) | SL-2/SL-4/SL-6 (40/59/1) | N-7 (7) | C-14 (1.0) | 80/20 (B) | 0.8 (1.3) | W-2 (5) |
| Example 47 | 15 | z44 (80) | SL-1/SL-2 (60/40) | N-7 (7) | C-2 (1.0) | 50/50 (B) | 0.6 (1.3) | W-1 (3) |
| Example 48 | 17 | z55/z23 (100/25) | SL-2/SL-4 (60/40) | N-5/N-9 (7/7) | C-27 (1.0) | 50/50 (C) | 0.6 (1.3) | W-4 (2) |
| Example 49 | 8 | z44 (80) | SL-1/SL-2 (60/40) | N-3 (6) | C-50 (2.0) | 40/60 (B) | 0.6 (1.3) | W-2 (3) |
| Example 50 | 17 | z2 (80) | SL-2/SL-4 (60/40) | N-9 (6) | C-53 (1.0) | 50/50 (B) | 0.6 (1.1) | W-1 (3) |
| Example 51 | 21 | z55/z23 (100/25) | SL-2/SL-4 (60/40) | N-5/N-1 (7/7) | C-55 (0.8) | 40/60 (B) | 0.8 (1.3) | W-4 (2) |
| Example 52 | 19 | z15/z37 (80/50) | SL-2/SL-4 (60/40) | N-1 (7) | C-58 (1.0) | 30/70 (B) | 0.6 (1.3) | W-4 (2) |
| Example 53 | 21 | z15/z37 (80/50) | SL-2/SL-4 (60/40) | N-1 (7) | C-59 (1.0) | 70/30 (B) | 0.6 (1.2) | W-4 (2) |

TABLE 3-continued

| Example No. | Resin (2 g) | Light-Acid Generator (mg) | Solvent (mass ratio) | Basic Compound (mg) | Resin (C) Structural Formula (wt %) | Resin (C) Composition Ratio (synthetic method) | Resin (C) Mw (×10^4) (Mw/Mn) | Surfactant (mg) |
|---|---|---|---|---|---|---|---|---|
| Example 54 | 11 | z2 (80) | SL-2 (100) | N-7 (7) | C-63 (1.0) | 50/50 (B) | 0.6 (1.3) | W-3 (2) |
| Example 55 | 19 | z2 (80) | SL-1 (100) | N-7 (7) | C-60 (1.5) | 20/80 (B) | 0.5 (1.3) | W-1 (2) |

Results of Evaluation

| | Ordinary Exposure | | | | | Immersion Exposure | | | | | | |
|---|---|---|---|---|---|---|---|---|---|---|---|---|
| | Just after Exposure | | PED | | | Just after Exposure | | PED | | | Following | De- |
| Example No. | Shape | Falling Down | Shape | Falling Down | LER | Shape | Falling Down | Shape | Falling Down | LER | Ability of Water | velopment Defect |
| Example 46 | Rectangle | 70 | Rectangle | 70 | ○ | Rectangle | 70 | Rectangle | 73 | ○ | 250 | ○ |
| Example 47 | Rectangle | 71 | Rectangle | 72 | ○ | Rectangle | 71 | Rectangle | 72 | ○ | 250 | ○ |
| Example 48 | Rectangle | 70 | Rectangle | 70 | ○ | Rectangle | 70 | Rectangle | 70 | ○ | 250 | ○ |
| Example 49 | Rectangle | 70 | Rectangle | 70 | ○ | Rectangle | 70 | Rectangle | 70 | ○ | 250 | ○ |
| Example 50 | Rectangle | 70 | Rectangle | 72 | ○ | Rectangle | 70 | Rectangle | 71 | ○ | 250 | ○ |
| Example 51 | Rectangle | 70 | Rectangle | 70 | ○ | Rectangle | 70 | Rectangle | 70 | ○ | 250 | ○ |
| Example 52 | Rectangle | 70 | Rectangle | 70 | ○ | Rectangle | 70 | Rectangle | 70 | ○ | 250 | ○ |
| Example 53 | Rectangle | 70 | Rectangle | 70 | ○ | Rectangle | 70 | Rectangle | 70 | ○ | 250 | ○ |
| Example 54 | Rectangle | 70 | Rectangle | 70 | ○ | Rectangle | 70 | Rectangle | 73 | ○ | 250 | ○ |
| Example 55 | Rectangle | 70 | Rectangle | 70 | ○ | Rectangle | 70 | Rectangle | 70 | ○ | 250 | ○ |

Composition

| Example No. | Resin (2 g) | Light-Acid Generator (mg) | Solvent (mass ratio) | Basic Compound (mg) | Resin (C) Structural Formula (wt %) | Resin (C) Composition Ratio (synthetic method) | Resin (C) Mw (×10^4) (Mw/Mn) | Surfactant (mg) |
|---|---|---|---|---|---|---|---|---|
| Comparative Example 1 | 1 | z2 (80) | SL-4/SL-2 (40/60) | N-5 (7) | — | — | — | W-1 (5) |
| Comparative Example 2 | 17 | z55/z23 (100/25) | SL-2/SL-4 (60/40) | N-5/N-1 (7/7) | C-45 (2.0) | 100 (B) | 0.8 (1.6) | W-4 (2) |
| Comparative Example 3 | 17 | z55/z23 (100/25) | SL-2/SL-4 (60/40) | N-5/N-1 (7/7) | C-46 (2.0) | 100 (B') | 0.8 (1.6) | W-4 (2) |
| Comparative Example 4 | 17 | z55/z23 (100/25) | SL-2/SL-4 (60/40) | N-5/N-1 (7/7) | C-47 (2.0) | 100 (B) | 0.8 (1.6) | W-4 (2) |
| Comparative Example 5 | 17 | z55/z23 (100/25) | SL-2/SL-4 (60/40) | N-5/N-1 (7/7) | C-48 (0.5) | 50/50 (B') | 0.8 (1.6) | W-4 (2) |
| Comparative Example 6 | 17 | z55/z23 (100/25) | SL-2/SL-4 (60/40) | N-5/N-1 (7/7) | C-49 (2.0) | 50/50 (B) | 0.8 (1.6) | W-4 (2) |
| Comparative Example 7 | 17 | z55/z23 (100/25) | SL-2/SL-4 (60/40) | N-5/N-1 (7/7) | C-50 (2.0) | 50/50 (B) | 0.8 (1.6) | W-4 (2) |
| Comparative Example 8 | 17 | z55/z23 (100/25) | SL-2/SL-4 (60/40) | N-5/N-1 (7/7) | C-51 (1.0) | 50/50 (B) | 0.8 (1.6) | W-4 (2) |
| Comparative Example 9 | 17 | z55/z23 (100/25) | SL-2/SL-4 (60/40) | N-5/N-1 (7/7) | C-20 (2.0) | 100 (A) | 20.0 (1.6) | W-4 (2) |
| Comparative Example 10 | 17 | z55/z23 (100/25) | SL-2/SL-4 (60/40) | N-5/N-1 (7/7) | C-20 (2.0) | 100 (A) | 2.0 (1.6) | W-4 (2) |
| Comparative Example 11 | 17 | z55/z23 (100/25) | SL-2/SL-4 (60/40) | N-5/N-1 (7/7) | C-20 (2.0) | 100 (A) | 1.4 (1.6) | W-4 (2) |

Results of Evaluation

| | Ordinary Exposure | | | | | Immersion Exposure | | | | | | |
|---|---|---|---|---|---|---|---|---|---|---|---|---|
| | Just after Exposure | | PED | | | Just after Exposure | | PED | | | Following | De- |
| Example No. | Shape | Falling Down | Shape | Falling Down | LER | Shape | Falling Down | Shape | Falling Down | LER | Ability of Water | velopment Defect |
| Comparative Example 1 | Rectangle | 100 | T-top | 110 | X | Rectangle | 85 | Rectangle | 110 | X | 50 | Δ |
| Comparative Example 2 | Rectangle | 70 | Rectangle | 70 | Δ | Rectangle | 70 | Rectangle | 70 | X | 250 | Δ |
| Comparative Example 3 | Rectangle | 70 | Rectangle | 70 | Δ | Rectangle | 70 | Rectangle | 70 | X | 250 | Δ |
| Comparative Example 4 | Rectangle | 70 | Rectangle | 70 | Δ | Rectangle | 70 | Rectangle | 70 | X | 250 | Δ |
| Comparative Example 5 | Rectangle | 70 | Rectangle | 70 | Δ | Rectangle | 70 | Rectangle | 70 | X | 250 | Δ |
| Comparative Example 6 | Rectangle | 70 | Rectangle | 70 | Δ | Rectangle | 70 | Rectangle | 70 | X | 250 | Δ |

TABLE 3-continued

| | | | | | | | | | | | | |
|---|---|---|---|---|---|---|---|---|---|---|---|---|
| Comparative Example 7 | Rectangle | 70 | Rectangle | 70 | Δ | Rectangle | 70 | Rectangle | 70 | X | 250 | Δ |
| Comparative Example 8 | Rectangle | 70 | Rectangle | 70 | Δ | Rectangle | 70 | Rectangle | 70 | X | 250 | Δ |
| Comparative Example 9 | Rectangle | 70 | Rectangle | 70 | X | Rectangle | 70 | Rectangle | 70 | Δ | 250 | X |
| Comparative Example 10 | Rectangle | 70 | Rectangle | 70 | X | Rectangle | 70 | Rectangle | 70 | Δ | 250 | Δ |
| Comparative Example 11 | Rectangle | 70 | Rectangle | 70 | Δ | Rectangle | 70 | Rectangle | 70 | Δ | 250 | Δ |

| | Composition | | | | | | | |
|---|---|---|---|---|---|---|---|---|
| | | | | | Resin (C) | | | |
| Example No. | Resin (2 g) | Light-Acid Generator (mg) | Solvent (mass ratio) | Basic Compound (mg) | Structural Formula (wt %) | Composition Ratio (synthetic method) | Mw ($\times 10^4$) (Mw/Mn) | Surfactant (mg) |
| Comparative Example 12 | 17 | z55/z23 (100/25) | SL-2/SL-4 (60/40) | N-5/N-1 (7/7) | C-20 (2.0) | 100 (B) | 1.2 (1.6) | W-4 (2) |
| Comparative Example 13 | 17 | z55/z23 (100/25) | SL-2/SL-4 (60/40) | N-5/N-1 (7/7) | C-20 (2.0) | 100 (B') | 1.1 (1.6) | W-4 (2) |
| Comparative Example 14 | 17 | z55/z23 (100/25) | SL-2/SL-4 (60/40) | N-5/N-1 (7/7) | C-20 (2.0) | 100 (B) | 0.9 (1.6) | W-4 (2) |
| Comparative Example 15 | 17 | z55/z23 (100/25) | SL-2/SL-4 (60/40) | N-5/N-1 (7/7) | C-20 (2.0) | 100 (C) | 0.8 (1.6) | W-4 (2) |
| Comparative Example 16 | 17 | z55/z23 (100/25) | SL-2/SL-4 (60/40) | N-5/N-1 (7/7) | C-20 (2.0) | 100 (B) | 0.8 (1.6) | W-4 (2) |
| Comparative Example 17 | 17 | z55/z23 (100/25) | SL-2/SL-4 (60/40) | N-5/N-1 (7/7) | C-20 (2.0) | 100 (B') | 0.7 (1.6) | W-4 (2) |
| Comparative Example 18 | 17 | z55/z23 (100/25) | SL-2/SL-4 (60/40) | N-5/N-1 (7/7) | C-20 (2.0) | 100 (B) | 0.6 (1.6) | W-4 (2) |
| Comparative Example 19 | 17 | z55/z23 (100/25) | SL-2/SL-4 (60/40) | N-5/N-1 (7/7) | C-20 (2.0) | 100 (C) | 0.5 (1.6) | W-4 (2) |
| Comparative Example 20 | 17 | z55/z23 (100/25) | SL-2/SL-4 (60/40) | N-5/N-1 (7/7) | C-20 (2.0) | 100 (A) | 0.4 (1.6) | W-4 (2) |
| Comparative Example 21 | 17 | z55/z23 (100/25) | SL-2/SL-4 (60/40) | N-5/N-1 (7/7) | C-20 (2.0) | 100 (A) | 0.3 (1.6) | W-4 (2) |
| Comparative Example 22 | 17 | z55/z23 (100/25) | SL-2/SL-4 (60/40) | N-5/N-1 (7/7) | C-20 (2.0) | 100 (B') | 0.8 (1.6) | W-4 (2) |
| Comparative Example 23 | 17 | z55/z23 (25/80) | SL-2/SL-4 (60/40) | N-5/N-1 (7/7) | C-20 (2.0) | 100 (A) | 0.7 (1.3) | W-4 (4) |

| | Results of Evaluation | | | | | | | | | | | |
|---|---|---|---|---|---|---|---|---|---|---|---|---|
| | Ordinary Exposure | | | | | Immersion Exposure | | | | | | |
| | Just after Exposure | | PED | | | Just after Exposure | | PED | | | Following | De- |
| Example No. | Shape | Falling Down | Shape | Falling Down | LER | Shape | Falling Down | Shape | Falling Down | LER | Ability of Water | velopment Defect |
| Comparative Example 12 | Rectangle | 70 | Rectangle | 70 | Δ | Rectangle | 70 | Rectangle | 70 | Δ | 250 | Δ |
| Comparative Example 13 | Rectangle | 70 | Rectangle | 70 | Δ | Rectangle | 70 | Rectangle | 70 | Δ | 250 | X |
| Comparative Example 14 | Rectangle | 70 | Rectangle | 70 | Δ | Rectangle | 70 | Rectangle | 70 | X | 250 | X |
| Comparative Example 15 | Rectangle | 70 | Rectangle | 70 | Δ | Rectangle | 70 | Rectangle | 70 | X | 250 | Δ |
| Comparative Example 16 | Rectangle | 70 | Rectangle | 70 | Δ | Rectangle | 70 | Rectangle | 70 | X | 250 | Δ |
| Comparative Example 17 | Rectangle | 70 | Rectangle | 70 | Δ | Rectangle | 70 | Rectangle | 70 | X | 250 | X |
| Comparative Example 18 | Rectangle | 70 | Rectangle | 70 | Δ | Rectangle | 70 | Rectangle | 70 | Δ | 250 | X |
| Comparative Example 19 | Rectangle | 70 | Rectangle | 70 | Δ | Rectangle | 70 | Rectangle | 70 | Δ | 250 | Δ |
| Comparative Example 20 | Rectangle | 70 | Rectangle | 70 | Δ | Rectangle | 70 | Rectangle | 70 | Δ | 250 | X |
| Comparative Example 21 | Rectangle | 70 | Rectangle | 70 | X | Rectangle | 70 | Rectangle | 70 | Δ | 250 | X |

TABLE 3-continued

| | | | | | | | | | | | | |
|---|---|---|---|---|---|---|---|---|---|---|---|---|
| Comparative Example 22 | Rectangle | 70 | Rectangle | 70 | X | Rectangle | 70 | Rectangle | 70 | X | 250 | Δ |
| Comparative Example 23 | Rectangle | 70 | Rectangle | 70 | Δ | Rectangle | 70 | Rectangle | 70 | X | 250 | Δ |

* Compositional ratio is from the left hand of each structural formula.
The signs in Table 3 are as follows.
Acid generators are corresponding to those shown above.
N-1: N,N-Dibutylaniline
N-2: N,N-Dihexylaniline
N-3: 2,6-Diisopropylaniline
N-4: Tri-n-octylamine
N-5: N,N-Dihydroxyethylaniline
N-6: 2,4,5-Triphenylimidazole
N-7: Tris(methoxyethoxyethyl)amine
N-8: 2-Phenylbenzimidazole
N-9: 2-{2-[2-(2,2-Dimethoxyphenoxyethoxy)ethyl]-bis-(2-methoxyethyl)}amine
Incidentally, N-9 can be obtained, after the reaction of primary amine having a corresponding phenoxy group and haloalkyl ether by heating, by adding an aqueous solution of a strong base such as sodium hydroxide, potassium hydroxide, or tetraalkylammonium to the reaction solution, and then extracting the product with an organic solvent, e.g., ethyl acetate or chloroform.
W-1: Megafac F176 (fluorine surfactant, manufactured by Dainippon Ink and Chemicals Inc.)
W-2: Megafac R08 (fluorine/silicon surfactant, manufactured by Dainippon Ink and Chemicals Inc.)
W-3: Polysiloxane polymer KP-341 (silicon surfactant, manufactured by Shin-Etsu Chemical Co., Ltd.)
W-4: Troy Sol S-366 (manufactured by Troy Chemical Co., Ltd.)
W-5: PF656 (fluorine surfactant, manufactured by OMNOVA)
W-6: PF6320 (fluorine surfactant, manufactured by OMNOVA)
SL-1: Cyclohexanone
SL-2: Propylene glycol monomethyl ether acetate
SL-3: Ethyl lactate
SL-4: Propylene glycol monomethyl ether
SL-5: γ-Butyrolactone
SL-6: Propylene carbonate From the results shown in Table 3, it can be seen that the positive resist compositions in the invention are hardly accompanied by falling down of resist pattern due to post exposure delay between exposure and PEB, and the deterioration of profile, excellent in line edge roughness performance, almost free from development defect not only in ordinary exposure but also in immersion exposure, and the following ability of an immersion liquid in immersion exposure is good.

The invention can provide a positive resist composition improved in falling down of resist pattern due to PED between exposure and PEB and deterioration of profile. The invention can further provide a positive resist composition excellent in the following ability of an immersion liquid at the time of immersion exposure and also suitable for immersion exposure; resins for use in the resist composition; compounds for use in the synthesis of the resins; and a pattern-forming method with the resist composition.

The entire disclosure of each and every foreign patent application from which the benefit of foreign priority has been claimed in the present application is incorporated herein by reference, as if fully set forth.

What is claimed is:

1. A resist composition comprising:

(A) a resin capable of increasing its solubility in an alkali developer by action of an acid and which does not contain a fluorine atom or a silicon atom;

(B) a compound capable of generating an acid upon irradiation with actinic ray or radiation;

(C) a resin having at least one of a fluorine atom and a silicon atom; and (D) a solvent, wherein the resin (C) has a degree of molecular weight dispersion of 1.3 or less, a weight average molecular weight of $1.0\times10^4$ or less and contains any one of a phenolic hydroxyl group, a fluorinated alcohol group, a sulfonic acid group, a sulfonamide group, a sulfonylimido group, an (alkylsulfonyl) (alkylcarbonyl)methylene group, an (alkylsulfonyl) (alkylcarbonyl) imido group, a bis(alkylcarbonyl)methylene group, a bis(alkylcarbonyl) imido group, a bis(alkylsulfonyl)methylene group, a bis(alkylsulfonyl) imido group, a tris(alkylcarbonyl)methylene group, and a tris(alkylsulfonyl)methylene group.

2. The positive resist composition as claimed in claim 1, wherein resin (C) is a resin refined by solvent fraction.

3. The positive resist composition for immersion exposure as claimed in claim 1, wherein component (C) is a resin obtained by living radical polymerization.

4. The positive resist composition as claimed in claim 1, wherein resin (C) has a group represented by formula (F3a):

(F3a)

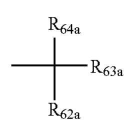

wherein $R_{62a}$ and $R_{63a}$ each independently represents an alkyl group in which at least one hydrogen atom is substituted with a fluorine atom, and $R_{62a}$ and $R_{63a}$ may be linked to each other to form a ring; and $R_{64a}$ represents a hydrogen atom, a fluorine atom, or an alkyl group.

5. The positive resist composition as claimed in claim 4, wherein the resin (C) has an acrylate or methacrylate repeating unit having a group represented by formula (F3a).

6. The positive resist composition as claimed in claim 4, wherein resin (C) further has at least one kind of a repeating unit selected from repeating units represented by formulae (C-I) and (C-II) as a copolymer component:

(C-I)

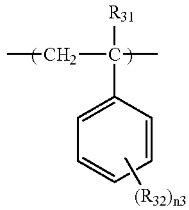

(C-II)

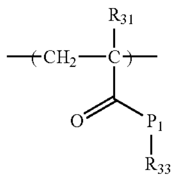

wherein $R_{31}$ each independently represents a hydrogen atom or a methyl group; $R_{32}$ represents a hydrocarbon group; $R_{33}$ represents a cyclic hydrocarbon group; $P_1$ represents a linking group selected from —O—, —NR— (where R represents a hydrogen atom or an alkyl group), and $—NHSO_2—$; and n3 represents an integer of from 0 to 4.

7. The positive resist composition as claimed in claim 6, wherein resin (C) further has at least one kind of a repeating unit represented by formula (C-I) as a copolymer component.

8. The positive resist composition as claimed in claim 6, wherein the addition amount of the resin (C) in the positive resist composition is from 0.1 to 5 mass % based on the total solids content of the positive resist composition.

9. The positive resist composition as claimed in claim 1, wherein the resin (C) has a group represented by any of formulae (CS-1) to (CS-3):

(CS-1)

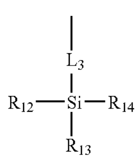

(CS-2)

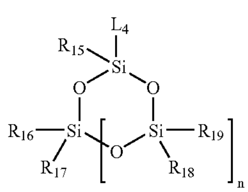

(CS-3)

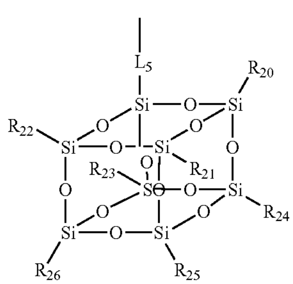

wherein $R_{12}$ to $R_{26}$ each independently represents a straight chain or branched alkyl group or cycloalkyl group; $L_3$ to $L_5$ each independently represents a single bond or a divalent linking group; and n represents an integer of from 1 to 5.

10. The positive resist composition as claimed in claim 1, wherein the resin (C) is a resin selected from (C-1) to (C-6):

(C-1) A resin having a repeating unit (a) having a fluoroalkyl group;

(C-2) A resin having a repeating unit (b) having a trialkylsilyl group or a cyclic siloxane structure;

(C-3) A resin having a repeating unit (a) having a fluoroalkyl group, and a repeating unit (c) having a branched alkyl group, a cycloalkyl group, a branched alkenyl group, a cycloalkenyl group, or an aryl group;

(C-4) A resin having a repeating unit (b) having a trialkylsilyl group or a cyclic siloxane structure, and a repeating unit (c) having a branched alkyl group, a cycloalkyl group, a branched alkenyl group, a cycloalkenyl group, or an aryl group;

(C-5) A resin having a repeating unit (a) having a fluoroalkyl group, and a repeating unit (b) having a trialkylsilyl group or a cyclic siloxane structure; and (C-6) A resin having a repeating unit (a) having a fluoroalkyl group, a repeating unit (b) having a trialkylsilyl group or a cyclic siloxane structure, and a repeating unit (c) having a branched alkyl group, a cycloalkyl group, a branched alkenyl group, a cycloalkenyl group, or an aryl group.

11. The positive resist composition as claimed in claim 1, wherein the resin (C) has a repeating unit represented by formula (Ia):

(Ia)

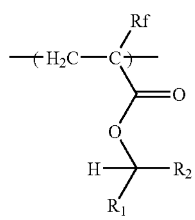

wherein Rf represents a fluorine atom, or an alkyl group in which at least one hydrogen atom is substituted with a fluorine atom; $R_1$ represents an alkyl group; and $R_2$ represents a hydrogen atom or an alkyl group.

12. The positive resist composition as claimed in claim 1, wherein the resin (C) has a repeating unit represented by formula (II) and a repeating unit represented by formula (III):

(II)

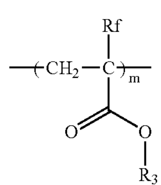

(III)

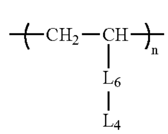

wherein Rf represents a fluorine atom, or an alkyl group in which at least one hydrogen atom is substituted with a fluorine atom; $R_3$ represents an alkyl group, a cycloalkyl group, an alkenyl group, or a cycloalkenyl group; $R_4$ represents an alkyl group, a cycloalkyl group, an alkenyl group, a cycloalkenyl group, a trialkylsilyl group, or a group having a cyclic siloxane structure; $L_6$ represents a single bond or a divalent linking group; and m and n represent figures respectively satisfying $0<m<100$ and $0<n<100$.

13. A pattern-forming method comprising:

forming a resist film with the positive resist compositions claimed in claim 1; and exposing and developing the resist film.

14. The positive resist composition as claimed in claim 1, wherein the addition amount of the resin (C) in the positive resist composition is from 0.1 to 5 mass % based on the total solids content of the positive resist composition.

15. A resin having a repeating unit represented by formula (Ia), which has a degree of molecular weight dispersion of 1.3 or less and a weight average molecular weight of $1.0\times10^4$ or less:

(Ia)

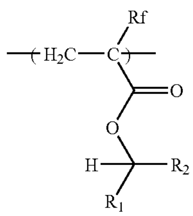

wherein Rf represents a fluorine atom, or an alkyl group in which at least one hydrogen atom is substituted with a fluorine atom; $R_1$ represents an alkyl group; and $R_2$ represents a hydrogen atom or an alkyl group.

16. A resist composition comprising:

(A) a resin capable of increasing its solubility in an alkali developer by action of an acid;

(B) a compound capable of generating an acid upon irradiation with actinic ray or radiation;

(C) a resin having at least one of a fluorine atom and a silicon atom; and (D) a solvent, wherein the resin (C) has a degree of molecular weight dispersion of 1.3 or less, a weight average molecular weight of $1.0\times10^4$ or less and has a repeating unit represented by formula (Ia):

(Ia)

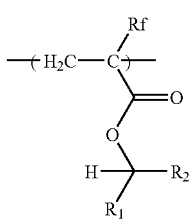

wherein Rf represents a fluorine atom, or an alkyl group in which at least one hydrogen atom is substituted with a fluorine atom; $R_1$ represents an alkyl group; and $R_2$ represents a hydrogen atom or an alkyl group.

17. A resist composition comprising:

(A) a resin capable of increasing its solubility in an alkali developer by action of an acid;

(B) a compound capable of generating an acid upon irradiation with actinic ray or radiation;

(C) a resin having at least one of a fluorine atom and a silicon atom; and (D) a solvent, wherein the resin (C) has a degree of molecular weight dispersion of 1.3 or less, a weight average molecular weight of $1.0\times10^4$ or less and has a group represented by formula (F3a):

(F3a)

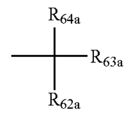

wherein $R_{62a}$ and $R_{63a}$ each independently represents an alkyl group in which at least one hydrogen atom is substituted with a fluorine atom, and $R_{62a}$ and $R_{63a}$ may be linked to each other to form a ring; and $R_{64a}$ represents a hydrogen atom, a fluorine atom, or an alkyl group.

18. The positive resist composition as claimed in claim 17, wherein the resin (C) has an acrylate or methacrylate repeating unit having a group represented by formula (F3a).

19. The positive resist composition as claimed in claim 17, wherein resin (C) further has at least one kind of a repeating unit selected from repeating units represented by formulae (C-I) and (C-II) as a copolymer component:

(C-I)

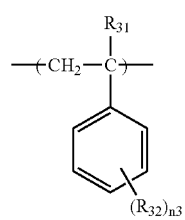

(C-II)

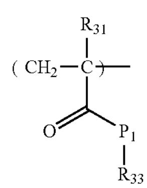

wherein $R_{31}$ each independently represents a hydrogen atom or a methyl group; $R_{32}$ represents a hydrocarbon group; $R_{33}$ represents a cyclic hydrocarbon group; $P_1$ represents a linking group selected from —O—, —NR— (where R represents a hydrogen atom or an alkyl group), and —$NHSO_2$—; and n3 represents an integer of from 0 to 4.

20. The positive resist composition as claimed in claim 19 wherein resin (C) further has at least one kind of a repeating unit represented by formula (C-I) as a copolymer component.

21. The positive resist composition as claimed in claim 19, wherein the addition amount of the resin (C) in the positive resist composition is from 0.1 to 5 mass % based on the total solids content of the positive resist composition.

22. A resist composition comprising:

(A) a resin capable of increasing its solubility in an alkali developer by action of an acid;

(B) a compound capable of generating an acid upon irradiation with actinic ray or radiation;

(C) a resin having at least one of a fluorine atom and a silicon atom; and (D) a solvent, wherein the resin (A) does not contain a fluorine atom and the resin (C) has a degree of molecular weight dispersion of 1.3 or less, a weight average molecular weight of $1.0\times10^4$ or less and has (y) a group capable of decomposing by an action of an alkali developer to increase its solubility in the alkali developer.

23. The positive resist composition as claimed in claim 22, wherein resin (C) is a resin refined by solvent fraction.

24. The positive resist composition for immersion exposure as claimed in claim 22, wherein component (C) is a resin obtained by living radical polymerization.

25. The positive resist composition as claimed in claim 22, wherein resin (C) has a group represented by formula (F3a):

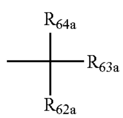

(F3a)

wherein $R_{62a}$ and $R_{63a}$ each independently represents an alkyl group in which at least one hydrogen atom is substituted with a fluorine atom, and $R_{62a}$ and $R_{63a}$ may be linked to each other to form a ring; and $R_{64a}$ represents a hydrogen atom, a fluorine atom, or an alkyl group.

26. The positive resist composition as claimed in claim 22, wherein the resin (C) has a group represented by any of formulae (CS-1) to (CS-3):

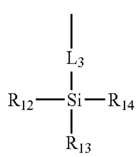

(CS-1)

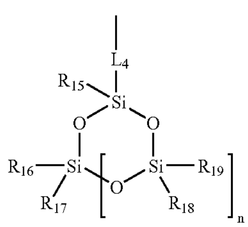

(CS-2)

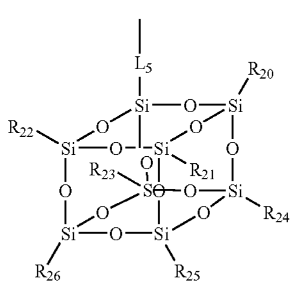

(CS-3)

wherein $R_{12}$ to $R_{26}$ each independently represents a straight chain or branched alkyl group or cycloalkyl group; $L_3$ to $L_5$ each independently represents a single bond or a divalent linking group; and n represents an integer of from 1 to 5.

27. The positive resist composition as claimed in claim 22, wherein the resin (C) is a resin selected from (C-1) to (C-6):

(C-1) A resin having a repeating unit (a) having a fluoroalkyl group;

(C-2) A resin having a repeating unit (b) having a trialkylsilyl group or a cyclic siloxane structure;

(C-3) A resin having a repeating unit (a) having a fluoroalkyl group, and a repeating unit (c) having a branched alkyl group, a cycloalkyl group, a branched alkenyl group, a cycloalkenyl group, or an aryl group;

(C-4) A resin having a repeating unit (b) having a trialkylsilyl group or a cyclic siloxane structure, and a repeating unit (c) having a branched alkyl group, a cycloalkyl group, a branched alkenyl group, a cycloalkenyl group, or an aryl group;

(C-5) A resin having a repeating unit (a) having a fluoroalkyl group, and a repeating unit (b) having a trialkylsilyl group or a cyclic siloxane structure; and (C-6) A resin having a repeating unit (a) having a fluoroalkyl group, a repeating unit (b) having a trialkylsilyl group or a cyclic siloxane structure, and a repeating unit (c) having a branched alkyl group, a cycloalkyl group, a branched alkenyl group, a cycloalkenyl group, or an aryl group.

28. The positive resist composition as claimed in claim 22, wherein the resin (C) has a repeating unit represented by formula (Ia):

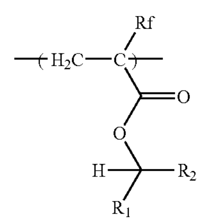

(Ia)

wherein Rf represents a fluorine atom, or an alkyl group in which at least one hydrogen atom is substituted with a fluorine atom; $R_1$ represents an alkyl group; and $R_2$ represents a hydrogen atom or an alkyl group.

29. The positive resist composition as claimed in claim 22, wherein the resin (C) has a repeating unit represented by formula (II) and a repeating unit represented by formula (III):

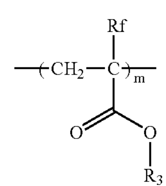

(II)

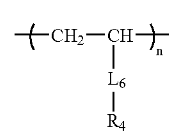

(III)

wherein Rf represents a fluorine atom, or an alkyl group in which at least one hydrogen atom is substituted with a fluorine atom; $R_3$ represents an alkyl group, a cycloalkyl group, an alkenyl group, or a cycloalkenyl group; $R_4$ represents an alkyl group, a cycloalkyl group, an alkenyl group, a cycloalkenyl group, a trialkylsilyl group, or a group having a cyclic siloxane structure; $L_6$ represents a single bond or a divalent linking group; and m and n represent figures respectively satisfying 0<m<100 and 0<n<100.

30. A pattern-forming method comprising:

forming a resist film with the positive resist compositions claimed in claim 22; and exposing and developing the resist film.

31. The positive resist composition as claimed in claim 22, wherein the addition amount of the resin (C) in the positive resist composition is from 0.1 to 5 mass % based on the total solids content of the positive resist composition.

32. The positive resist composition as claimed in claim 22, wherein (y), the group capable of decomposing by an action of an alkali developer to increase solubility in the alkali developer is a lactone group or an acid anhydride.

33. A resist comprising:

(A) a resin capable of increasing its solubility in an alkali developer by action of an acid;

(B) a compound capable of generating an acid upon irradiation with actinic ray or radiation;

(C) a resin having at least one of a fluorine atom and a silicon atom; and (D) a solvent, wherein the resin (C) has a degree of molecular weight dispersion of 1.3 or less, a weight average molecular weight of $1.0\times10^4$ or less and has (z) a group capable of decomposing by an action of an acid to increase solubility in a developing solution;

and wherein the resin (A) does not contain a fluorine atom or a silicon atom.

34. The positive resist composition as claimed in claim 33, wherein resin (C) is a resin refined by solvent fraction.

35. The positive resist composition for immersion exposure as claimed in claim 33, wherein component (C) is a resin obtained by living radical polymerization.

36. The positive resist composition as claimed in claim 33, wherein resin (C) has a group represented by formula (F3a):

(F3a)

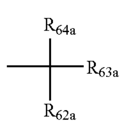

wherein $R_{62a}$ and $R_{63a}$ each independently represents an alkyl group in which at least one hydrogen atom is substituted with a fluorine atom, and $R_{62a}$ and $R_{63a}$ may be linked to each other to form a ring; and $R_{64a}$ represents a hydrogen atom, a fluorine atom, or an alkyl group.

37. The positive resist composition as claimed in claim 33, wherein the resin (C) has a group represented by any of formulae (CS-1) to (CS-3):

(CS-1)

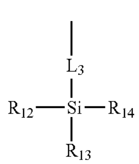

-continued (CS-2)

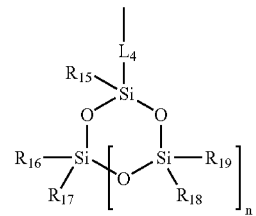

(CS-3)

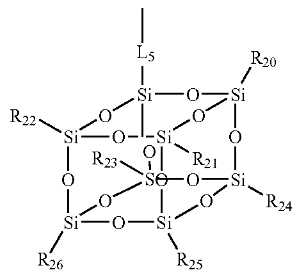

wherein $R_{12}$ to $R_{26}$ each independently represents a straight chain or branched alkyl group or cycloalkyl group; $L_3$ to $L_5$ each independently represents a single bond or a divalent linking group; and n represents an integer of from 1 to 5.

38. The positive resist composition as claimed in claim 33, wherein the resin (C) is a resin selected from (C-1) to (C-6):

(C-1) A resin having a repeating unit (a) having a fluoroalkyl group;

(C-2) A resin having a repeating unit (b) having a trialkylsilyl group or a cyclic siloxane structure;

(C-3) A resin having a repeating unit (a) having a fluoroalkyl group, and a repeating unit (c) having a branched alkyl group, a cycloalkyl group, a branched alkenyl group, a cycloalkenyl group, or an aryl group;

(C-4) A resin having a repeating unit (b) having a trialkylsilyl group or a cyclic siloxane structure, and a repeating unit (c) having a branched alkyl group, a cycloalkyl group, a branched alkenyl group, a cycloalkenyl group, or an aryl group;

(C-5) A resin having a repeating unit (a) having a fluoroalkyl group, and a repeating unit (b) having a trialkylsilyl group or a cyclic siloxane structure; and (C-6) A resin having a repeating unit (a) having a fluoroalkyl group, a repeating unit (b) having a trialkylsilyl group or a cyclic siloxane structure, and a repeating unit (c) having a branched alkyl group, a cycloalkyl group, a branched alkenyl group, a cycloalkenyl group, or an aryl group.

39. The positive resist composition as claimed in claim 33, wherein the resin (C) has a repeating unit represented by formula (Ia):

(Ia)

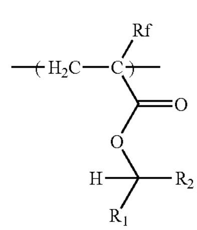

wherein Rf represents a fluorine atom, or an alkyl group in which at least one hydrogen atom is substituted with a fluorine atom; $R_1$ represents an alkyl group; and $R_2$ represents a hydrogen atom or an alkyl group.

40. The positive resist composition as claimed in claim 33, wherein the resin (C) has a repeating unit represented by formula (II) and a repeating unit represented by formula (III):

(II)

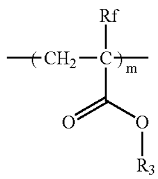

(III)

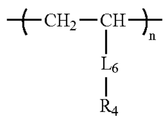

wherein Rf represents a fluorine atom, or an alkyl group in which at least one hydrogen atom is substituted with a fluorine atom; $R_3$ represents an alkyl group, a cycloalkyl group, an alkenyl group, or a cycloalkenyl group; $R_4$ represents an alkyl group, a cycloalkyl group, an alkenyl group, a cycloalkenyl group, a trialkylsilyl group, or a group having a cyclic siloxane structure; $L_6$ represents a single bond or a divalent linking group; and m and n represent figures respectively satisfying $0<m<100$ and $0<n<100$.

41. A pattern-forming method comprising:

forming a resist film with the positive resist compositions claimed in claim 33; and exposing and developing the resist film.

42. The positive resist composition as claimed in claim 33, wherein the addition amount of the resin (C) in the positive resist composition is from 0.1 to 5 mass % based on the total solids content of the positive resist composition.

43. A resist composition comprising:

(A) a resin capable of increasing its solubility in an alkali developer by action of an acid;

(B) a compound capable of generating an acid upon irradiation with actinic ray or radiation;

(C) a resin having at least one of a fluorine atom and a silicon atom; and (D) a solvent, wherein the resin (C) has a degree of molecular weight dispersion of 1.3 or less, a weight average molecular weight of $1.0\times10^4$ or less and is stable to an acid and insoluble in an alkali developer.

44. The positive resist composition as claimed in claim 43, wherein resin (C) is a resin refined by solvent fraction.

45. The positive resist composition for immersion exposure as claimed in claim 43, wherein component (C) is a resin obtained by living radical polymerization.

46. The positive resist composition as claimed in claim 43, wherein resin (C) has a group represented by formula (F3a):

(F3a)

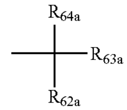

wherein $R_{62a}$ and $R_{63a}$ each independently represents an alkyl group in which at least one hydrogen atom is substituted with a fluorine atom, and $R_{62a}$ and $R_{63a}$ may be linked to each other to form a ring; and $R_{64a}$ represents a hydrogen atom, a fluorine atom, or an alkyl group.

47. The positive resist composition as claimed in claim 43, wherein the resin (C) has a group represented by any of formulae (CS-1) to (CS-3):

(CS-1)

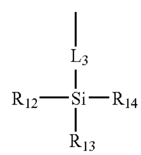

(CS-2)

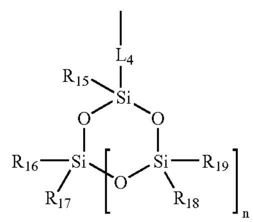

(CS-3)

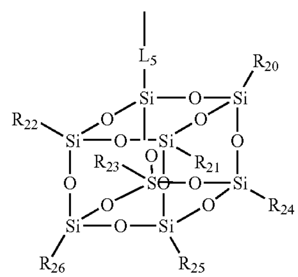

wherein $R_{12}$ to $R_{26}$ each independently represents a straight chain or branched alkyl group or cycloalkyl group; $L_3$ to $L_5$ each independently represents a single bond or a divalent linking group; and n represents an integer of from 1 to 5.

48. The positive resist composition as claimed in claim 43, wherein the resin (C) is a resin selected from (C-1) to (C-6):

(C-1) A resin having a repeating unit (a) having a fluoroalkyl group;

(C-2) A resin having a repeating unit (b) having a trialkylsilyl group or a cyclic siloxane structure;

(C-3) A resin having a repeating unit (a) having a fluoroalkyl group, and a repeating unit (c) having a branched alkyl group, a cycloalkyl group, a branched alkenyl group, a cycloalkenyl group, or an aryl group;

(C-4) A resin having a repeating unit (b) having a trialkylsilyl group or a cyclic siloxane structure, and a repeating unit (c) having a branched alkyl group, a cycloalkyl group, a branched alkenyl group, a cycloalkenyl group, or an aryl group;

(C-5) A resin having a repeating unit (a) having a fluoroalkyl group, and a repeating unit (b) having a trialkylsilyl group or a cyclic siloxane structure; and (C-6) A resin having a repeating unit (a) having a fluoroalkyl group, a repeating unit (b) having a trialkylsilyl group or a cyclic siloxane structure, and a repeating unit (c) having a branched alkyl group, a cycloalkyl group, a branched alkenyl group, a cycloalkenyl group, or an aryl group.

49. The positive resist composition as claimed in claim 43, wherein the resin (C) has a repeating unit represented by formula (Ia):

(Ia)

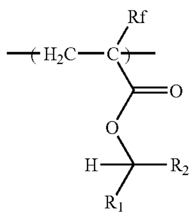

wherein Rf represents a fluorine atom, or an alkyl group in which at least one hydrogen atom is substituted with a fluorine atom; $R_1$ represents an alkyl group; and $R_2$ represents a hydrogen atom or an alkyl group.

50. The positive resist composition as claimed in claim 43, wherein the resin (C) has a repeating unit represented by formula (II) and a repeating unit represented by formula (III):

(II)

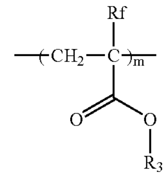

(III)

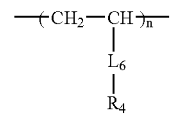

wherein Rf represents a fluorine atom, or an alkyl group in which at least one hydrogen atom is substituted with a fluorine atom; $R_3$ represents an alkyl group, a cycloalkyl group, an alkenyl group, or a cycloalkenyl group; $R_4$ represents an alkyl group, a cycloalkyl group, an alkenyl group, a cycloalkenyl group, a trialkylsilyl group, or a group having a cyclic siloxane structure; $L_6$ represents a single bond or a divalent linking group; and m and n represent figures respectively satisfying $0<m<100$ and $0<n<100$.

51. A pattern-forming method comprising:

forming a resist film with the positive resist compositions claimed in claim 43; and exposing and developing the resist film.

52. The positive resist composition as claimed in claim 43, wherein the addition amount of the resin (C) in the positive resist composition is from 0.1 to 5 mass % based on the total solids content of the positive resist composition.

53. The positive resist composition as claims in claim 43 wherein resin (A) does not contain a fluorine atom.

* * * * *